(12) United States Patent
Takahiko et al.

(10) Patent No.: US 7,627,295 B2
(45) Date of Patent: Dec. 1, 2009

(54) DOWNCONVERTER AND UPCONVERTER

(75) Inventors: Kishi Takahiko, Yokohama (JP); Sato Takahiro, Yokohama (JP); Won-Jin Baek, Suwon-si (KR); Jeong-Ki Choi, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 660 days.

(21) Appl. No.: 11/403,980

(22) Filed: Apr. 13, 2006

(65) Prior Publication Data

US 2006/0256216 A1 Nov. 16, 2006

(30) Foreign Application Priority Data

Apr. 14, 2005 (JP) ............... 2005-117458

(51) Int. Cl.
*H04B 17/02* (2006.01)
(52) U.S. Cl. ............... 455/139; 455/319; 455/339; 455/259; 375/324
(58) Field of Classification Search ............... 455/131, 455/137–139, 255–259, 313, 318, 319, 334, 455/338, 339; 375/324, 350
See application file for complete search history.

(56) References Cited

U.S. PATENT DOCUMENTS

| | | | | |
|---|---|---|---|---|
| 6,856,794 B1 * | 2/2005 | Tso et al. | ............ | 455/260 |
| 7,162,218 B2 * | 1/2007 | Axness et al. | ............ | 455/324 |
| 2003/0012260 A1 * | 1/2003 | Walley et al. | ............ | 375/146 |
| 2004/0002323 A1 * | 1/2004 | Zheng | ............ | 455/324 |
| 2006/0003717 A1 * | 1/2006 | Sowlati | ............ | 455/168.1 |
| 2006/0029146 A1 * | 2/2006 | Catreux et al. | ............ | 375/267 |

* cited by examiner

*Primary Examiner*—Nhan T Le
(74) *Attorney, Agent, or Firm*—The Farrell Law Firm, LLP

(57) ABSTRACT

A downconverter and upconverter are provided which can obtain a sufficient image rejection ratio in a low-Intermediate Frequency (IF) scheme while reducing power consumption and can suppress Error Vector Magnitude (EVM)-related degradation in a zero-IF scheme. A complex-coefficient transversal filter rejects one side of a positive or negative frequency, and converts a Radio Frequency (RF) signal to a complex RF signal configured by real and imaginary parts. A local oscillator outputs a real local signal with a set frequency. A half-complex mixer, connected to the complex-coefficient transversal filter and the local oscillator, performs a frequency conversion process by multiplying the complex RF signal output from the complex-coefficient transversal filter and the real local signal output from the local oscillator, and outputs a complex signal of a frequency separated by the set frequency from a frequency of the RF signal.

10 Claims, 65 Drawing Sheets

DOWNCONVERTER AND UPCONVERTER

PRIORITY

This application claims priority under 35 U.S.C. § 119 to an application entitled "Downconverter and Upconverter" filed in the Japan Patent Office on Apr. 14, 2005 and assigned Serial No. 2005-117458, the contents of which are incorporated herein by reference.

BACKGROUND OF THE INVENTION

1. Field of the Invention

The present invention relates to a downconverter for performing frequency conversion in a receiver and an upconverter for performing frequency conversion in a transmitter.

2. Description of the Related Art (Background Technology of Downconverter of Low-Intermediate Frequency (IF) Scheme)

A radio communicator which functions both as a receiver and a transmitter (like a mobile phone), receives a Radio Frequency (RF) signal carrying speech content and data communication content and converts the received RF signal to a frequency to be input to a demodulator of a receiver, i.e., a downconverter. There are three front-end schemes for selecting a channel to select a target signal in the receiver including a heterodyne scheme for converting an RF signal to an Intermediate Frequency (IF) signal, a zero-IF scheme (referred to as a direct conversion or homodyne scheme) for converting an RF to Direct Current (DC), and a low-IF scheme for converting an RF signal to an IF signal slightly away from DC using an image rejection mixer (or a half-complex mixer for a real input and a complex output) for rejecting an image frequency signal.

The background in which the above-described three schemes are present will be briefly described. The simplest scheme for frequency-converting an RF signal to an original signal is the zero-IF scheme for performing direct frequency conversion to a baseband signal by multiplying the frequency of the RF signal by the same frequency.

However, an expensive Phase Locked Loop (PLL) circuit with very high precision is required to ensure signal orthogonality and other conditions such that the zero-IF scheme is realized in a high frequency domain of an RF signal. Accordingly, a frequency conversion scheme has been proposed which requires a lower component precision than the zero-IF scheme. The proposed scheme performs the frequency conversion by lowering a frequency step by step. This frequency conversion scheme includes the heterodyne scheme and the low-IF scheme.

The heterodyne scheme increases the frequency of an IF signal and increases a difference between a frequency of a target signal and an image frequency in an RF signal processor before frequency conversion, thereby rejecting an image frequency signal by means of an RF filter and avoiding interference of the image frequency signal. Here, the image frequency is present in a low frequency side separated by twice the frequency of the IF signal from the target signal frequency, and influences the target signal at the time of downconversion.

As a concrete example of the heterodyne scheme, a full-duplex radio device for simultaneously performing transmission and reception operations rejects a transmission frequency signal or a transmission signal (hereinafter, an image frequency signal) close to an image frequency when a local signal is common between transmission and reception. If a filter of an RF signal (hereinafter, referred to as an RF filter) cannot completely reject a generated image frequency signal when the RF signal is converted to an IF signal, a frequency of the IF signal is changed between all radio communication schemes and a frequency of the image frequency signal is changed, such that the RF filter can reject the image frequency signal. For this reason, a multi-mode radio device for supporting multiple communication schemes changes the frequency of the IF signal in every mode according to channel bandwidths different between the modes (or communication schemes). Moreover, the multi-mode radio device needs to prepare a filter of the IF signal (hereinafter, referred to as an IF filter) different between center frequencies or pass frequencies of the modes. In this case, there is a problem in that circuit size significantly increases.

On the other hand, the low-IF scheme performs frequency conversion using an image rejection mixer 810 (corresponding to a mixer for a real input and a complex output) configured by a mixer-I 814 and a mixer-Q 815 that are provided with a multiplier connected to a local oscillator 813 for outputting a local signal in a downconverter 9 of the low-IF scheme as illustrated in FIG. 21, respectively. The local oscillator 813 and the image rejection mixer 810 configure a frequency converter. An undesired signal present in a symmetric position of the low frequency side, corresponding to a frequency value of the IF signal with respect to the frequency of the target signal (i.e., an image frequency signal), is rejected on the basis of a frequency of the local signal without depending on frequency characteristics of the RF and IF filters. Here, a rejection ratio of an image frequency signal is expressed by an image rejection ratio to be described below. The image rejection ratio can decrease the frequency of the IF signal because dependency on the characteristics of the RF filter is low.

When the frequency of the IF signal is equal to a channel interval, an image frequency of a target channel is the next channel neighboring to the target channel.

For example, the downconverter 9 satisfies the specification of an associated radio scheme when an image rejection ratio associated with a requirement specification such as blocking for an image frequency signal separated by twice a frequency of an associated IF signal from a frequency of a target IF signal is less than the image rejection ratio of the downconverter 9 of an associated low-IF scheme in a radio communication scheme using the downconverter.

Because the low-IF scheme can decrease the frequency of the IF signal, the IF filter can be configured by an active filter and an integrated circuit (IC) device can be easily miniaturized. Because the frequency of the IF signal does not need to be changed according to each radio communication scheme in the multi-mode radio device, the IF filter can be commonly employed.

If the image frequency signal is present in the symmetric position of the low frequency side corresponding to the frequency value of the IF signal with respect to the frequency of the target signal on the basis of the frequency of the local signal as described above, it means that the frequency corresponding to twice the frequency of the IF signal becomes a frequency interval between the frequency of the target signal and the image frequency.

Because the channel bandwidths are different between the communication schemes in the above-described multi-mode radio device, the bandwidth of the IF filter must be changed according to each radio communication scheme. However, the low-IF scheme can easily vary characteristics of the IF filter using a transconductance-capacitor (gmC) filter for varying transconductance (gm) of a transistor, if needed.

When the low-IF scheme is applied to the multi-mode radio device, one IF filter can be provided because multiple IF filters are not needed as in the heterodyne scheme, such that the multi-mode radio device can be realized in a small circuit size.

Even though the low-IF scheme outperforms the heterodyne scheme as described above, it may ensure only the image rejection ratio of about 30 dB as described in Philips, SA1920 datasheet and Philips, SA1921 datasheet. The image rejection ratio of about 30 dB is not a value capable of being easily realized. To realize the image rejection ratio of about 30 dB, a size of an associated transistor needs to be increased such that the image rejection ratio of a mixer due to performance variation of a used transistor can be prevented from being reduced. Increasing the size of the transition causes all characteristics, except the image rejection ratio, being degraded due to an increase in power consumption and a decrease in a transition frequency, fT.

The low-IF scheme can be applied to the radio communication scheme whose specifications such as blocking for an image frequency signal are rigid even when the image rejection ratio of about 30 dB can be realized. However, there is a problem in that an associated requirement specification cannot be satisfied and the low-IF scheme cannot be applied, when a robustness to interference ratio of more than 30 dB is required.

However, the low-IF scheme can be applied because a requirement specification for interference robustness such as blocking for an image frequency signal at a frequency within 300 kHz from a target signal frequency is only 18 dB in Global System for Mobile Communication (GSM).

On the other hand, because a requirement specification for interference robustness for an adjacent channel separated by 5 MHz from a frequency of a target signal is 33 dB in Wideband Code Division Multiple Access (W-CDMA), the low-If scheme provides borderline performance with respect to the image rejection ratio of 30 dB as described above when practical use is considered. A need exists for precision improvement for improving selection of a mixer used in a device or an image rejection ratio such that the low-IF scheme can satisfy an associated requirement specification. To achieve the precision improvement, a large chip area may be required and costs may increase.

The GSM or W-CDMA uses a digital tuner or a software radio front-end for converting a frequency in an RF part and selecting a channel from a plurality of channels in a digital part. In this case, a requirement specification of interference robustness such as blocking for an image frequency signal at a frequency separated by more than 300 kHz from a frequency of a target signal is more than 50 dB, for example, in the GSM. When the same requirement specification exceeds the image rejection ratio capable of being realized by the image rejection mixer also in the W-CDMA, the channel selection of the digital part is actually impossible. Accordingly, the low-IF scheme cannot be applied to the digital tuner or the software radio front-end.

To address these problems in the low-IF scheme, four means can be considered for obtaining the image rejection ratio of more than 40 dB using the above-described image rejection mixer.

The first means rejects an image frequency signal with an RF filter by increasing a frequency of an IF signal and increasing a difference between a target signal frequency and an image frequency in the RF part before frequency conversion.

The second means corrects characteristics of the image rejection mixer through a correction process based on a digital process described in Japanese Patent Laid-Open No. 2002-246847 and Japanese Patent Laid-Open No. Hei 6-188928 [PLEASE CONFIRM PATENT NUMBER], and a correction process based on an analog circuit process described in Japanese Patent No. 2988277 and Japanese Patent Laid-Open No. 2000-224497.

The third means rejects an image frequency signal by providing a phase shifter in an RF part, obtaining a phase difference of 90 degrees in an associated phase shifter, generating a complex RF signal, and performing frequency conversion by complex multiplication of the complex RF signal by a complex local signal as described in "Mixer Topology Selection for a Multi-Standard High Image-Reject Front-End", Vojkan Vidojkovic, Johan van der Tang, Arjan Leeuwenburgh and Arthur van Roermumd, ProRISC Workshop on Circuits, Systems and Signal Processing, pp. 526-530, 2002 (hereinafter "Mixer Topology Selection for a Multi-Standard High End" and FIG. 3.25(b) of "CMOS WIRELESS TRANSCEIVER DESIGN", Jan Crols, Michiel Steyaert, Kluwer, International Series in Engineering and Computer Science, 1997 and FIG. 3.25(b) (hereinafter "CMOS WIRELESS TRANSCEIVER DESIGN").

The fourth means rejects an image frequency signal by frequency-converting an RF signal, generating a complex signal, and performing complex multiplication with a complex local signal through a mixer using the complex local signal as illustrated in FIG. 3.28 and FIG. 3.31 of "CMOS WIRELESS TRANSCEIVER DESIGN".

However, the four means include the following problems with the downconverter. The first means has a problem in that power consumption increases due to a clock increase in an analog-to-digital converter (ADC) for converting an IF signal to a digital signal and a digital signal processor for processing an output of an associated ADC. This is the first problem of the downconverter. To address this problem, a sub-nyquist sampling technique is used for the clock reduction in the ADC as is well known. In this case, an input frequency band of the ADC is widened, such that power consumption increases. Accordingly, it is difficult for a sub-nyquist sampling technique to be actually adopted.

The second means has a problem in that power consumption increases according to a computational process in a digital part for a correction based on a digital process. The second means has another problem in that a size of a correction circuit, for a correction based on an analog process, increases and correction precision is bad.

The third means has a problem in that loss occurs in the phase shifter. The loss in the phase shifter increases, for example, when a degree of the phase shifter is increased to widen a band. Due to this loss, reception sensitivity is degraded. The third means has another problem in that practical precision cannot be obtained in the phase shifter configured by a Resistor-Capacitor (RC) circuit when input/output impedance is considered because R and C values are small in the RF of a high frequency.

The fourth means has problems in that power consumption increases because the number of mixers and the number of local signal oscillators are increased to generate complex signals from the mixers using complex local signals and spurious reception occurs due to the increased number of local signal oscillators.

In addition to the above-described first to fourth problems, the low-IF scheme has a problem in that a circuit size increases because a local oscillator 813 for outputting orthogonal local signals of sin and cos and two multipliers (i.e., mixers 814 and 815) are needed, as illustrated in FIG. 21.

The heterodyne scheme requiring only a single local signal and a single mixer has a problem in that power consumption increases.

A. Background Technology of Upconverter of Low-IF Scheme

A transmitter of a radio communicator such as a mobile phone or so on generates a real IF signal by mixing a complex baseband signal with a complex local signal and generates a real RF signal by mixing the real IF signal with a real local signal according to an upconverter function, such that the baseband signal including speech content and data communication content is converted to the RF signal.

To reject an image frequency signal of an IF signal in an RF filter of an upconverter, an IF signal frequency needs to be increased according to a broad system bandwidth and needs to be further increased according to a broad RF band corresponding to a broad channel band due to a high communication rate. Therefore, there is a problem in that cost and power consumption increase in an IF signal processor. On the contrary, there is a problem in that a rigid requirement specification is applied when an IF signal frequency is reduced.

To address these problems, the upconverter can have a structure (hereinafter, referred to as a first structure) for rejecting an image frequency signal while reducing an IF signal frequency by converting a complex baseband signal to a complex IF signal in a full-complex mixer and mixing an associated complex IF signal with a complex local signal in an image rejection mixer (hereinafter, referred to as a half-complex mixer). According to the first structure, a requirement specification for an attenuation amount of a stop band of the RF filter is mitigated. The first structure requires only a one-step SAW filter rather than two-step SAW filters conventionally needed for an RF signal.

From Philips, SA1920 datasheet and Philips, SA1921 datasheet, it can be seen that an image frequency signal of −30 dBc is estimated as a spurious transmission component in terms of the performance of an image rejection ratio of the full-complex mixer available for reception in the receiver. In this performance, the spurious transmission component may exceed the specification of an allowable mask (hereinafter, referred to as a spurious mask). To satisfy the specification, an RF filter is needed to reject an image frequency signal. When the RF filter is required, a relation between the requirement specification for the RF filter and the IF signal frequency needs to be considered. As a result, there is a problem in that a high IF signal frequency occurs because the first structure cannot reduce the IF signal frequency.

Therefore, a structure (hereinafter, referred to as a second structure) for the low-IF scheme used in the above-described downconverter can be considered as special means for addressing the problem of the high IF signal frequency. FIG. 32 illustrates a conventional upconverter using the low-IF scheme. When the second structure is taken, an RF filter for rejecting an image frequency signal of an IF signal is unnecessary due to the effect of rejecting the image frequency signal in the half-complex mixer 400. Alternatively, a SAW filter of an RF signal may not be required according to conditions of a requirement specification when the requirement specification for the SAW filter of the RF signal is significantly mitigated.

However, the image frequency signal appears at a target frequency because the upconverter of the second structure cannot completely remove the image frequency signal. FIG. 33 illustrates a spectrum of a complex IF signal (S35 of FIG. 33) with a center frequency of 5 MHz frequency, converted from a Double Side Band (DSB) signal with a carrier interval of 1.6 MHz of a complex baseband in an upconverter 35 of the second structure of FIG. 32. FIG. 34 illustrates a spectrum of a real signal output when the complex IF signal illustrated in FIG. 33 is mixed with a complex local signal (of 795 MHz) in which an error of 10% is present between amplitudes of a real axis signal I, corresponding to a real part (of an in-phase component), and an imaginary axis signal Q, corresponding to an imaginary part (of a quadrature phase component). In FIG. 34, an image frequency signal of −26 dBc (S37 in FIG. 34) occurs with respect to a target signal (800 MHz) S36 at the image frequency (790 MHz).

If only the image rejection ratio of about −30 dBc can be ensured, a spurious mask near a target signal exceeds an associated specification in the upconverter of the second structure as in a mixer shown in the above-described Phillips, SA1920 datasheet and Phillips, SA1921 datasheet. For example, there is a problem in that an associated specification may not be stably satisfied because the image rejection ratio may be reduced due to performance variation of the half-complex mixer or variation of environment conditions, even though the specification of an associated spurious mask can be almost satisfied.

To reduce degradation of the image rejection ratio, it may be attempted to limit the variation in manufacturing error of a transistor used for a mixer that results from increasing a transistor size. When the transistor size increases, the power consumption of the transistor increases, the transition frequency, fT, decreases, and all characteristics except the image rejection ratio are degraded. Because of the inaccuracy of an analog circuit, it is difficult for an image rejection ratio to be satisfied and therefore it is difficult for the method for increasing the transistor size to be taken.

To address a problem associated with the upconverters of the above-described first and second structures, a third structure can be considered for a transmitter of the low-IF scheme according to a signal process using a polyphase filter used in a receiver illustrated in FIG. 3.28 and FIG. 3.31 of "Mixer Topology Selection for a Multi-Standard High Image-Reject Front-End" and "CMOS WIRELESS TRANSCEIVER DESIGN". In the third structure, a mixer for mixing a complex IF signal and a complex local signal is set as a full-complex mixer for outputting a complex RF signal. The third structure rejects a negative frequency component of the complex RF signal of the mixer output using a polyphase filter. However, even though the structure is theoretically excellent, the polyphase filter is configured by an RC circuit, so loss becomes large and a band becomes narrow. There are additional problems in that loss is further increased, an image rejection ratio of a filter output is reduced, and utility is degraded when the number of steps increases to obtain a high attenuation level or a wide band. These problems are the first problems of the upconverter.

"CMOS WIRELESS TRANSCEIVER DESIGN" proposes a method for obtaining a complex IF signal to be input to the above-described full-complex mixer from a baseband signal in the half-complex mixer, as illustrated in FIG. 3.28 and FIG. 3.31. However, this method has a problem of an increase of power consumption and a problem of spurious reception occurs due to the increased number of local signal oscillators because the number of mixers and the number of local signal oscillators are increased. These problems are the second problems of the upconverter.

In addition to the above-described first and second problems, the low-IF scheme has a problem in that a circuit size increases because a local oscillator 401 for outputting orthogonal local signals of sin and cos and two multipliers, i.e., mixers 402 and 403 are needed as illustrated in FIG. 32.

As compared with the heterodyne scheme requiring only a single local signal and a single mixer, the low-IF scheme has a problem in that power consumption increases. These problems are the third problems of the upconverter.

B. Background Technology of Downconverter and Upconverter of Zero-IF Scheme

A downconverter and an upconverter of the zero-IF scheme are provided as configuration examples of an upconverter and a downconverter for converting an RF or IF signal to a complex baseband signal in which a circuit is very simplified and is easily miniaturized.

C. Downconverter of Zero-IF Scheme

FIG. 44 illustrates the downconverter of the zero-IF scheme, and FIG. 56 illustrates the upconverter of the zero-IF scheme.

FIG. 45 illustrates a mixing process in a downconverter 46 of the zero-IF scheme illustrated in FIG. 44. The downconverter 46 multiplies (or half-complex mixes) a real RF signal $s_{rf}(t)$ and a complex local signal $L_{rf}(t)$ of the same frequency as a frequency $f_c$ of an associated real RF signal output from a local oscillator 602 in a half-complex mixer 603. Then, the downconverter 46 performs a frequency conversion process in which the center frequency is frequency zero (DC). Then, the downconverter 46 converts an associated signal to a complex baseband signal $s_{bb}(t)$. Then, the downconverter 46 inputs the complex baseband (BB) signal $s_{bb}(t)$ to a demodulator.

In the operation of the half-complex mixer 603 for converting only a positive component of a real RF signal to a baseband signal, a signal $S_{lm}(t)L_{le}(t)$ based on a negative frequency component of the real RF signal overlaps with a target signal $S_{lp}(t)L_l(t)$ at frequency zero of the complex BB signal $s_{bb}(t)$. The overlap occurs because of a negative component $S_{lm}(t)$ (or a complex conjugate signal of the positive component) of the real RF signal generated from Error Vector Magnitude (EVM) due to imbalance between I and Q components and an error component $L_{le}(t)$ of the complex local signal. For this reason, it is difficult for only the target signal to be extracted.

A real RF signal, a complex local signal, and a complex baseband signal in a process as illustrated in FIG. 45 are expressed by Equations (1), (2), and (3), respectively.

$$s_{rf}(t) = \frac{s_{li}(t) + js_{lq}(t)}{2} + \frac{s_{li}(t) - js_{lq}(t)}{2} \qquad \text{Equation (1)}$$
$$= s_{lp}(t) + s_{lm}(t)$$

$$L_{rf}(t) = L_l(t) + L_{le}(t) \qquad \text{Equation (2)}$$

$$s_{bb}(t) = (s_{lp}(t) + s_{lm}(t))L_l(t) + (s_{lp}(t) + s_{lm}(t))L_{le}(t) \qquad \text{Equation (3)}$$

FIG. 57 illustrates a mixing process in an upconverter 66 of the zero-IF scheme illustrated in FIG. 56. The upconverter 66 multiplies (or half-complex mixes) a complex baseband signal $s_{bb}(t)$ and a complex local signal $L_{rf}(t)$ with a frequency $f_c$ of an RF signal $s_{rf}(t)$ output from a local oscillator 910 in a half-complex mixer 911. Then, the upconverter 66 performs frequency conversion to the RF signal frequency $f_c$ and outputs a real part of the RF signal. Because the EVM-related degradation (in an associated process as in the downconverter), an RF signal $S_l(t)L_l(t)$ overlaps with a signal $S_l^*(t)L_{le}^*(t)$ converted to a reverse frequency with respect to the RF signal frequency $f_c$. The overlap occurs due to an error component $L_{le}(t)$ of a complex local signal and a negative frequency of the RF signal frequency $f_c$ in the complex baseband signal $s_{bb}(t)$ when the frequency conversion to the RF signal and the reverse frequency conversion are performed and a real part is output. For this reason, it is difficult for only the target signal to be extracted.

A complex baseband signal, a complex local signal, and a complex RF signal in a process as illustrated in FIG. 57 are expressed by Equations (4), (5), and (6), respectively.

$$s_{bb}(t) = s_{li}(t) + js_{lq}(t) = s_l(t) \qquad \text{Equation (4)}$$

$$L_{rf}(t) = L_l(t) + L_{le}(t) \qquad \text{Equation (5)}$$

$$S_{rf}(t) = \frac{1}{2}(s_l(t)L_{le}(t) + s_l^*(t)L_l^*(t) + s_l^*(t)L_{le}^*(t) + s_l(t)L_l(t)) \qquad \text{Equation (6)}$$

The upconverter and downconverter of the zero-IF scheme have an advantage in that they can be miniaturized, as compared with those for performing multi-step frequency conversion in the above-described heterodyne scheme. When real and imaginary axis signals I and Q of a local signal are not orthogonal after processing in the above-described mixer, a problem of the EVM-related degradation due to instability occurs. A problem of a DC offset occurs when leakage of the local signal is self-received in the mixer. When the second-order intermodulation (IM2) occurs due to non-linearity of the mixer, a problem of interference to a target signal occurs.

The upconverter of the zero-IF scheme has an advantage in that it can be miniaturized, as compared with an upconverter for performing the above-described multi-step frequency conversion. However, a problem of the EVM-related degradation and a problem of carrier leakage corresponding to a DC offset of the zero-IF scheme occur. Among these problems, the EVM-related degradation significantly influences to limit communication rate when multi-level modulation is performed according to a high communication rate. The EVM-related degradation needs to be prevented.

When real and imaginary axis signals I and Q of a local signal are not orthogonal after processing in the mixer, the problem of the EVM-related degradation due to instability occurs as described above. To prevent the EVM-related degradation, technology is being developed to improve characteristics of a circuit that reduces amplitude error and phase error between the real and imaginary axis signals I and Q of the local signal and reduces error between transistors configuring the mixer. Many technologies are being developed to prevent the EVM-related degradation by compensating for error between the real and imaginary axis signals I and Q according to a digital signal process after a complex baseband signal is converted to a digital signal.

However, the improvement of circuit characteristics is limited because of instability of an analog circuit. Specifically, degradation due to interference between codes in the multi-level modulation and degradation due to interference between carriers in Orthogonal Frequency Division Multiplexing (OFDM) occur. Due to these degradations, limitations are present in increasing a communication rate of the zero-IF scheme. There are problems in that compensation technology based on digital signal processing increases power consumption for complex processing, and cannot sufficiently prevent the EVM-related degradation. These problems are the first problems of the zero-IF scheme.

Image rejection technology of the image rejection downconverter of "Mixer Topology Selection for a Multi-Standard High Image-Reject Front-End" and "CMOS WIRELESS TRANSCEIVER DESIGN" (FIG. 3.25(b)) with a structure similar to the downconverter of the zero-IF scheme will be described as an example of means for rejecting a negative frequency component of a real RF signal in the downconverter of the above-described zero-IF scheme. When the downconverter with the above-described structure is generalized, the structure of FIG. 46 results. A downconverter 47 illustrated in FIG. 46 uses a complex-coefficient filter 513 in which positive and negative frequency characteristics are different before a real RF signal is frequency-converted. The downconverter 47 can obtain a complex RF signal $s_{rf}(t)$ in which a negative frequency component of a real RF signal is rejected. A full-complex mixer 610 mixes the complex RF signal $s_{rf}(t)$ and a complex local signal $L_{rf}(t)$ and performs down-conversion to a complex IF signal $s_{if}(t)$.

FIG. 47 illustrates a process when the complex-coefficient filter 513 is absent in the downconverter 47 of FIG. 46. When the complex-coefficient filter 513 is absent, a negative frequency component $L_{le}(t)$ occurs due to the complex local signal $L_{rf}(t)$ and instability of the full-complex mixer 610. An associated negative frequency component is a factor for generating an image frequency signal $(S_{lm}(t)L_{le}(t)+S_{(t)Lle}(t))$.

A real RF signal, a complex local signal, and a complex IF signal in a process as illustrated in FIG. 47 are expressed by Equations (7), (8), and (9), respectively.

$$s_{rf}(t) = \frac{s_{li}(t) + js_{lq}(t)}{2} + \frac{s_{li}(t) - js_{lq}(t)}{2} + \frac{s_{2i}(t) + js_{2q}(t)}{2} + \frac{s_{2i}(t) - js_{2q}(t)}{2}$$
$$= (s_{lp}(t) + s_{2p}(t)) + (s_{lm}(t) + s_{2m}(t))$$
Equation (7)

$$L_{rf}(t) = L_l(t) + L_{le}(t)$$
Equation (8)

$$s_{if}(t) = (s_{lp}(t) + s_{2p}(t))L_l(t) + (s_{lm}(t) + s_{2m}(t))L_{le}(t)$$
Equation (9)

When the complex-coefficient filter 513 rejects a negative frequency component, interference due to an image frequency signal can be reduced. FIG. 48 illustrates a rejection process. Only a component of a complex RF signal $s_{rf}'(t)$ in which the negative frequency component is rejected is frequency-converted to the complex IF signal $s_{if}(t)$. Because an amount of attenuation of the complex-coefficient filter as illustrated in FIG. 48 is finite, the negative frequency component cannot be completely rejected. In addition to an image rejection ratio of the full-complex mixer 610, interference due to a signal of a negative frequency component of the complex RF signal is reduced by an amount of attenuation of a negative frequency of the complex-coefficient filter 513.

A real RF signal, a complex RF signal, a complex local signal, and a complex IF signal in a process as illustrated in FIG. 48 are expressed by Equations (10), (11), (12), and (13), respectively.

$$s_{rf}(t) = \frac{s_{li}(t) + js_{lq}(t)}{2} + \frac{s_{li}(t) - js_{lq}(t)}{2} + \frac{s_{2i}(t) + js_{2q}(t)}{2} + \frac{s_{2i}(t) - js_{2q}(t)}{2}$$
$$= (s_{lp}(t) + s_{2p}(t)) + (s_{lm}(t) + s_{2m}(t))$$
Equation (10)

$$s_{rf}'(t) = s_{lp}(t)$$
Equation (11)

$$L_{rf}(t) = L_l(t) + L_{le}(t)$$
Equation (12)

$$s_{if}(t) = (s_{lp}(t) + s_{2p}(t))L_l(t) + (s_{lm}(t) + s_{2m}(t))L_{le}(t)$$
Equation (13)

When the downconverter 47 illustrated in FIG. 46 is applied to the zero-IF scheme, a mixing process rejects a negative frequency component of the real RF signal as illustrated in FIG. 49, such that only a target signal can be obtained at frequency zero.

A real RF signal, a complex RF signal, a complex local signal, and a complex baseband signal in a process as illustrated in FIG. 49 are expressed by Equations (14), (15), (16), and (17), respectively.

$$s_{rf}(t) = \frac{s_{li}(t) + js_{lq}(t)}{2} + \frac{s_{li}(t) - js_{lq}(t)}{2}$$
$$= s_{lp}(t) + s_{lm}(t)$$
Equation (14)

$$s_{rf}'(t) = s_{lp}(t)$$
Equation (15)

$$L_{rf}(t) = L_l(t) + L_{le}(t)$$
Equation (16)

$$s_{bb}(t) = s_{lp}(t)L_l(t) + s_{lp}(t)L_{le}(t)$$
Equation (17)

D. Upconverter of Zero-IF Scheme

Next, an upconverter of the zero-IF scheme will be described. Like the downconverter of the zero-IF scheme, the upconverter of the zero-IF scheme uses a full-complex mixer and a complex-coefficient filter and can reject a distortion error of a transmission signal due to the EVM-related degradation resulting from imbalance between I and Q.

FIG. 58 illustrates a structure of an upconverter 67 with a full-complex mixer 920 and a complex-coefficient filter 710. A mixing process of the upconverter 67 is illustrated in FIG. 59. The full-complex mixer 920 mixes a complex baseband signal $s_{bb}(t)$ and a complex local signal $L_{rf}(t)$ and then outputs a complex RF signal $s_{rf}(t)$. Then, the upconverter 67 uses a complex-coefficient filter 710 in which positive and negative frequency characteristics are different in a complex RF signal. After a negative frequency component of the complex RF signal is rejected, a real part is extracted. A real RF signal $(\frac{1}{2}(S_l(t)L_l(t)+S_l^*(t)L_l^*(t)))$ can be obtained as a target.

A complex baseband signal, a complex local signal, a complex RF signal, and an RF signal in a process as illustrated in FIG. 59 are expressed by Equations (18), (19), (20), and (21), respectively.

$$s_{bb}(t) = s_{li}(t) + js_{lq}(t) = s_l(t)$$
Equation (18)

$$L_{rf}(t) = L_l(t) + L_{le}(t)$$
Equation (19)

$$s_{rf}(t) = s_l(t) + L_{rf}(t)$$
Equation (20)

$$s_{rf}(t) = \text{Re}[s_l(t) + L_l(t)] = \frac{1}{2}(s_l(t)L_l(t) + s_l^*(t)L_l^*(t))$$
Equation (21)

As compared with the heterodyne scheme requiring only a single local signal and a single mixer, the conventional low-IF scheme requires a local oscillator 602 or 910 for outputting orthogonal local signals of sin and cos and two multipliers, i.e., mixers 604 and 605 or mixers 912 and 913, are required as illustrated in the structure of FIG. 44 or 56. In the structure of FIG. 46, FIG. 58, or a structure of FIG. 3.28 and FIG. 3.31 of "CMOS WIRELESS TRANSCEIVER DESIGN", the number of complex-coefficient filters or the number of mixers increases and therefore a circuit size increases. For this reason, the power consumption of the zero-IF scheme is greater than that of the heterodyne scheme. This shortcoming is the second problem of the zero-IF scheme.

As illustrated in FIG. 3.28 and FIG. 3.31, "CMOS WIRELESS TRANSCEIVER DESIGN" proposes a method for generating a complex signal using a half-complex mixer. However, power consumption increases because the number of mixers and the number of local signal oscillators are increased and spurious reception occurs due to the increased number of local signal oscillators. These shortcomings are the third problems of the zero-IF scheme.

As described above, the downconverter of the low-IF scheme has the first to fifth problems, the upconverter of the low-IF scheme has the first to third problems, and the downconverter and upconverter of the zero-IF scheme have the first to third problems.

The important problems in the downconverter and upconverter of the low-IF scheme occur when a sufficient image rejection ratio cannot be obtained and power consumption increases.

The important problems in the downconverter and upconverter of the zero-IF scheme occur when EVM-related degradation occurs and power consumption increases.

There are increasing market needs for the downconverter and upconverter of the low-IF scheme and the zero-IF scheme capable of processing a broadband or multi-band RF signal. The problems of the low-IF scheme and the zero-IF scheme must be able to be addressed and the broadband or multi-band RF signal must be able to be processed.

SUMMARY OF THE INVENTION

Accordingly, the present invention has been designed to solve the above and other problems. Therefore, it is an object of the present invention to provide a downconverter and upconverter that can reduce power consumption, obtain a sufficient image rejection ratio in a low-Intermediate Frequency (IF) scheme, prevent Error Vector Magnitude (EVM)-related degradation occurring due to imbalance between an in-phase component (I) and a quadrature phase component (Q) in a zero-IF scheme, and process a broadband Radio Frequency (RF) signal.

In accordance with an aspect of the present invention, there is provided a downconverter for converting a Radio Frequency (RF) signal to a low frequency, including a complex-coefficient transversal filter for generating a real part of a complex RF signal by performing a convolution integral according to a generated impulse response based on an even function for an input RF signal, generating an imaginary part of the complex RF signal by performing a convolution integral according to a generated impulse response based on an odd function for the input RF signal, rejecting one side of a positive or negative frequency, and outputting the complex RF signal; a local oscillator for outputting a real local signal with a predetermined frequency; and a complex mixer, connected to the complex-coefficient transversal filter and the local oscillator, for performing a frequency conversion process by multiplying the complex RF signal output from the complex-coefficient transversal filter and the real local signal output from the local oscillator, and outputting a complex signal of a frequency separated by the predetermined frequency from a frequency of the RF signal.

In accordance with another aspect of the present invention, there is provided a downconverter for converting a Radio Frequency (RF) signal to a low frequency, including a distributor, provided with a plurality of output terminals, for switching and outputting an input RF signal; a plurality of complex-coefficient transversal filters having different pass band frequencies in a plurality of transversal filters connected to the plurality of output terminals of the distributor in a one-to-one correspondence, the plurality of complex-coefficient transversal filters outputting a real part of a complex RF signal by performing a convolution integral according to a generated impulse response based on an even function for the RF signal output from the distributor, outputting an imaginary part of the complex RF signal by performing a convolution integral according to a generated impulse response based on an odd function for the RF signal output from the distributor, rejecting one side of a positive or negative frequency in the pass band frequencies, and outputting the complex RF signal; a local oscillator for switching and outputting a real local signal of a frequency according to the pass band frequencies of the plurality of complex-coefficient transversal filters; a plurality of complex mixers connected to the plurality of complex-coefficient transversal filters in the one-to-one correspondence and connected to the local oscillator, the plurality of complex mixers performing a frequency conversion process by multiplying the complex signal output from the complex-coefficient transversal filter and the real local signal output from the local oscillator, and outputting a complex signal of a frequency separated by a predetermined frequency from a frequency of the RF signal; and a combiner, connected to the plurality of complex mixers, for switching a connection of the plurality of complex mixers and outputting the complex signal outputted from the plurality of complex mixers.

In accordance with another aspect of the present invention, there is provided an upconverter for converting a complex signal to a frequency of a Radio Frequency (RF) signal, including a local oscillator for outputting a real local signal with a predetermined frequency; a complex mixer, connected to the local oscillator, for performing a frequency conversion process by multiplying an input complex signal and the real local signal output from the local oscillator, and outputting a complex RF signal; and a complex-coefficient transversal filter, connected to the complex mixer, for performing a convolution integral according to a generated impulse response based on an even function for a real part of the complex RF signal output from the complex mixer, performing a convolution integral according to a generated impulse response based on an odd function for an imaginary part of the complex RF signal output from the complex mixer, rejecting one side of a positive or negative frequency, and outputting a real RF signal.

In accordance with yet another aspect of the present invention, there is provided an upconverter for converting a complex signal to a frequency of a Radio Frequency (RF) signal, including a distributor, provided with a plurality of output terminals, for switching and outputting an input complex signal; a plurality of complex-coefficient transversal filters, connected to the plurality of output terminals of the distributor in a one-to-one correspondence, having different pass band frequencies the plurality of complex-coefficient transversal filters performing a convolution integral according to a generated impulse response based on an even function for a real part of an input complex RF signal, performing a convolution integral according to a generated impulse response based on an odd function for an imaginary part of the complex RF signal, rejecting one side of a positive or negative frequency in the pass band frequencies, and outputting a real RF signal; a local oscillator for switching and outputting a real local signal of a frequency according to the pass band frequencies of the plurality of complex-coefficient transversal filters; a plurality of complex mixers connected to the plurality of output terminals of the distributor and inputs of the plurality of complex-coefficient transversal filters in the one-to-one correspondence and connected to the local oscillator, the plurality of complex mixers performing a frequency conversion process by multiplying the complex signal output from the distributor and the real local signal output from the local oscillator, and outputting a complex RF signal to an associated complex-coefficient transversal filter; and a combiner, connected to the plurality of complex mixers, for switching and outputting the real RF signal output from the plurality of complex-coefficient transversal filters.

BRIEF DESCRIPTION OF THE DRAWINGS

The above and other objects and advantages of the present invention will be more clearly understood from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings. In the following description of the present invention, a detailed description of known functions and configurations incorporated herein is omitted to avoid making the subject matter of the present invention unclear.

A. Principle of Downconverter of Low-Intermediate Frequency (IF) Scheme

Figure 1:
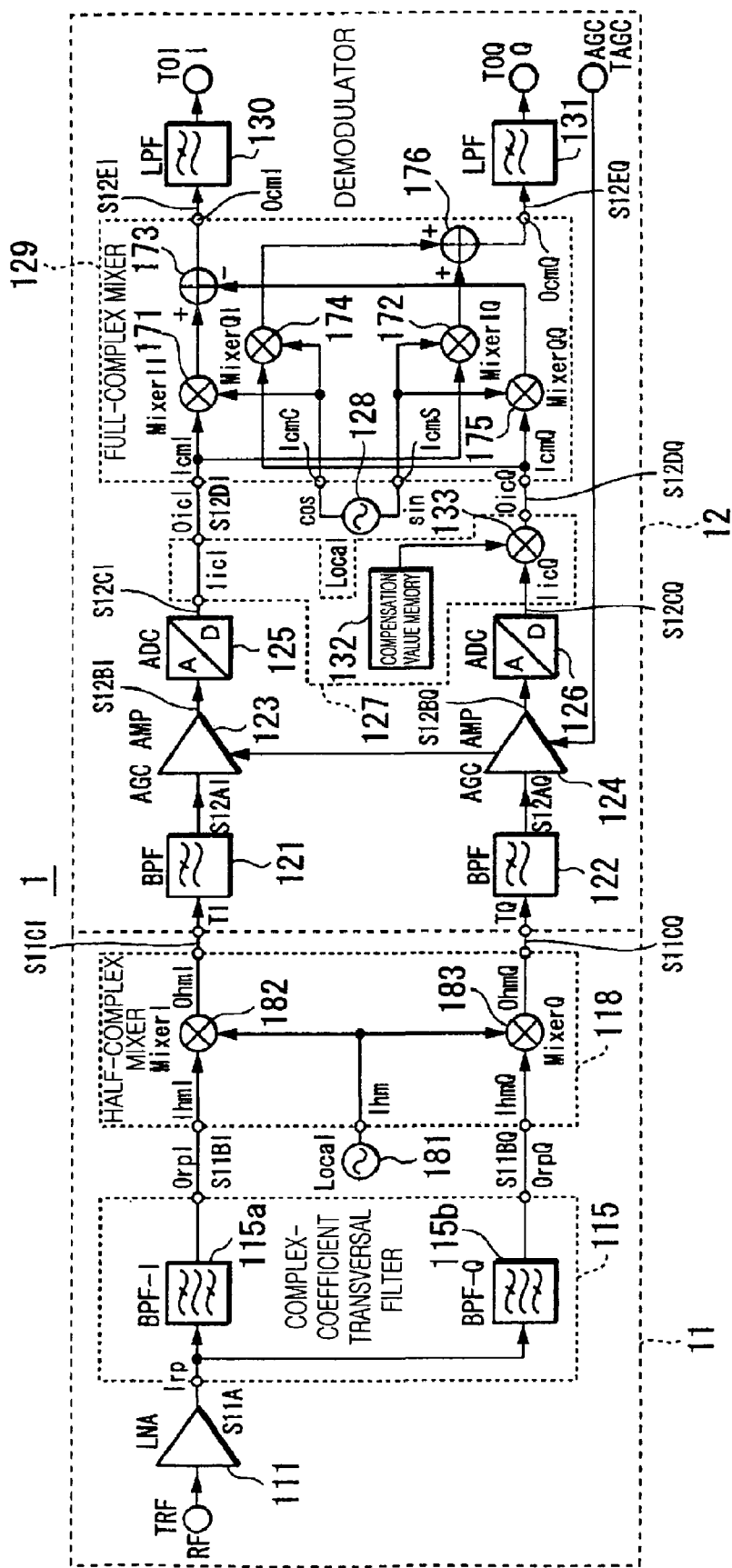
FIG. 1 illustrates a first basic structure of a downconverter of a low-Intermediate Frequency (IF) scheme in accordance with the present invention.

The principle of a downconverter of a low-IF scheme in accordance with the present invention will be described with reference to an example of a basic structure of the downconverter of the low-IF scheme. FIG. 1 illustrates a downconverter 1 corresponding to a first basic structure of the downconverter of the low-IF scheme in accordance with the present invention. The downconverter 1 is a radio receiver, and is provided with an IF generator 11 and a baseband generator 12. The IF generator 11 for converts a Radio Frequency (RF) signal, input from an input terminal TRF connected to an antenna, to an IF signal. The baseband generator 12 converts the IF signal output from the IF generator 11 to a real axis component I and an imaginary axis component Q of a baseband signal, extracting the baseband signal, and outputting the extracted baseband signal to a demodulator.

The IF generator 11 is configured by a Low Noise Amplifier (LAN) 111, a complex-coefficient transversal filter 115, a local oscillator 181 for outputting a real local signal, and a half-complex mixer 118.

In the IF generator 11, the complex-coefficient transversal filter 115 is used to reject a positive or negative frequency component and is configured by band pass filters (BPF)-I 115a and a BPF-Q 115b. An input terminal Irp of the complex-coefficient transversal filter 115 is commonly connected to the BPF-I 115a and the BPF-Q 115b. An output terminal OrpI of the complex-coefficient transversal filter 115 is connected to an output terminal of the BPF-I 115a. An output terminal OrpQ of the complex-coefficient transversal filter 115 is connected to an output terminal of the BPF-Q 115b.

The half-complex mixer 118 is used to frequency-convert an RF signal to an IF signal and is configured by multipliers, i.e., a mixer-I 182 and a mixer-Q 183. A local oscillator 181 inputs a real local signal corresponding to a real signal of cos or sin to an input terminal Ihm of the half-complex mixer 118. The half-complex mixer 118 multiplies a complex signal S11B, input from input terminals IhmI and IhmQ, and the real local signal, performs frequency conversion to a frequency value out of an RF signal band in a frequency value separated by a predetermined (set) frequency from frequency zero, and outputs a complex signal S11C.

In the frequency value separated by the predetermined frequency from the frequency zero, a frequency value out of a channel signal band of the RF signal, i.e., an IF, is a frequency (corresponding to a predetermined frequency of a downconverter mentioned in the claims) separated by an offset frequency from the center frequency of the RF signal out of a channel signal band of the RF signal.

The baseband generator 12 is connected to the IF generator 11 through terminals TI and TQ, and is configured by BPFs 121 and 122, Auto Gain Control (AGC) amplifiers 123 and 124, Analog-to-Digital Converters (ADCs) 125 and 126, an imbalance corrector 127, a local oscillator 128, a full-complex mixer 129, and low pass filters (LPFs) 130 and 131.

The BPFs 121 and 122 limit a real axis component S11CI and an imaginary axis component S11CQ of the input complex signal S11C to a frequency band of a predetermined range based on the IF, and then output a complex signal S12A.

The AGC amplifiers 123 and 124 control a gain according to a voltage applied from an input terminal TAGC. The ADCs 125 and 126 convert an analog signal to a digital signal.

The imbalance corrector 127 is configured by a compensation value memory 132 and a multiplier 133. The imbalance corrector 127 digitally corrects a difference between the amplitude of an output signal S12CI of the ADC 125 and the amplitude of an output signal S12CQ of the ADC 126 on the basis of a difference between the amplitude of an output signal of the AGC amplifier 123 and the amplitude of an output signal of the AGC amplifier 124. When signals of real and imaginary parts of the half-complex mixer 118 are completely orthogonal, interference of positive and negative signals is absent. However, when an amplitude difference between the real and imaginary parts is present in a filter process performed in the baseband generator 12 or the AGC amplifiers 123 and 124 and the ADCs 125 and 126, interference due to an image frequency signal occurs. For this reason, the imbalance corrector 127 corrects the amplitude difference, thereby rejecting image frequency interference throughout a target signal band.

In the imbalance corrector 127, the compensation value memory 132 stores in advance a value (or compensation value) of a ratio between the amplitude of the output signal S12CQ of the ADC 126 and the amplitude of the output signal S12CI of the ADC 125 on the basis of the amplitude of the output signal S12CQ of the ADC 126. The multiplier 133 multiplies the amplitude of the output signal S12CQ of the ADC 126 in an input terminal IicQ and the compensation value based on the amplitude input from the compensation value memory 132, and then outputs a multiplied output signal S12DQ to an output terminal OicQ. The output signal S12CI of the ADC 125 in the input terminal IicI is output, to an output terminal OicI, as an output signal S12DI.

The full-complex mixer 129 is used to perform frequency conversion, and is configured by a mixer-II 171, a mixer-IQ 172, a mixer-QI 174, and a mixer-QQ 175 serving as multipliers, a subtractor 173, and an adder 176. The full-complex mixer 129 receives a real axis local cos signal from the local oscillator 128 through an input terminal IcmC and receives an imaginary axis local sin signal from the local oscillator 128 through an input terminal IcmS. The full-complex mixer 129 performs a frequency conversion process based on frequency zero for a complex signal S12D input from the input terminals IcmI and IcmQ, and then outputs a complex signal S12E.

Next, the overall operation of the above-described downconverter 1 will be described. The LNA 111 amplifies an RF signal of a real signal, input from an antenna to the input terminal TRF, and then outputs a real signal S11A. The complex-coefficient transversal filter 115 to which an associated signal is input rejects an image frequency signal for the real signal S11A input from the input terminal Irp. The complex-coefficient transversal filter 115 outputs a real axis component S11BI and an imaginary axis component S11BQ of the complex signal S11B with a phase difference of 90 degrees from output terminals OrpI and OrpQ to the half-complex mixer 118. The half-complex mixer 118 frequency-converts the real axis component S11BI and the imaginary axis component S11BQ on the basis of the real signal of cos or sin input from the local oscillator 181, and then outputs a complex signal S11C.

The BPFs 121 and 122 band-limit a real axis component S11CI and an imaginary axis component S11CQ of the complex signal S11C to a predetermined range based on the center frequency of positive and negative IF signals, and output a complex signal S12A to the AGC amplifiers 123 and 124. The AGC amplifiers 123 and 124 adjust amplitudes of a real axis component S12AI and an imaginary axis component S12AQ to levels suitable for inputs to the ADCs 125 and 126. The AGC amplifiers 123 and 124 output a complex signal S12B to the ADCs 125 and 126. The ADCs 125 and 126 convert an input signal to a digital signal and then output a complex signal S12C to the imbalance corrector 127.

The imbalance corrector 127 digitally corrects a difference between a real axis component S12CI and an imaginary axis component S12CQ of the input complex signal S12C, and outputs a real axis component S12DI and an imaginary axis component S12DQ of a complex signal S12D. The full-complex mixer 129 frequency-converts the complex signal S12D such that the center frequency is frequency zero according to a real axis local signal cos and an imaginary axis local signal sin of the complex local signal output from the local oscillator 128, and then outputs a complex signal S12E to the LPFs 130 and 131. The LPFs 130 and 131 remove a high frequency component from the complex signal S12E and output a real axis component I and an imaginary axis component Q of a complex baseband signal to output terminals TOI and TOQ.

B. Complex-Coefficient Transversal Filter in Downconverter of Low-IF Scheme

Next, a design method and detailed operation of the complex-coefficient transversal filter 115 within the IF generator 11 of the downconverter 1 will be described.

The complex-coefficient transversal filter 115 converts an RF signal from a real signal to a complex signal. The complex-coefficient transversal filter 115 is configured by the BPF-I 115a and the BPF-Q 115b. The BPF-I 115a is used to process a real axis signal of the complex signal, and performs a convolution integral with an even-symmetric impulse. The BPF-I 115b is used to process an imaginary axis signal of the complex signal, and performs a convolution integral with an odd-symmetric impulse. The complex-coefficient transversal filter 115 outputs signals from the two BPFs such that they have a phase difference of 90 degrees.

The complex-coefficient transversal filter 115 is designed, for example, using a frequency shift method. That is, a real-coefficient LPF of a predetermined pass bandwidth Bw/2 and a stop-band attenuation amount ATT is designed and a coefficient of the real-coefficient LPF is multiplied by $e^{j\omega x}$, such that a filter of a center frequency ω, a pass bandwidth Bw, and a stop-band attenuation amount ATT can be obtained. Here, the complex-coefficient transversal filter 115 is designed in which the center frequency ω=800 MHz, the stop-band attenuation amount ATT=39 dB, and a sampling frequency=2.4 GHz.

Figure 4:
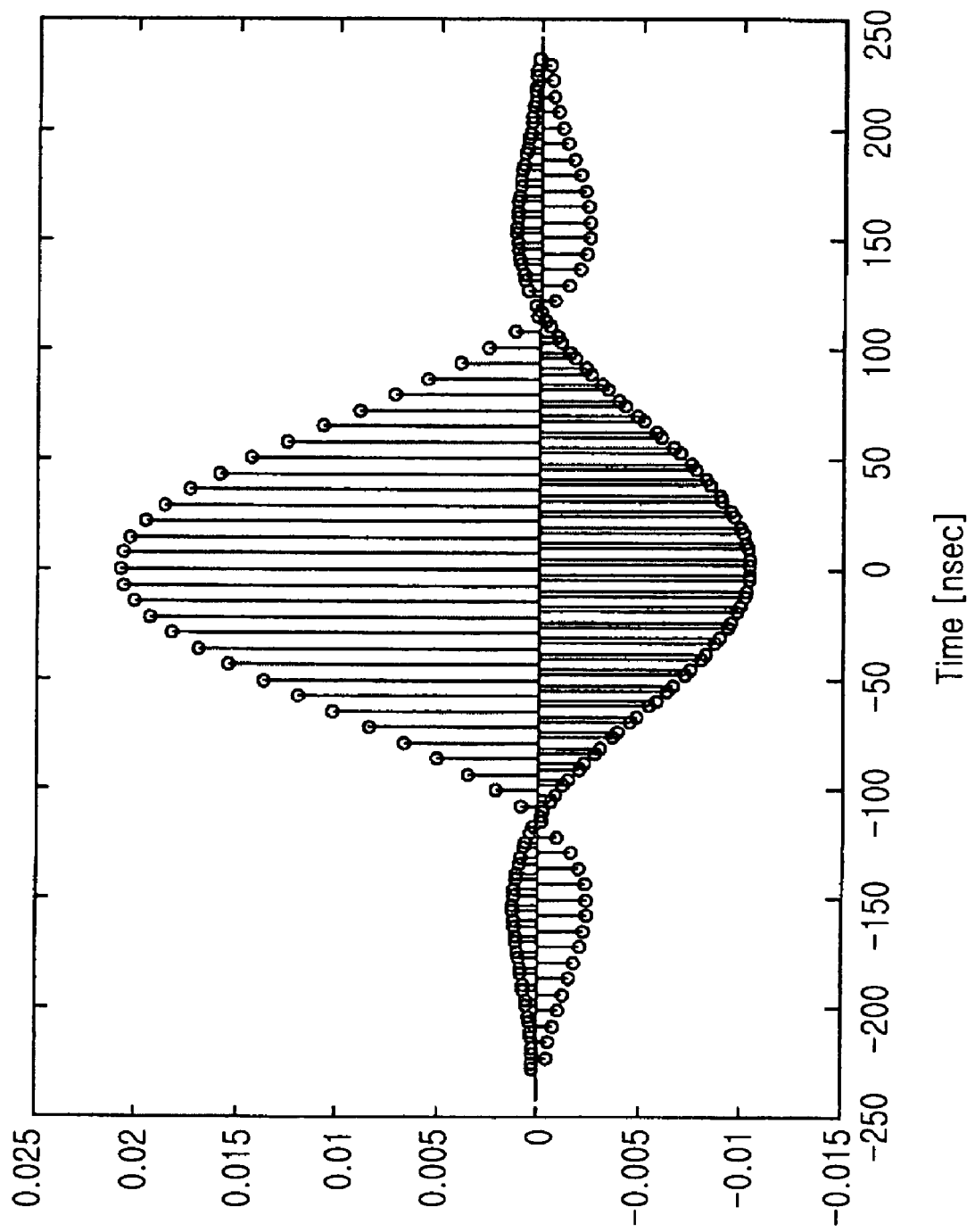
FIG. 4 illustrates an impulse response of a real part of the complex-coefficient transversal filter used in the downconverter of the low-IF scheme in accordance with the present invention.
Figure 5:
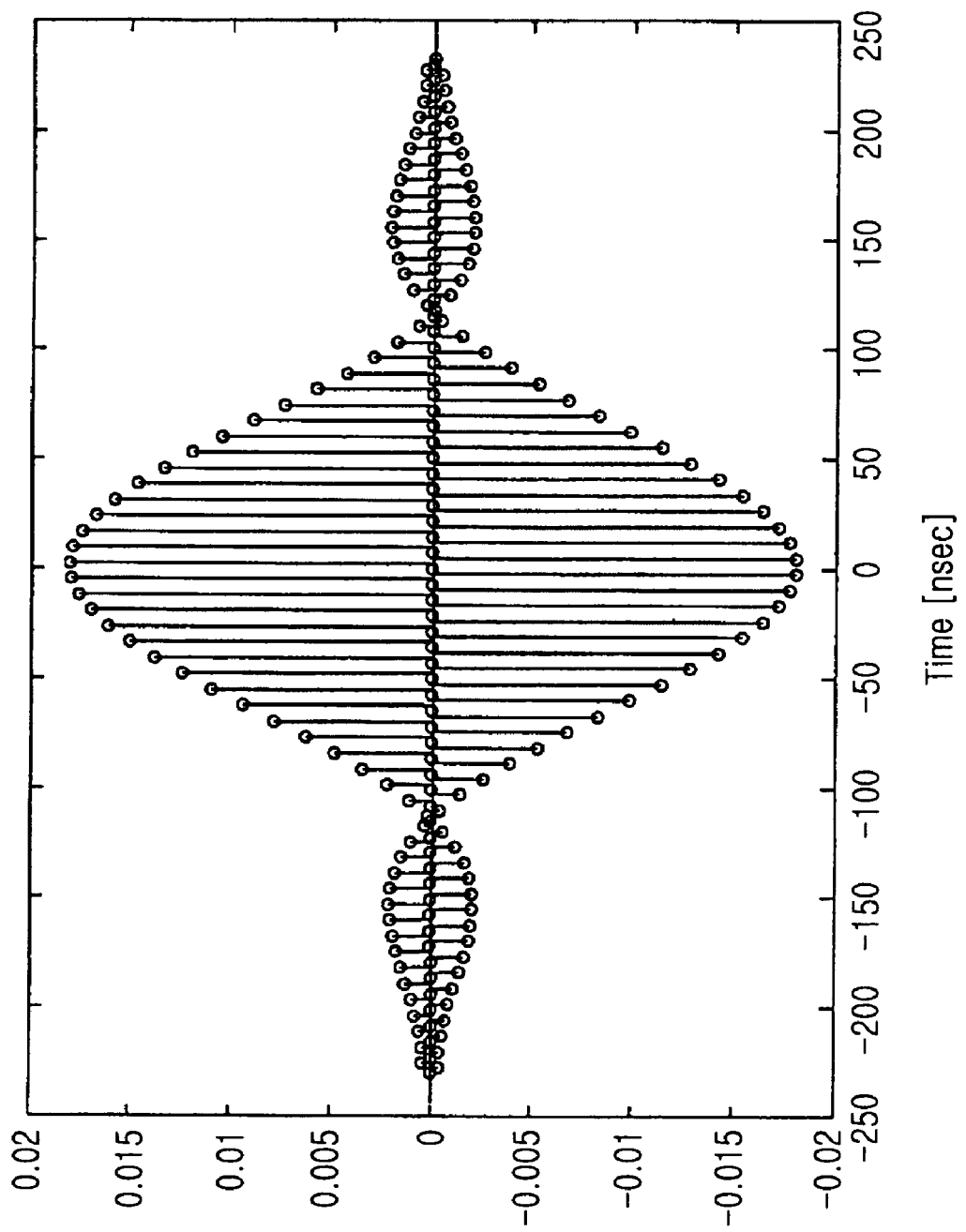
FIG. 5 illustrates an impulse response of an imaginary part of the complex-coefficient transversal filter used in the downconverter of the low-IF scheme in accordance with the present invention.

FIG. 4 illustrates an impulse response of a real part of the complex-coefficient transversal filter 115 that has an even-symmetric impulse response with respect to the envelope center. FIG. 5 illustrates an impulse response of an imaginary part of the complex-coefficient transversal filter 115 that has an odd-symmetric impulse response with respect to the envelope center. In FIGS. 4 and 5, the vertical axis represents a normalized value.

Next, the operation of the complex-coefficient transversal filter 115 within the IF generator 11 will be described. When an RF signal corresponding to a real signal is input to the input terminal TRF in FIG. 1, the complex-coefficient transversal filter 115 receives a real signal S11A from the LNA 111 through the input terminal Irp and outputs a real axis component S11BI and an imaginary axis component S11BQ of a complex signal S11B from the output terminals OrpI and OrpQ.

For example, two real RF signals are input to the input terminal TRF such that the real signal S11A includes two signals. One signal is a Double Side Band (DSB) signal where a center frequency=800 MHz, a carrier interval=1.6 MHz, and carrier power=−20 dB. This signal is a target signal. The other signal is a Continuous Wave (CW) signal where a frequency=790 MHz that is 10 MHz less than the above-described target signal, and power=0 dB. This signal is a non-target signal, i.e., an image frequency signal.

Figure 2:
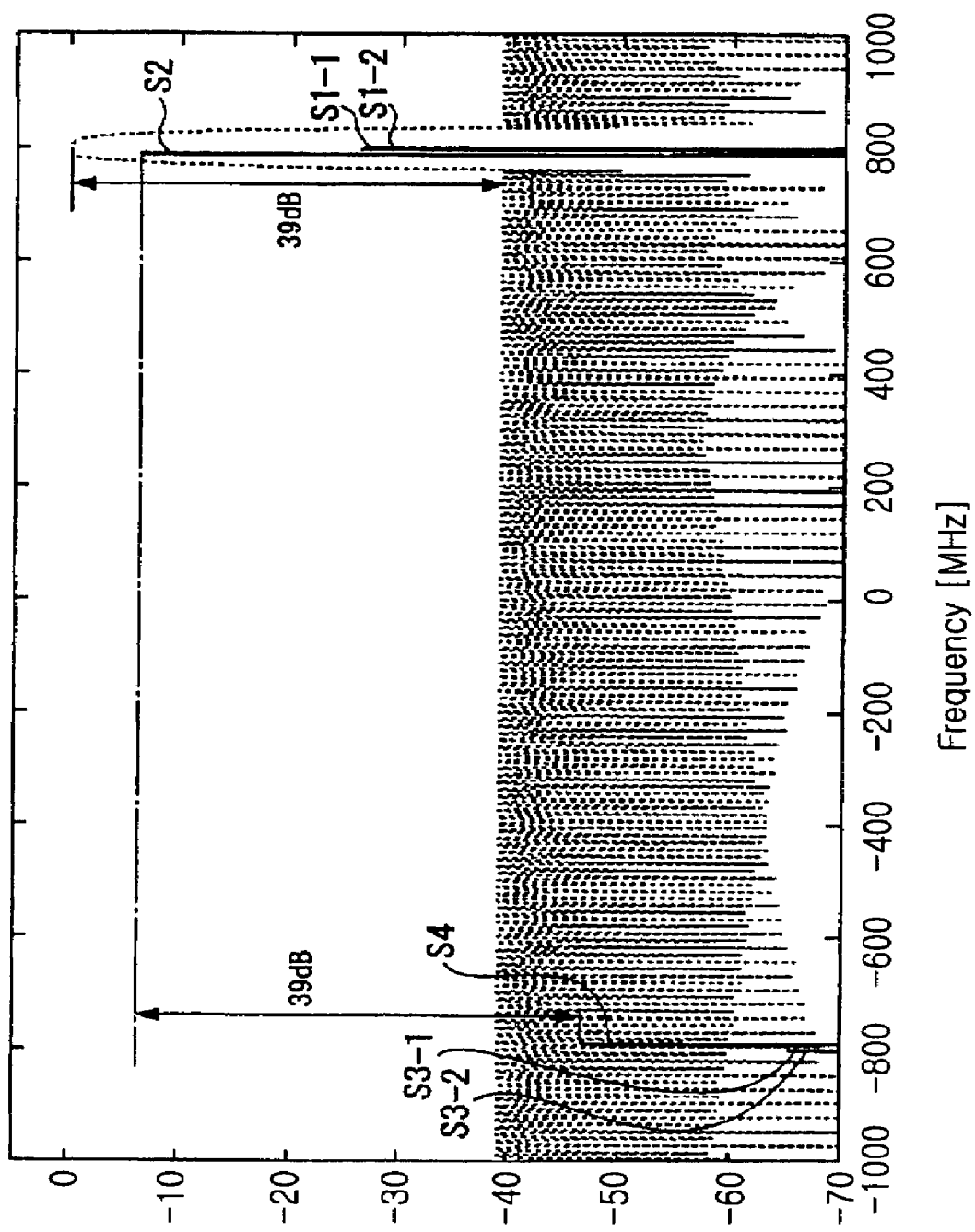
FIG. 2 illustrates an output spectrum and filter characteristics of a complex-coefficient transversal filter used in the downconverter of the low-IF scheme in accordance with the present invention.

FIG. 2 illustrates a spectrum of the complex signal S11B observed in the output terminals OrpI and OrpQ. In FIG. 2, the dashed line denotes frequency characteristics of the complex-coefficient transversal filter 115. As illustrated in FIG. 2, the above-described target signal (S1-1 and S1-2) and an image frequency signal (S2) are in a pass band of the complex-coefficient transversal filter 115. An image frequency signal (S4) and a target signal (S3-1 and S3-2), present in a negative frequency band, are out of a pass band of the complex-coefficient transversal filter 115. The image frequency signal (S4) is a signal in which 39 dB is rejected, as compared with the image frequency signal (S2) present in a positive frequency band.

C. Operation of Half-Complex Mixer in Downconverter of Low-IF Scheme

Referring to FIG. 1, a detailed operation of the half-complex mixer 118 of the downconverter 1 will be described. First, it is assumed that a signal obtained by amplifying an RF signal corresponding to a real signal in the LNA 111 is $As_{rf}(t)$, a complex RF signal S11B output from the complex-coefficient transversal filter 115 is $A(s_{rfi}(t)+js_{rfq}(t))$, and an amplitude error between a real part and an imaginary part of the complex RF signal is $A_e$. It is assumed that a complex IF signal S11C output from the half-complex mixer 118 is $s_{if}(t)$ and a real local signal input from the local oscillator 181 is $L_o(t)$. In this case, $s_{if}(t)$ is expressed by Equation (22). A frequency conversion operation the reverse of a target frequency conversion operation, is performed due to an amplitude error of the complex RF signal.

$$s_{if}(t) = L_o(t)((A + A_e)s_{rfi}(t) + j(A - A_e)s_{rfq}(t)) \quad \text{Equation (22)}$$
$$= L_o(t)(A(s_{rfi}(t) + js_{rfq}(t)) + A_e(s_{rfi}(t) - js_{rfq}(t)))$$

Here, $s_{if}(t)$ can be rewritten as shown in Equation (23) because a local signal corresponding to a real signal is a combination of complex signals $L_{oi}(t)$ and $L_{oq}(t)$ corresponding to complex conjugates.

$$s_{if}(t_s) = \frac{((L_{oi}(t) + jL_{oq}(t)) + (L_{oi}(t) - jL_{oq}(t)))}{2} \quad \text{Equation (23)}$$
$$(A(s_{rfi}(t) + js_{rfq}(t)) + A_e(s_{rfi}(t) - js_{rfq}(t)))$$
$$= \frac{1}{2}A(s_{rfi}(t) + js_{rfq}(t))((L_{oi}(t) + jL_{oq}(t)) +$$
$$(L_{oi}(t) - jL_{oq}(t))) + \frac{1}{2}A_e(s_{rfi}(t) - js_{rfq}(t)) +$$
$$((L_{oi}(t) + jL_{oq}(t)) + (L_{oi}(t) - jL_{oq}(t)))$$

As shown in Equation (23), a real local signal undergoes a frequency conversion operation in a plus direction due to a non-error component of a complex RF signal and undergoes a frequency conversion operation in a minus direction due to an error component of the complex RF signal.

When the BPFs 121 and 122 reject other terms except the terms of the down-conversion operation (corresponding to a conversion operation to a frequency close to zero frequency), Equation (24) is produced.

$$s_{if}(t) = \frac{1}{2}A(s_{rfi}(t) + js_{rfq}(t))(L_{oi}(t) - jL_{oq}(t)) + \quad \text{Equation (24)}$$
$$\frac{1}{2}A_e(s_{rfi}(t) - js_{rfq}(t))(L_{oi}(t) + jL_{oq}(t))$$

As shown in Equation (24), the first term indicates that a positive frequency of an RF signal is frequency-shifted in the minus direction according to a local signal, and the second term indicates that a negative frequency, which occurred due to an error of the RF signal, is frequency-shifted in the plus direction according to the local signal.

In this case, a negative frequency of an associated signal is frequency-shifted in the plus direction when a low frequency signal is present which corresponds to a value of twice an IF rather than the frequency of a target RF signal. The shifted frequency corresponds to the frequency of the target signal to be converted to the IF, and image frequency interference occurs.

When the reduction of an image rejection ratio due to a phase error $\phi_e$ is considered, an image rejection ratio $IMR_{mix}$ can be computed as shown in Equation (25).

$$IMR_{mix} = 20\log_{10}L_o\left(\sqrt{\frac{1 + (1 + A_e)^2 + 2(1 + A_e)\cos\phi_e}{1 + (1 + A_e)^2 - 2(1 + A_e)\cos\phi_e}}\right) \quad \text{Equation (25)}$$

Assuming that an error of the mixers 182 and 183 is absent in the present invention, the image rejection ratio corresponds to that of a negative frequency of the complex-coefficient transversal filter 115 in the RF signal.

Figure 21:
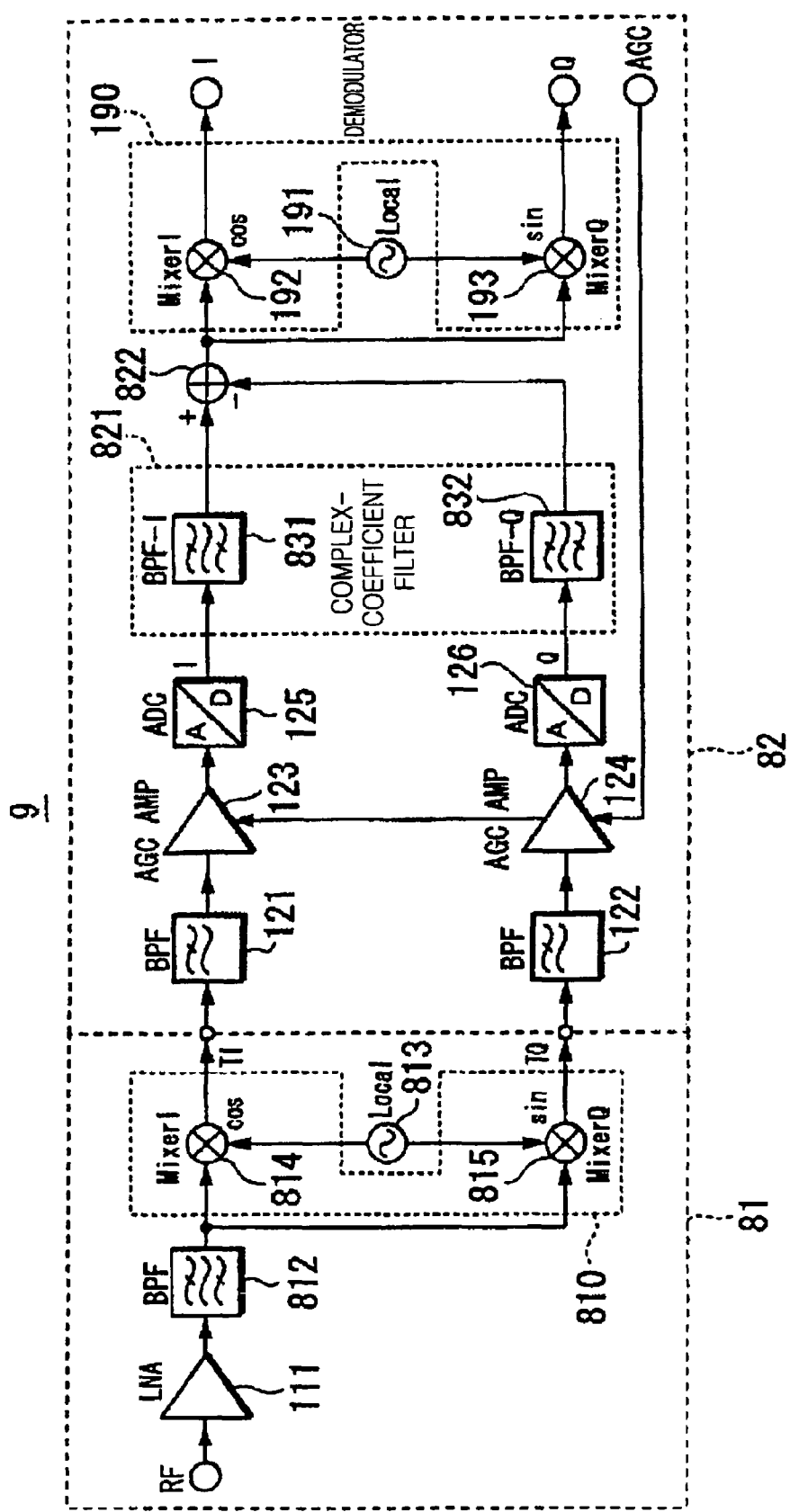
FIG. 21 illustrates a structure of a conventional downconverter of the low-IF scheme.

There will be described an example in which fixed frequency values are applied to outputs from the mixer-I 814 and the mixer-Q 815 of the half-complex mixer 810 of the conventional downconverter 9 illustrated in FIG. 21 and fixed frequency values are applied to outputs from the mixer-I 182 and the mixer-Q 183 of the half-complex mixer 118 of the inventive downconverter 1. Moreover, there will be described a difference between the conventional downconverter 9 and the inventive downconverter 1 of FIG. 1. In this example, it is assumed that the half-complex mixers 810 and 118 are ideal mixers.

Figure 22:
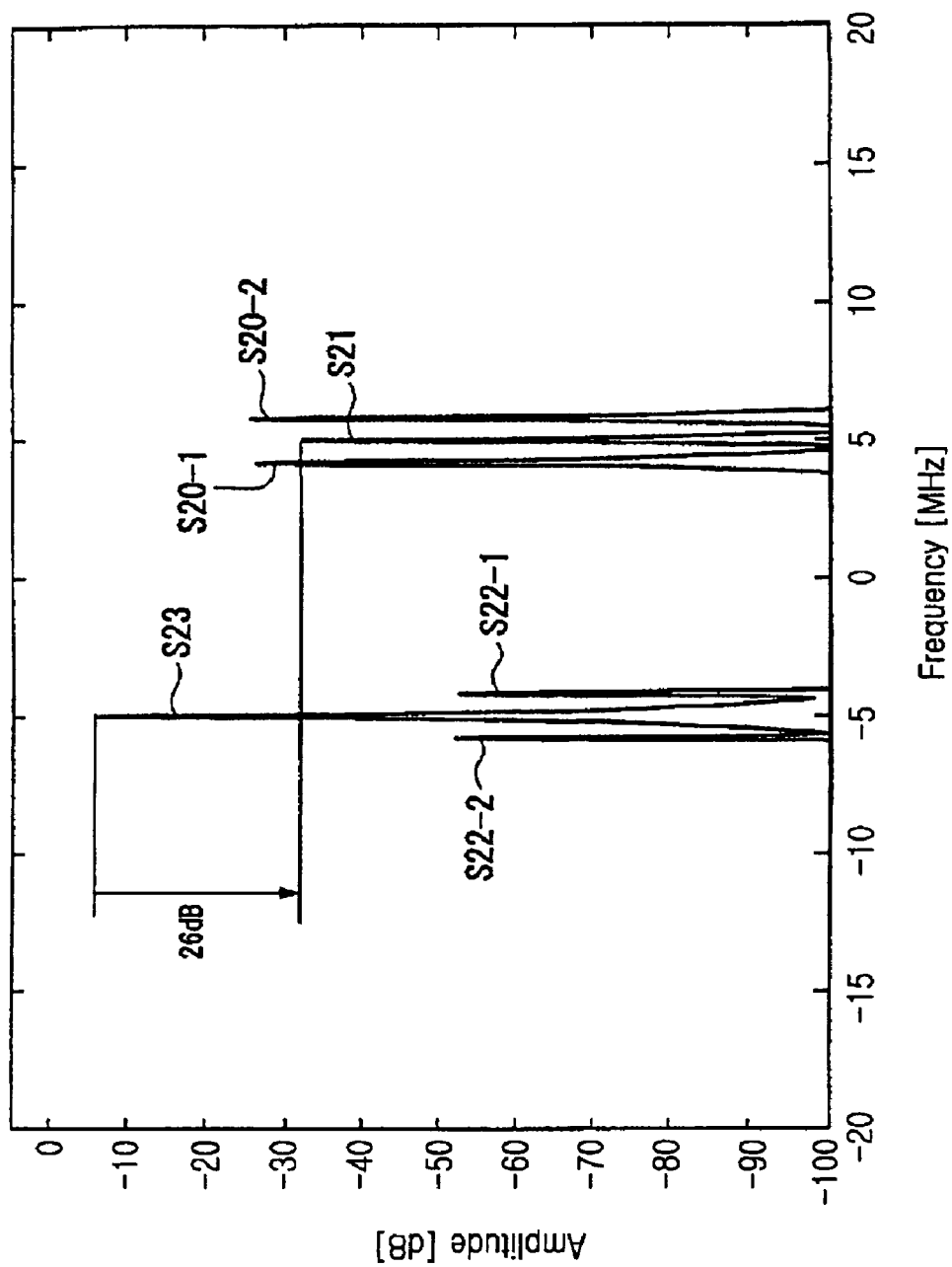
FIG. 22 illustrates an output spectrum of a half-complex mixer in the conventional downconverter of the low-IF scheme.

When a real local signal of 795 MHz close to an RF signal frequency is input as a real local signal input from the local oscillator 181 in the inventive downconverter 1, it is downconverted. In FIG. 2, a target signal (S1-1 and S1-2) present in a positive frequency band is frequency-shifted to about 5 MHz (as indicated by S5-1 and S5-2). An image frequency signal (S4 of FIG. 3) of a negative frequency band in which 39 dB is rejected in the complex-coefficient transversal filter 115 is frequency-shifted to 5 MHz (as indicated by S6). On the other hand, an image frequency signal present in a negative frequency band in the conventional downconverter 9 is a signal in which 26 dB is rejected as illustrated in FIG. 22.

Both the complex-coefficient transversal filter 115 of the inventive downconverter 1 and the BPF 812 of the conventional downconverter 9 can obtain output signals with a phase difference of 90 degrees. However, a phase shifter configured by a polyphase filter and applied to the BPF 812 has a large variation in output due to manufacturing variation. In this case, because a worst value does not provide good rejection characteristics, a mean value of about 26 dB is illustrated in FIG. 22. On the other hand, the complex-coefficient transversal filter 115 can obtain a value of 39 dB because the variation due to manufacturing variation is reduced and a difference between the worst value and the mean value is small, for example, when a Surface Acoustic Wave (SAW) filter to be described below is applied.

D. Principle of Complex-Coefficient SAW Filter

Next, a complex-coefficient SAW filter serving as means for implementing the complex-coefficient transversal filter 115 will be described. Conventionally, the transversal filter can be implemented by a switched capacitor circuit or a charge-coupled device as well as the SAW filter. The SAW filter is suitable to implement the transversal filter with a high frequency. Next, a basic principle of a transversal SAW filter will be described.

Figure 6:
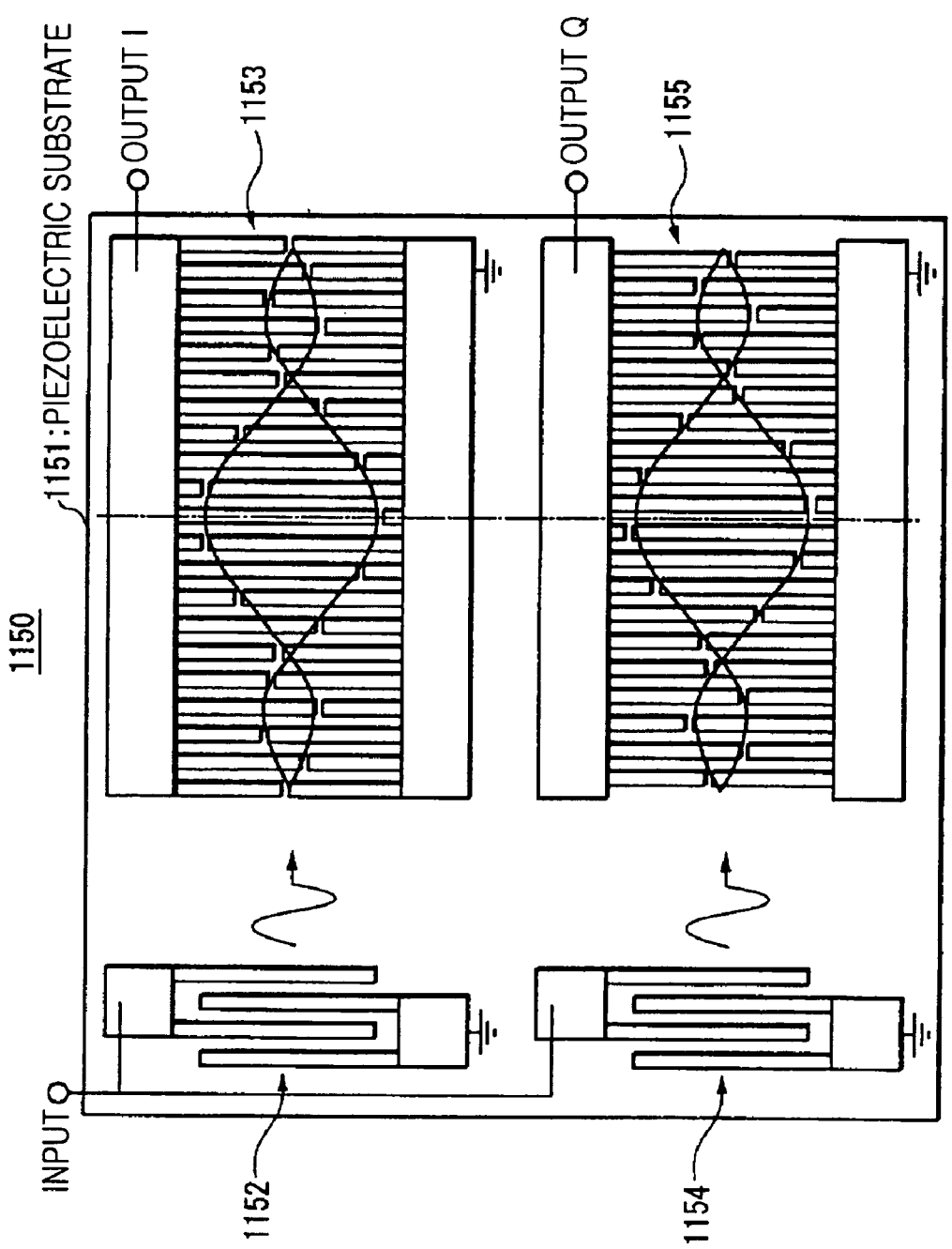
FIG. 6 illustrates a structure of Surface Acoustic Wave (SAW) Filter 1 used in the downconverter of the low-IF scheme in accordance with the present invention.

FIG. 6 illustrates a structure of the SAW filter. A SAW filter 1150 is configured by a piezoelectric substrate 1151 and comb shaped electrodes (hereinafter, referred to as Inter-Digital Transducers (IDTs)) 1152 to 1155 in which an intersection width is different according to a position on the piezoelectric substrate 1151. Comb shaped parts are also referred to as electrode fingers. When the IDTs 1152 and 1154 connected to an input terminal receive an impulse electric signal, they are mechanically distorted and SAWs are excited and propagated in the left and right directions of the piezoelectric substrate 1151. The IDT 1153 is connected to an output terminal I for outputting a real axis component and is located in a position capable of receiving the SAW from the IDT 1152. The IDT 1155 is connected to an output terminal Q for outputting an imaginary axis component and is located in a position capable of receiving the SAW from the IDT 1154.

Next, the principle of the SAW filter 1150 will be described. When an impulse electric signal is applied, an impulse response of a SAW signal output as the SAW is produced on the basis of a weight function (or intersection width) $W_i$ in each electrode finger, a distance $x_i$ from each electrode finger, and a phase velocity v of the SAW. A frequency transfer function $H(\omega)$ of the impulse response is expressed by Equation (26).

Equation (26) represents a linear combination of the weight function $W_i$ and is based on the basic principle of the transversal filter.

$$H(\omega) = \sum_{i=0}^{n} W_i \exp\left(-\frac{j\omega x_i}{v}\right)$$

Equation (26)

The transversal filter with an associated frequency transfer function $H(\omega)$ can control amplitude characteristics and phase characteristics through a design of $W_i$ and $x_i$. The complex-coefficient transversal filter with desired characteristics can be implemented by designing $W_i$ and $x_i$ of the transversal SAW filter. To perform a weighting operation mapped to an impulse response of a real part, (i.e., an even-symmetric impulse response), the IDT 1153, connected to the output terminal I for outputting a real axis component, is provided with an electrode finger such that even symmetry is made with respect to the envelope center. To perform a weighting operation mapped to an impulse response of an imaginary part, (i.e., an odd-symmetric impulse response), the IDT 1155, connected to the output terminal Q for outputting an imaginary axis component, is provided with an electrode finger such that odd symmetry is made with respect to the envelope center. According to this structure, a real RF signal can be converted to a complex RF signal with a phase difference of 90 degrees between the real part and the imaginary part.

Next, the operation of the SAW filter 1150 will be described. First, when a real RF signal is input to the input terminal, SAWs are excited in the IDTs 1152 and 1154 and SAW signals are propagated. The SAW signals propagated from the IDTs 1152 and 1154 are received by the IDTs 1153 and 1155 provided in propagation directions of the SAW signals. A convolution integral is performed on the basis of impulse responses mapped to the SAW signals, such that they are converted to electric signals. At this time, the IDT 1153 outputs a real component of the RF signal through the output terminal I, and the IDT 1155 outputs an imaginary component of the RF signal through the output terminal Q. The resulting SAW filter can be obtained which can reject a frequency out of the target signal frequency in a frequency side of a target signal at a high rejection ratio while rejecting a negative frequency.

Figure 7:
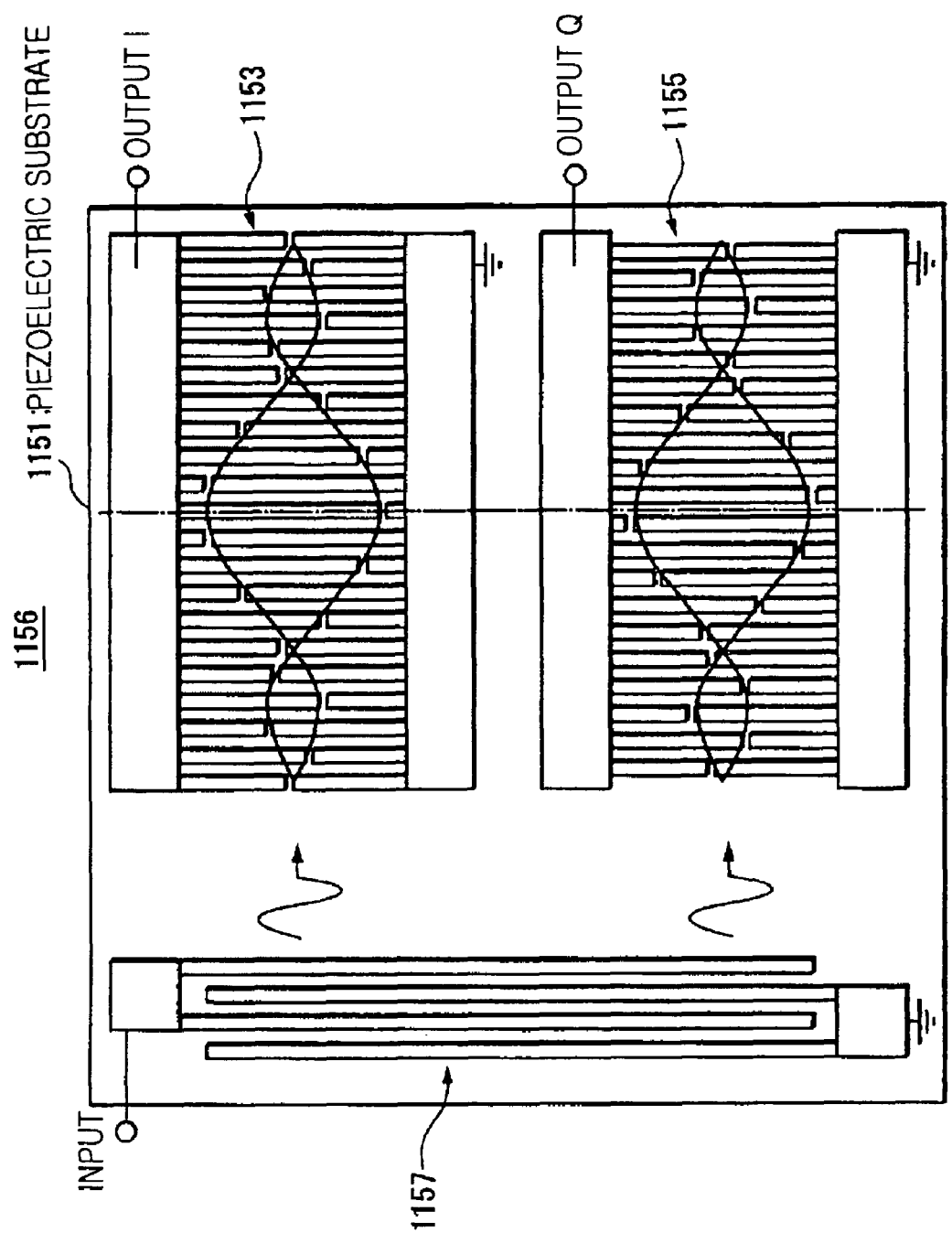
FIG. 7 illustrates a structure of SAW Filter 2 used in the downconverter of the low-IF scheme in accordance with the present invention.

The SAW filter can be implemented by the structure as illustrated in FIG. 7. The SAW filter 1156 of FIG. 7 is provided with an IDT 1157 of an input side placed across both propagation paths of the IDTs 1153 and 1155. The SAW filter 1156 of FIG. 7 is different from the SAW filter of FIG. 6 provided with the two IDTs 1152 and 1154 in an input side. According to the structure of FIG. 7, one IDT can be provided in the input side and the cost reduction can be obtained.

E. Means for Rejecting Image Frequency Signal in Downconverter of Low-IF Scheme

Next, means for rejecting a negative frequency signal in an IF to reject an image frequency signal in the present invention will be described. First, a relation between a target signal of the IF and the image frequency signal will be described.

When an IF signal amplitude is B and an amplitude error between a real part and an imaginary part is $B_e$, an IF signal $s_{if}(t)$ can be expressed by a complex signal using $s_{ifi}(t)$ and $s_{ifq}(t)$ as shown in Equation (27).

$$s_{if}(t) = \frac{(Bs_{ifi}(t) + B_e s_{ifi}(t)) + (jBs_{ifq}(t) - jB_e s_{ifq}(t))}{2}$$ Equation (27)

$$= \frac{B(s_{ifi}(t) + js_{ifq}(t)) + B_e(s_{ifi}(t) - js_{ifq}(t))}{2}$$

When an error is present in the real and imaginary parts of the IF signal as shown in Equation (27), a signal proportional to the error appears in a negative frequency band. When this signal is replaced with a target signal and an image frequency signal, a signal proportional to a frequency error of the image frequency signal appears in the target signal and a signal proportional to a frequency error of the target signal appears in the image frequency signal. Because an IF error is present, interference of the image frequency signal occurs. Accordingly, the interference of the image frequency signal can be reduced when the image frequency signal is rejected.

Figure 15:
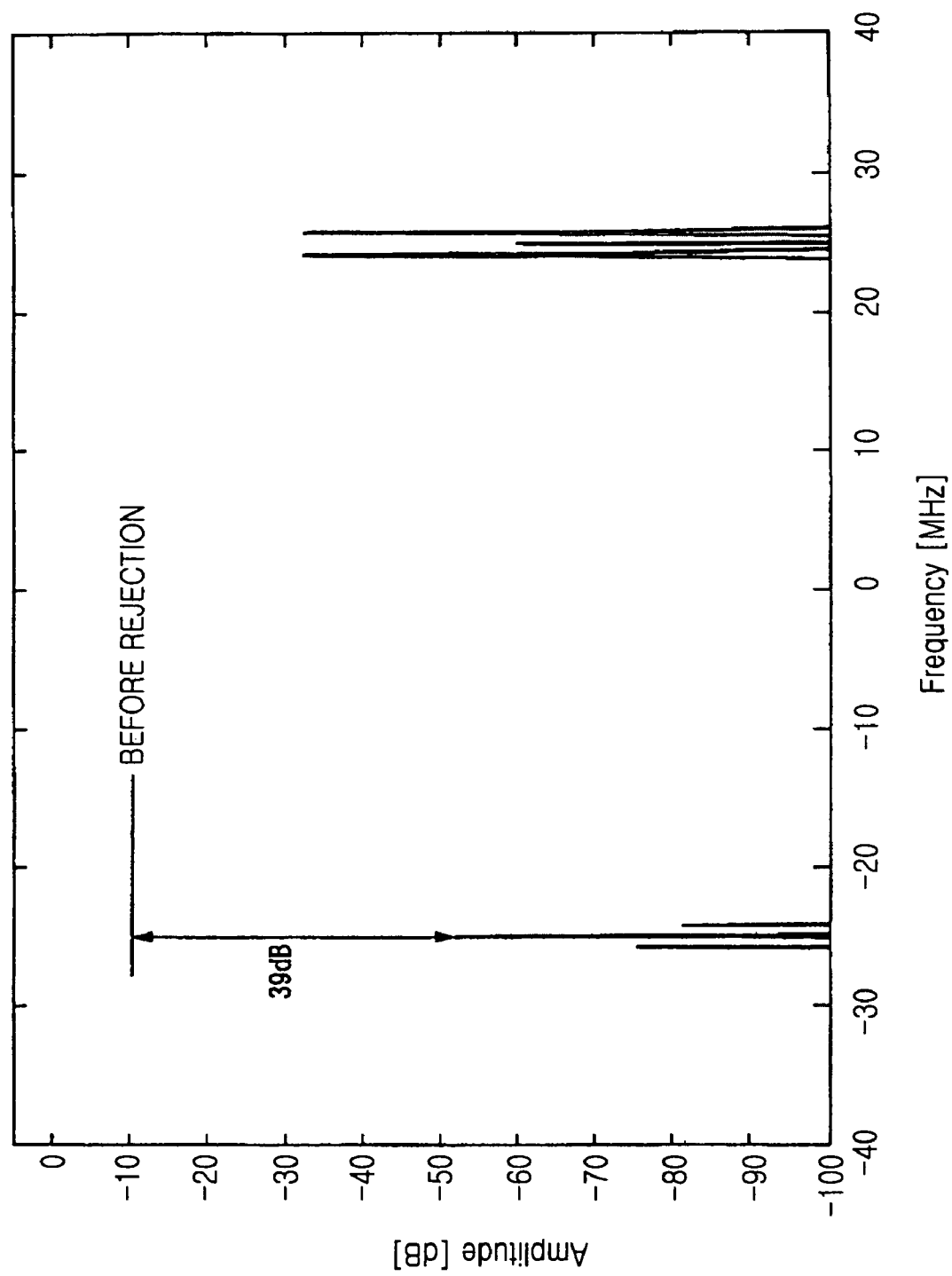
FIG. 15 illustrates an output spectrum of a half-complex mixer when an IF is 25 MHz in the downconverter of the low-IF scheme in an example of the first basic structure in accordance with the present invention.

In the downconverter 1 of FIG. 1, the IF is set to a frequency of more than a half value of a difference between a pass band frequency of the complex-coefficient transversal filter 115 and an RF signal frequency, such that the image frequency signal can be set as a signal out of a pass band of the complex-coefficient transversal filter 115 of the RF signal. The downconverter 1 not only can perform image rejection on the basis of a complex RF signal, but also can reject the interference of the image frequency signal using the effect of a filter for attenuating an input signal. FIG. 15 illustrates an output spectrum of the half-complex mixer 118 when the IF is set to 25 MHz in the downconverter 1. In this case, a frequency of the image frequency signal in which the interference occurs in a frequency band of the RF signal is 750 MHz. Because the frequency of 750 MHz is out of a band of the complex-coefficient transversal filter 115, 39 dB is rejected. Accordingly, requirement conditions for a dynamic range after the half-complex mixer 118 are mitigated.

Figure 3:
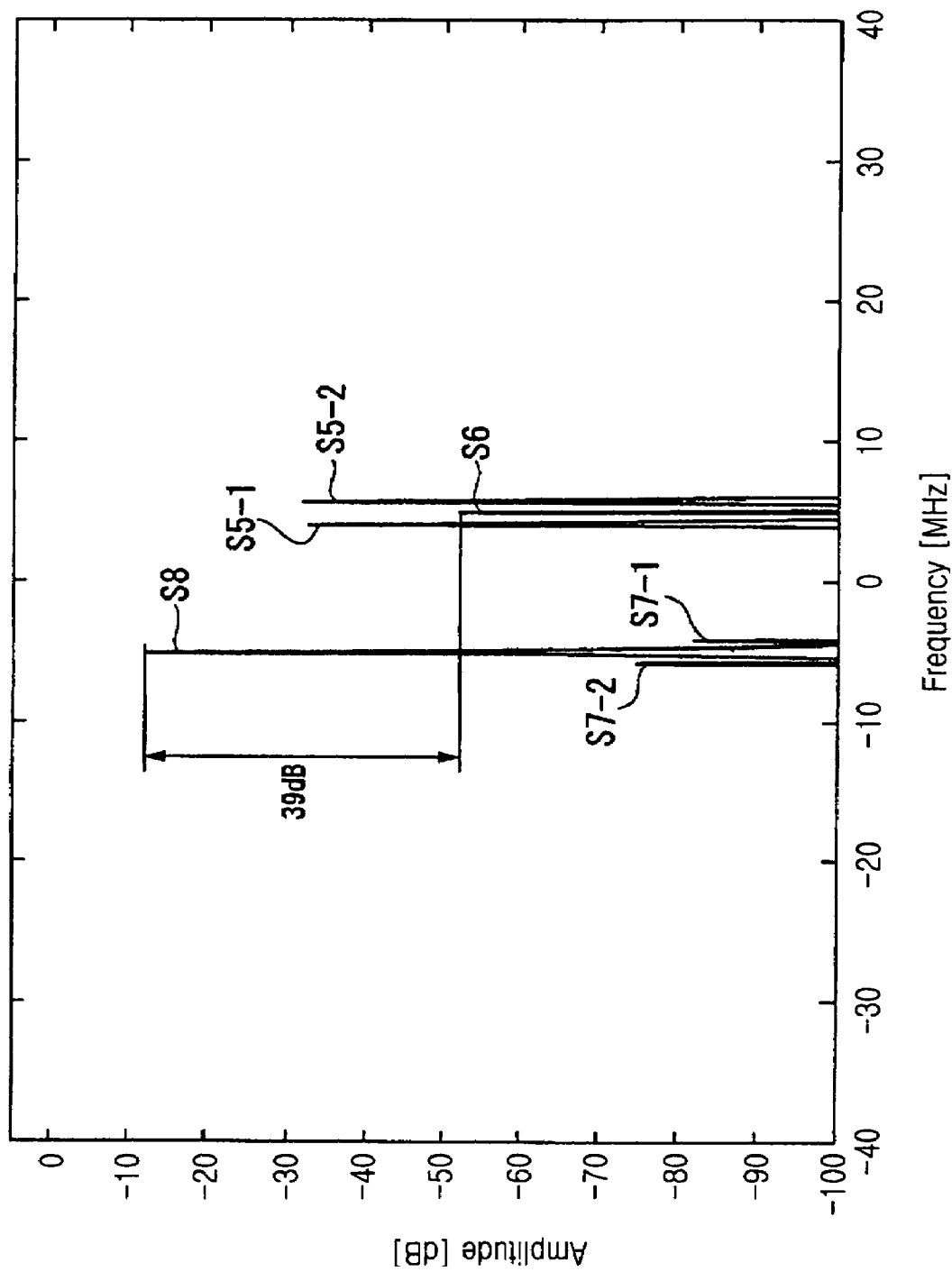
FIG. 3 illustrates an output spectrum of a half-complex mixer used in the downconverter of the low-IF scheme in accordance with the present invention.

The image frequency signal serving as the interference to the target signal is generated through frequency conversion in a plus direction of a negative frequency signal output from the complex-coefficient transversal filter 115. Because filter characteristics in a negative frequency band are uniform, the interference of the image frequency signal occurs as shown in FIG. 3.

Figure 8:
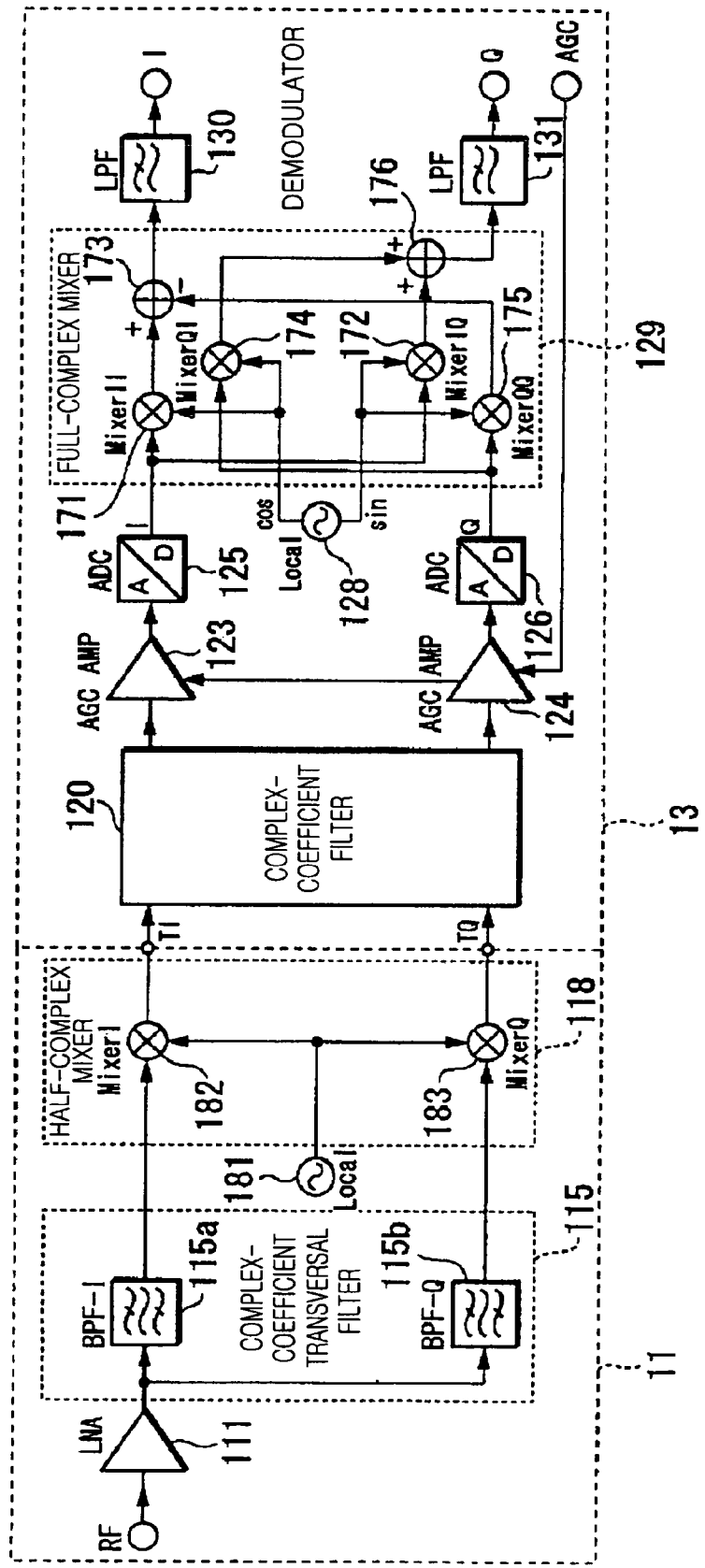
FIG. 8 illustrates a second basic structure of the downconverter of the low-IF scheme in accordance with the present invention.

F. Rejection of Image Frequency Signal Associated with IF Signal Using Complex-Coefficient Filter Next, the downconverter of the low-IF scheme for rejecting an image frequency signal associated with an IF signal using a complex-coefficient filter in the present invention will be described. FIG. 8 illustrates a second basic structure of the downconverter of the low-IF scheme for rejecting an image frequency signal using the complex-coefficient filter. The components with the same functions between the downconverter 2 of FIG. 8 and the downconverter 1 of FIG. 1 are denoted by the same reference numerals, and their description is omitted here.

The BPFs 121 and 122 of the baseband generator 12 of FIG. 1 are replaced with a complex-coefficient filter 120 in the downconverter 2 of FIG. 8. Because the complex-coefficient filter 120 rejects the negative frequency, the downconverter 2 is different from the downconverter 1 in that the imbalance corrector 127 is not required.

In FIG. 8, the complex-coefficient filter 120 sets a positive frequency to a pass band and can reject the negative frequency. For example, the complex-coefficient filter 120 can be implemented using a polyphase filter or a complex-coefficient transversal filter 1120 as illustrated in FIG. 9.

In the polyphase filter, a predetermined range of the negative frequency is set to a stop band, and frequency characteristics of a frequency band, except the stop band, become flat. The complex-coefficient transversal filter can be provided with band pass characteristics in a complex signal and can operate as a band limited filter.

Figure 9:
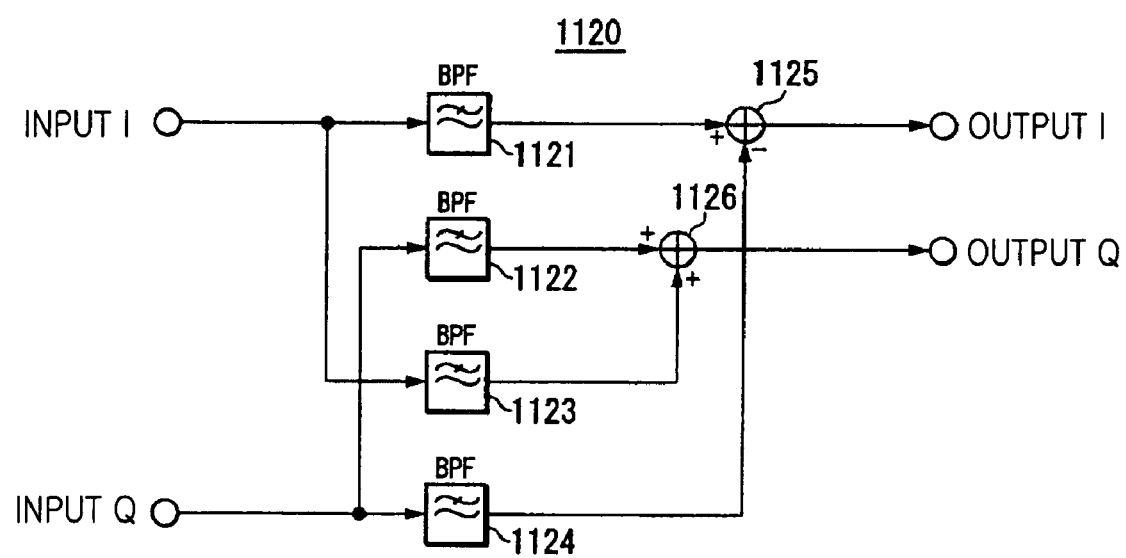
FIG. 9 illustrates a complex-coefficient transversal filter used in an IF stage of the downconverter of the low-IF scheme in accordance with the present invention.

Now, the complex-coefficient transversal filter 1120 as illustrated in FIG. 9 will be described. The complex-coefficient transversal filter 1120 is provided with BPFs 1121 to 1124 in which a frequency band of the vicinity of a target signal (i.e., the IF) is set to a pass band.

Figure 10:
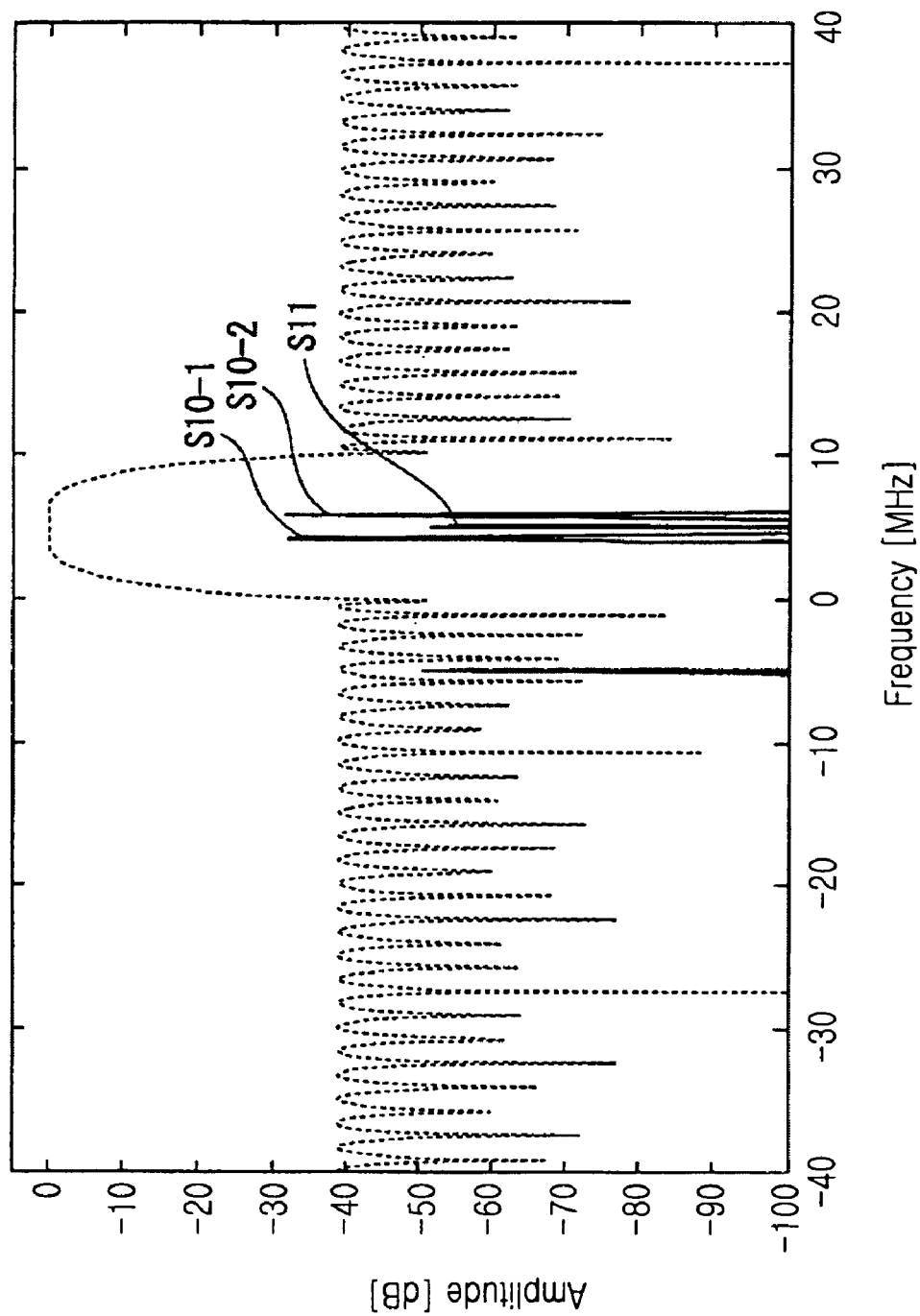
FIG. 10 illustrates an output spectrum and filter characteristics of the complex-coefficient transversal filter used in the IF stage of the downconverter of the low-IF scheme in accordance with the present invention.

FIG. 10 illustrates an output spectrum of the complex-coefficient transversal filter 1120. In FIG. 10, the dashed line represents frequency characteristics of the complex-coefficient transversal filter 1120 and has band pass characteristics based on 5 MHz. For a positive frequency component, a negative frequency component is rejected. The interference of a signal of the negative frequency band can be suppressed with respect to target signals (S10-1 and S10-2 of FIG. 10) and an image frequency signal (S11 of FIG. 10).

Figure 11:
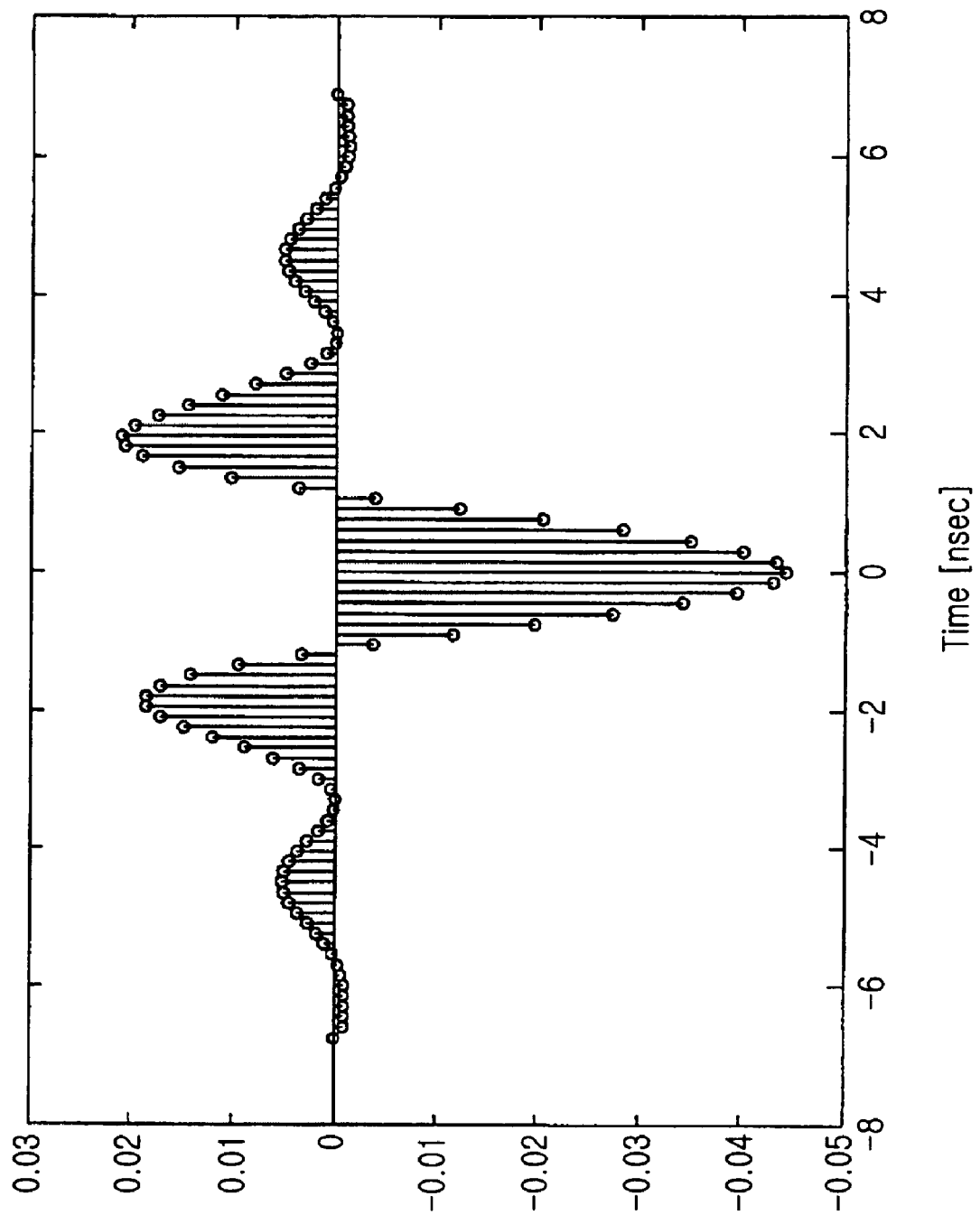
FIG. 11 illustrates an impulse response of a real part of the complex-coefficient transversal filter used in the IF stage of the downconverter of the low-IF scheme in accordance with the present invention.
Figure 12:
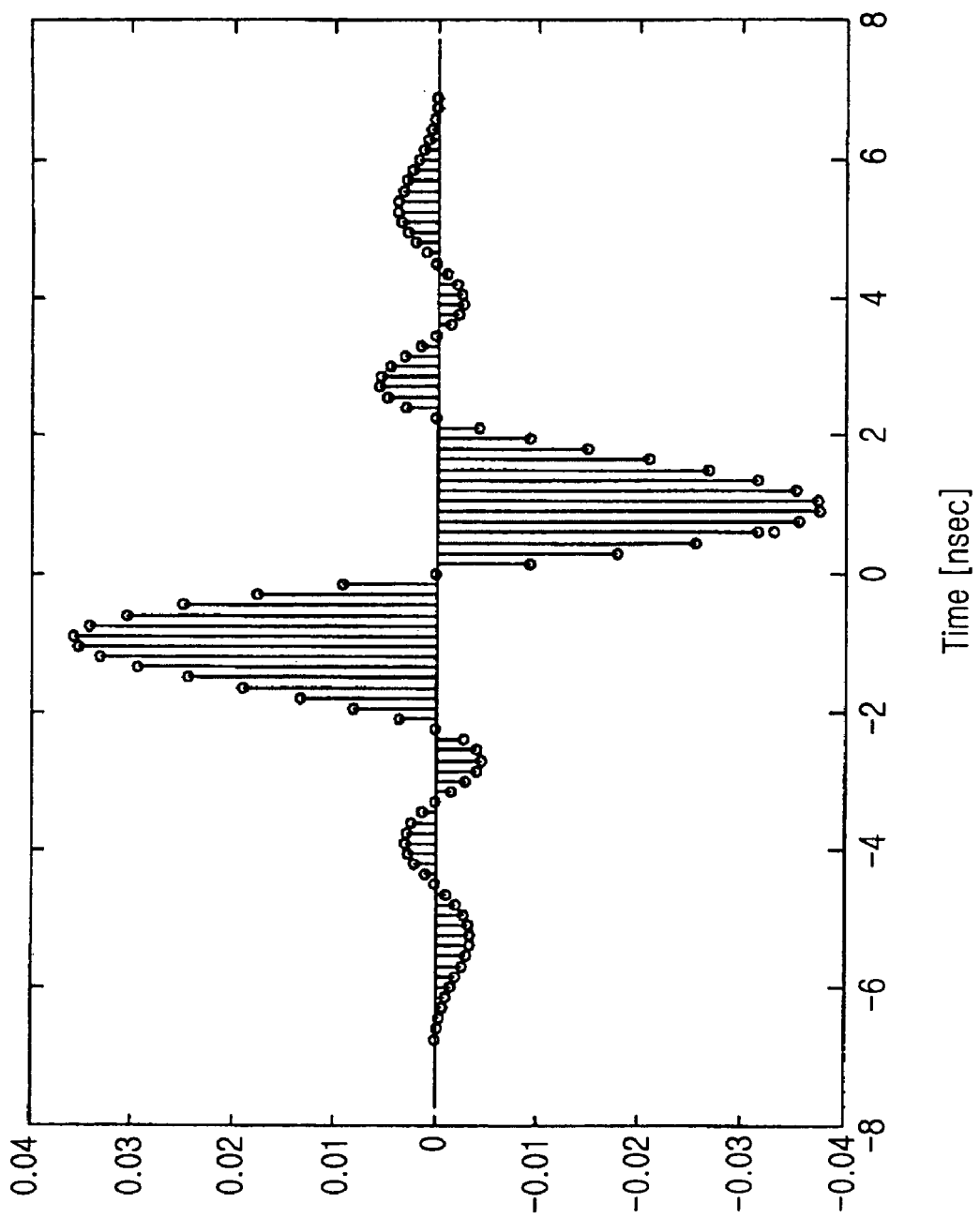
FIG. 12 illustrates an impulse response of an imaginary part of the complex-coefficient transversal filter used in the IF stage of the downconverter of the low-IF scheme in accordance with the present invention.

FIGS. 11 and 12 illustrate impulse responses of a real part and an imaginary part of the complex-coefficient transversal filter 1120 at a sampling frequency of 150 MHz. The complex-coefficient transversal filter 1120 is designed, for example, by the same frequency shift method as that of the complex-coefficient transversal filter 115. According to this design, the impulse response of the real part as illustrated in FIG. 11 becomes an even-symmetric impulse response and the impulse response of the imaginary part as illustrated in FIG. 12 becomes an odd-symmetric impulse response. In FIGS. 11 and 12, the vertical axis represents a normalized value.

G. Rejection of Image Frequency Signal Associated with IF Signal Using Complex-Coefficient SAW Filter Next, there will be described means for implementing a complex-coefficient filter for rejecting a negative frequency component of an IF signal using a complex-coefficient SAW filter.

Figure 13:
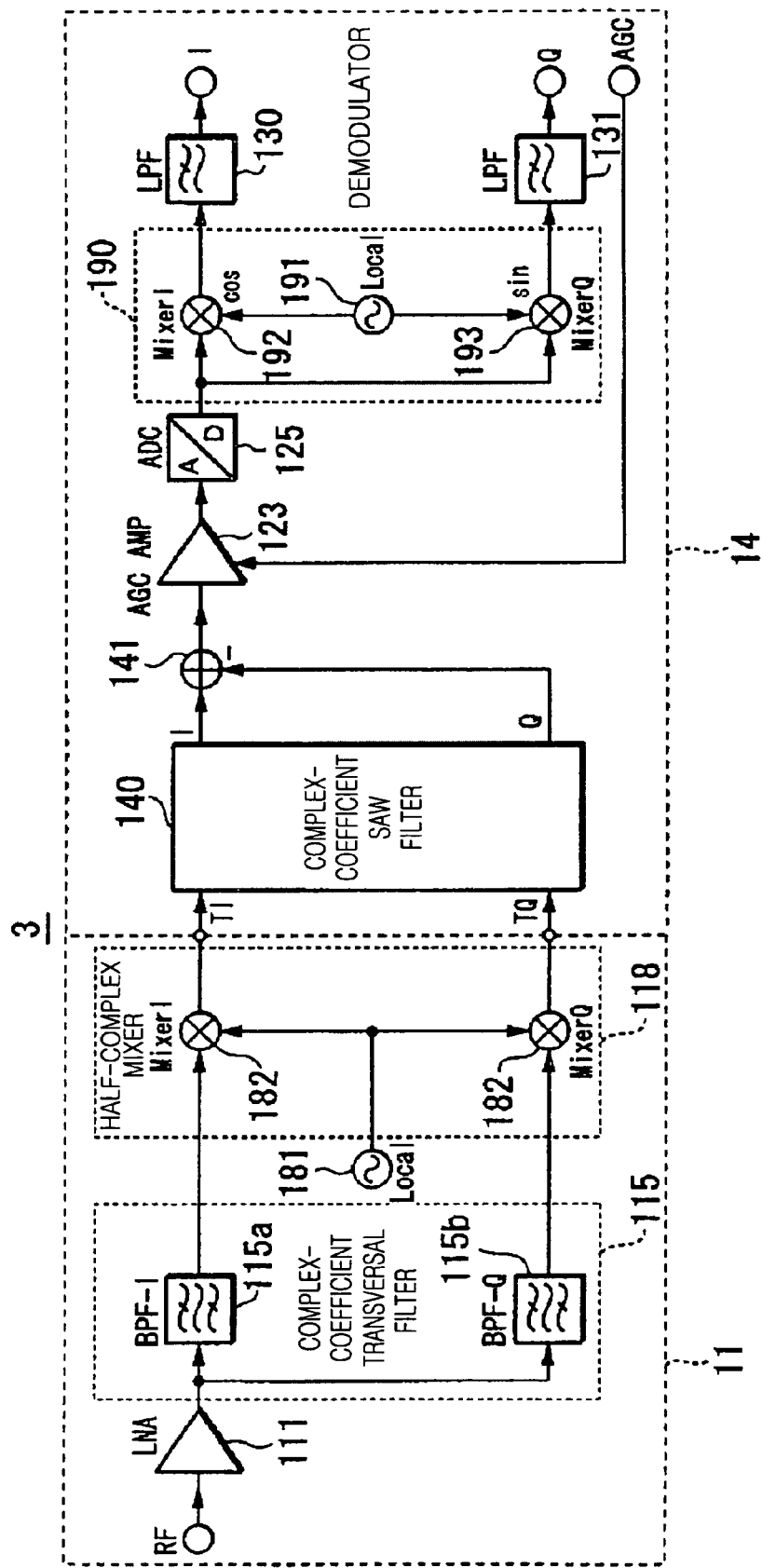
FIG. 13 illustrates a third basic structure of the downconverter of the low-IF scheme in accordance with the present invention.

FIG. 13 illustrates a third basic structure of the downconverter provided with the complex-coefficient SAW filter for rejecting a negative frequency component of an IF signal. The components with the same functions between the downconverter 3 of FIG. 13 and the downconverter 2 of FIG. 8 are denoted by the same reference numerals, and their description is omitted here.

The downconverter 3 of FIG. 13 has a different structure in that the complex-coefficient filter 120 in the downconverter 2 of FIG. 8 is replaced with a complex-coefficient SAW filter 140. Moreover, the downconverter 3 of FIG. 13 has a different structure in that a subtractor 141 is provided to subtract an imaginary output from a real output of the complex-coefficient SAW filter 140 and therefore the AGC amplifier 124 and the ADC 126 are removed. Moreover, the downconverter 3 of FIG. 13 has a different structure in that the full-complex mixer 129 is replaced with a half-complex mixer 190.

Figure 14:
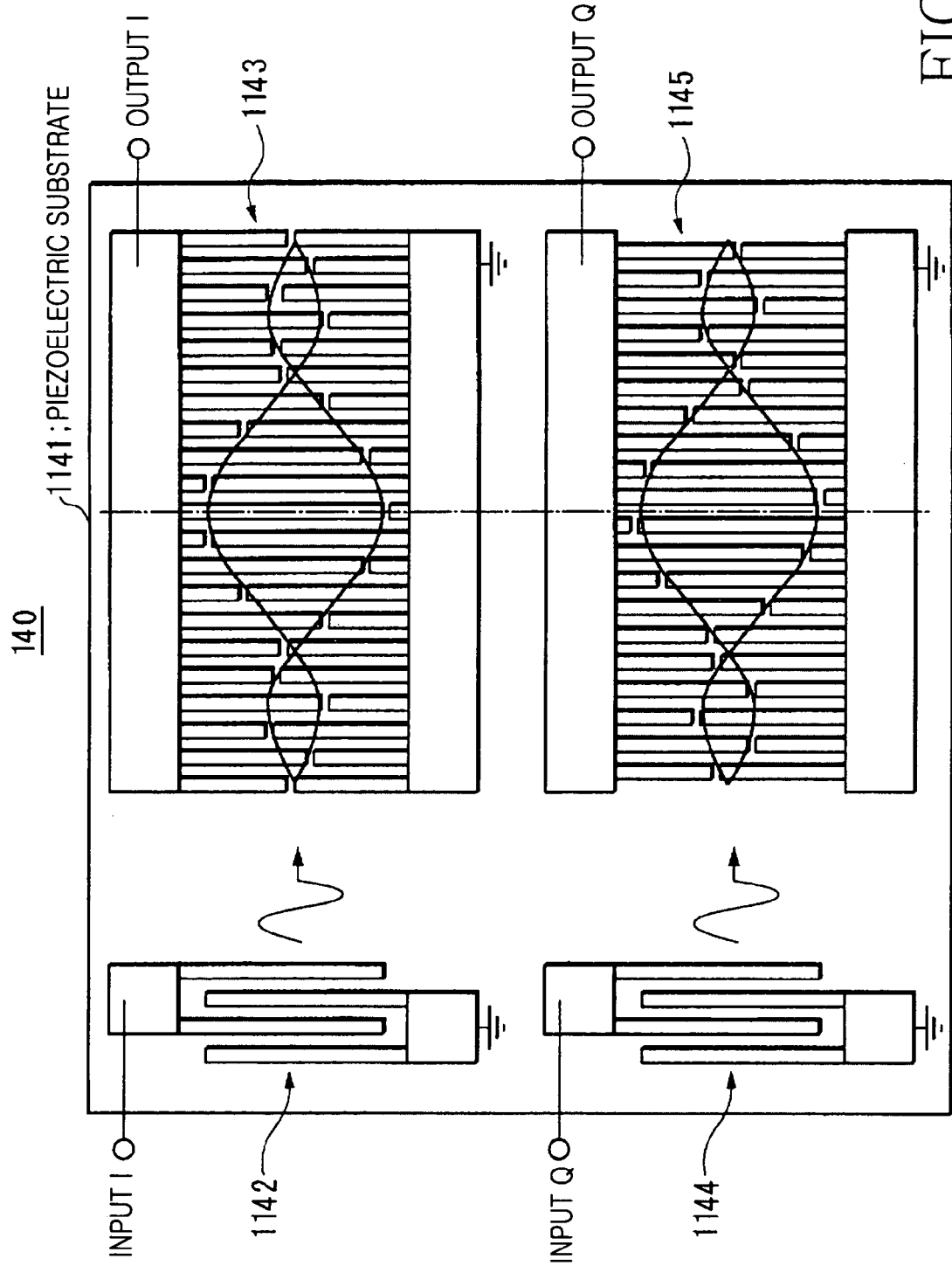
FIG. 14 illustrates a structure of a complex-coefficient SAW filter used in an IF stage of the downconverter of the low-IF scheme in accordance with the present invention.

The complex-coefficient SAW filter 140 has a structure as illustrated in FIG. 14. The complex-coefficient SAW filter 140 illustrated in FIG. 14 is provided with IDTs 1142 to 1145 on a piezoelectric substrate 1141. The IDT 1142 is connected to an input terminal I of a real part, and the IDT 1144 is connected to an input terminal Q of an imaginary part. The IDT 1143 is connected to an output terminal I of the real part, and the IDT 1145 is connected to an output terminal Q of the imaginary part. To perform a weighting operation mapped to an impulse response of the real part (i.e., an even-symmetric impulse response), the IDT 1143, connected to the output terminal I for outputting a real axis component, is provided with an electrode finger such that even symmetry is made with respect to the envelope center. To perform a weighting operation mapped to an impulse response of the imaginary part (i.e., an odd-symmetric impulse response), the IDT 1145, connected to the output terminal Q for outputting an imaginary axis component, is provided with an electrode finger such that odd symmetry is made with respect to the envelope center. According to this structure, a complex IF signal with a phase difference of 90 degrees between the real part and the imaginary part can be output.

Next, the operation of the SAW filter 140 will be described. First, when a real RF signal is input to the input terminals, SAWs are excited in the IDTs 1142 and 1144 and SAW signals are propagated. The SAW signals propagated from the IDTs 1142 and 1144 are received by the IDTs 1143 and 1145 provided in propagation directions of the SAW signals. A convolution integral is performed on the basis of impulse responses mapped to the SAW signals, such that they are converted to electric signals. In this case, the IDT 1143 outputs a real component of the RF signal through the output terminal I, and the IDT 1145 outputs an imaginary component of the RF signal through the output terminal Q.

When the complex-coefficient filter is implemented using the complex-coefficient SAW filter 140, for example, the IF becomes at least 40 MHz, such that the IF becomes high. A filter can be obtained which can reject a frequency out of the target signal frequency in a frequency side of a target signal at a high rejection ratio while also rejecting a negative frequency.

A weighting operation is performed for the IDTs 1143 and 1145 of an output side in the complex-coefficient SAW filter 140. A weighting operation may be performed for an input side in a structure in which the input side is connected to the IDTs 1143 and 1145 and the output side is connected to the IDTs 1142 and 1144, and the same effect can be obtained.

An output stage of the complex-coefficient SAW filter 140 of FIG. 13 is provided with a subtractor 141. According to this structure, any one of the real and imaginary parts can be extracted and output. Because only one AGC amplifier 123 and one ADC 125 are required, power consumption reduction and miniaturization are possible.

The structure of FIG. 13 inverts an output of the imaginary part of the complex-coefficient SAW filter 140. The subtractor 141 does not subtract the imaginary part from the real part, but adds the imaginary part to the real part. Characteristics of the complex-coefficient SAW filter 140 are complex conjugates. The complex-coefficient SAW filter 140 can obtain band pass characteristics in which a positive frequency signal is rejected and a negative frequency is in a pass band.

A structure for suppressing a negative frequency band in the complex-coefficient filter used in the downconverter of the low-IF scheme has been described. Alternatively, the complex-coefficient filter may have a structure for suppressing a positive frequency band and performing a process on the basis of a signal of an extracted negative frequency component.

H. Principle of Upconverter of Low-IF Scheme

Figure 23:
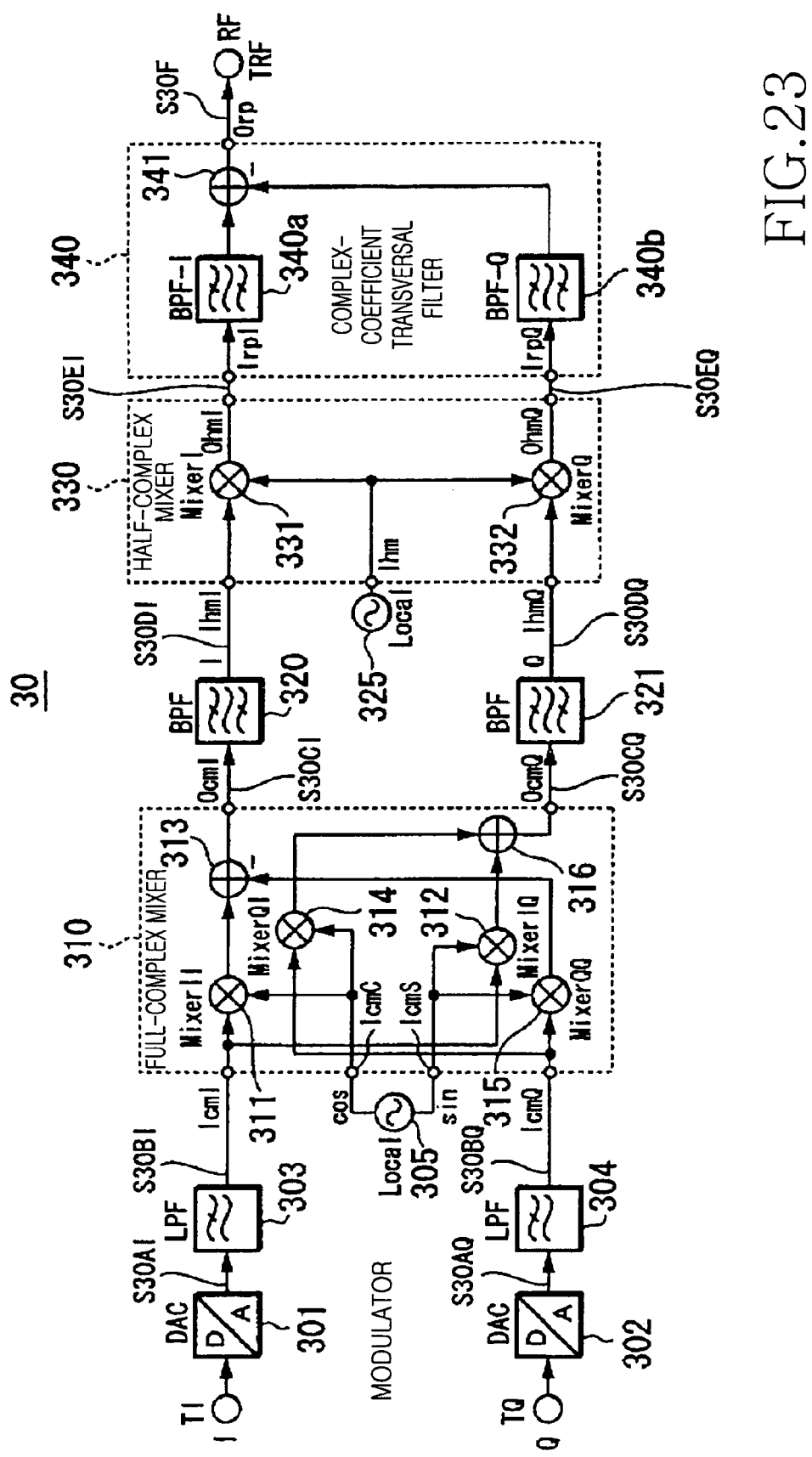
FIG. 23 illustrates a basic structure of an upconverter of the low-IF scheme in accordance with the present invention.

Next, the principle for rejecting an image frequency signal in an upconverter of the low-IF scheme in the present invention will be described with reference to an example of a basic structure of the upconverter based on the low-IF scheme in the present invention. FIG. 23 illustrates an upconverter 30 serving as an example of a first structure of the upconverter of the low-IF scheme in the present invention. For example, the upconverter 30 is a radio transmitter. The upconverter 30 converts digital signals received from input terminals TI and TQ with real and imaginary parts to analog baseband signals, frequency-converts the analog baseband signals to an IF, and generates a complex IF signal. Moreover, the upconverter 30 frequency-converts the generated complex IF signal to an RF signal frequency, extracts only a real part of the complex RF signal, and outputs the real RF signal to an output terminal TRF connected to an antenna or so on.

In the upconverter 30, Digital-to-Analog Converters (DACs) 301 and 302 convert digital signals input from TI and TQ to analog baseband signals. Low Pass Filters (LPFs) 303 and 304 remove high frequency components of a complex signal S30AI and S30AQ output from the DACs 301 and 302 and then output a complex signal S30BI and S30BQ.

A full-complex mixer 310 is used for frequency conversion to an IF signal, and is configured by a mixer-II 311, a mixer-IQ 312, a mixer-QI 314, and a mixer-QQ 315 serving as multipliers, a subtractor 313, and an adder 316. The full-complex mixer 310 receives a real axis local cos signal from a local oscillator 305 through an input terminal IcmC and receives an imaginary axis local sin signal from the local oscillator 305 through an input terminal IcmS. The full-complex mixer 310 frequency-converts a complex signal S30B input from the input terminals IcmI and IcmQ to an IF signal, and then outputs a complex signal S30C from output terminals OcmI and OcmQ.

Here, an IF of the upconverter of the low-IF scheme is a frequency of a local signal output from the local oscillator 305. The frequency of an associated local signal has a frequency value when a frequency value corresponding to a difference between the center frequency of an RF signal and the frequency of the associated local signal is out of a channel frequency band of the RF signal.

BPFs 320 and 321 band-limit a real axis component S30CI and an imaginary axis component S30CQ of the complex signal S30C to a frequency band of a predetermined range based on the IF, and output a complex signal S30D corresponding to a target signal component.

A half-complex mixer 330 is configured by a mixer-I 331 and a mixer-Q 332 serving as multipliers. A local oscillator 325 inputs a real local signal that is a complex IF signal frequency less or more than a target RF signal frequency in a real signal of sin or cos to an input terminal Ihm of the half-complex mixer 330. When an RF signal frequency is $\omega_{RF}$ and an IF signal frequency is $\omega_{IF}$, a local signal frequency is $\omega_{LO}=\omega_{RF}\pm\omega_{IF}$. The half-complex mixer 330 multiplies a complex signal S30D input from input terminals IhmI and IhmQ and the real local signal and then outputs a complex signal S30E. The complex signal S30E has the RF signal frequency.

Here, a center frequency of the complex IF signal S30D input to the half-complex mixer 330 is the above-described IF. A frequency value obtained by adding the IF to the center frequency of the RF signal is a frequency value (corresponding to a predetermined frequency of an upconverter mentioned in the claims) out of an RF signal frequency band.

A complex-coefficient transversal filter 340 is used to reject a negative frequency component and is configured by a BPF-I 340a, a BPF-Q 340b, and a subtractor 341.

Next, the overall operation of the above-described upconverter 30 will be described. The DAC 301 converts a real component of digital signals input from the input terminals TI and TQ to an analog signal S30AI. The DAC 302 converts an imaginary component of the digital signals input from the input terminals TI and TQ to an analog signal S30AQ. As a result, a complex signal S30A is generated. The LPFs 303 and 304 remove a high frequency component from the complex signal S30A and then output a complex signal S30B.

The full-complex mixer 310 frequency-converts a real axis component S30BI and an imaginary axis component S30BQ of the complex signal S30B to an IF according to a real axis local signal cos and an imaginary axis signal sin of a complex local signal output from the local oscillator 305. The full-complex mixer 310 outputs a complex signal S30C to the BPFs 320 and 321. The BPFs 320 and 321 band-limit the complex signal S30C to a frequency band of a predetermined range based on the IF, and output a complex signal S30D to the half-complex mixer 330.

The half-complex mixer 330 frequency-converts the complex signal S30D on the basis of a real local signal cos or sin input from the local oscillator 325, and then outputs a complex signal S30E with an RF signal frequency to the complex-coefficient transversal filter 340.

The complex-coefficient transversal filter 340 rejects an image frequency signal of a real axis component S30EI of the complex signal S30E input from the BPF-I 340a through an input terminal IrpI of the real axis component, and rejects an image frequency signal of an imaginary axis component S30EQ of the complex signal S30E input from the BPF-Q 340b through an input terminal IrpQ of the imaginary axis component. A phase difference of 90 degrees is present between the real component output from the BPF-I 340a and the imaginary component output from the BPF-Q 340b. The subtractor 341 subtracts the imaginary component from the real component, extracts a real RF signal, and outputs the extracted signal to TRF.

I. Operation of Half-Complex Mixer in Upconverter of Low-IF Scheme

Next, a detailed operation of the half-complex mixer 330 of the upconverter 30 will be described. First, it is assumed that an RF signal is $s_{rf}(t)$, a complex IF signal S30D input to the half-complex mixer 330 is an ideal complex signal expressed by $s_{ifi}(t)+js_{ifq}(t)$, and a real local signal input from the local oscillator 352 is $L_o(t)$. In this case, $s_{rf}(t)$ is expressed by Equation (28).

$$s_{rf}(t) = (s_{ifi}(t)+js_{ifq}(t))L_o(t) \qquad \text{Equation (28)}$$

Here, $s_{rf}(t)$ can be rewritten as shown in Equation (29) because a local signal corresponding to a real signal is a combination of complex signals $L_{oi}(t)$ and $L_{oq}(t)$ corresponding to complex conjugates.

$$\begin{aligned} s_{rf}(t) &= (s_{ifi}(t) + js_{ifq}(t)) \\ & \quad \frac{((L_{oi}(t) + jL_{oq}(t)) + (L_{oi}(t) - jL_{oq}(t)))}{2} \\ &= \frac{1}{2}(s_{ifi}(t) + js_{ifq}(t))(L_{oi}(t) + jL_{oq}(t)) + \\ & \quad \frac{1}{2}(s_{ifi}(t) + js_{ifq}(t))(L_{oi}(t) - jL_{oq}(t)) \end{aligned} \qquad \text{Equation (29)}$$

As shown in Equation (29), a target frequency conversion process is performed according to a positive signal component of the local signal and a reverse frequency conversion process is performed according to a negative signal component of the local signal.

When only a real part of the complex signal $s_{rf}(t)$ is extracted, Equation (30) is produced.

$$\begin{aligned} s'_{rf}(t) &= \text{Re}\Big( \frac{1}{2}(s_{ifi}(t) + js_{ifq}(t))(L_{oi}(t) + jL_{oq}(t)) + \\ & \quad \frac{1}{2}(s_{ifi}(t) + js_{ifq}(t))(L_{oi}(t) - jL_{oq}(t)) \Big) \\ &= \frac{1}{2}(s_{ifi}(t)L_{oi}(t) - s_{ifq}(t)L_{oq}(t)) + \\ & \quad \frac{1}{2}(s_{ifi}(t)L_{oi}(t) + s_{ifq}(t)L_{oq}(t)) \end{aligned} \qquad \text{Equation (30)}$$

As shown in Equation (30), the first term indicates a signal for which a frequency conversion process is performed in a plus direction according to a positive component of the local signal, and the second term indicates a complex conjugate signal of a signal for which a frequency conversion process is performed in a minus direction according to a negative component of the local signal.

Because the second term is the image frequency signal, the complex-coefficient transversal filter 340 rejects the image frequency signal in a state of a complex signal before a real part is extracted.

J. Complex-Coefficient Transversal Filter in Upconverter of Low-IF Scheme

Next, a design method and detailed operation of the complex-coefficient transversal filter 340 in the upconverter 30 will be described.

The complex-coefficient transversal filter 340 is configured by a BPF-I 340a for processing a real axis signal, a BPF-Q 340b for processing an imaginary axis signal, and a subtractor 341 for subtracting the imaginary axis signal from a real axis signal to output a real signal. The BPF-I 340a performs a convolution integral with an even-symmetric impulse and the BPF-Q 340b performs a convolution integral with an odd-symmetric impulse. The complex-coefficient transversal filter 340 outputs signals of the two band pass filters with a phase difference of 90 degrees.

The complex-coefficient transversal filter 340 is designed, for example, using a frequency shift method. That is, a real-coefficient LPF of a predetermined pass bandwidth Bw/2 and a stop-band attenuation amount ATT is designed and a coefficient of the real-coefficient LPF is multiplied by $e^{j\omega x}$, such that a filter of a center frequency ω, a pass bandwidth Bw, and the stop-band attenuation amount ATT can be obtained. Here, the complex-coefficient transversal filter 340 is designed in which a center frequency ω=800 MHz, a stop-band attenuation amount ATT=39 dB, and a sampling frequency=2.4 GHz.

Figure 26:
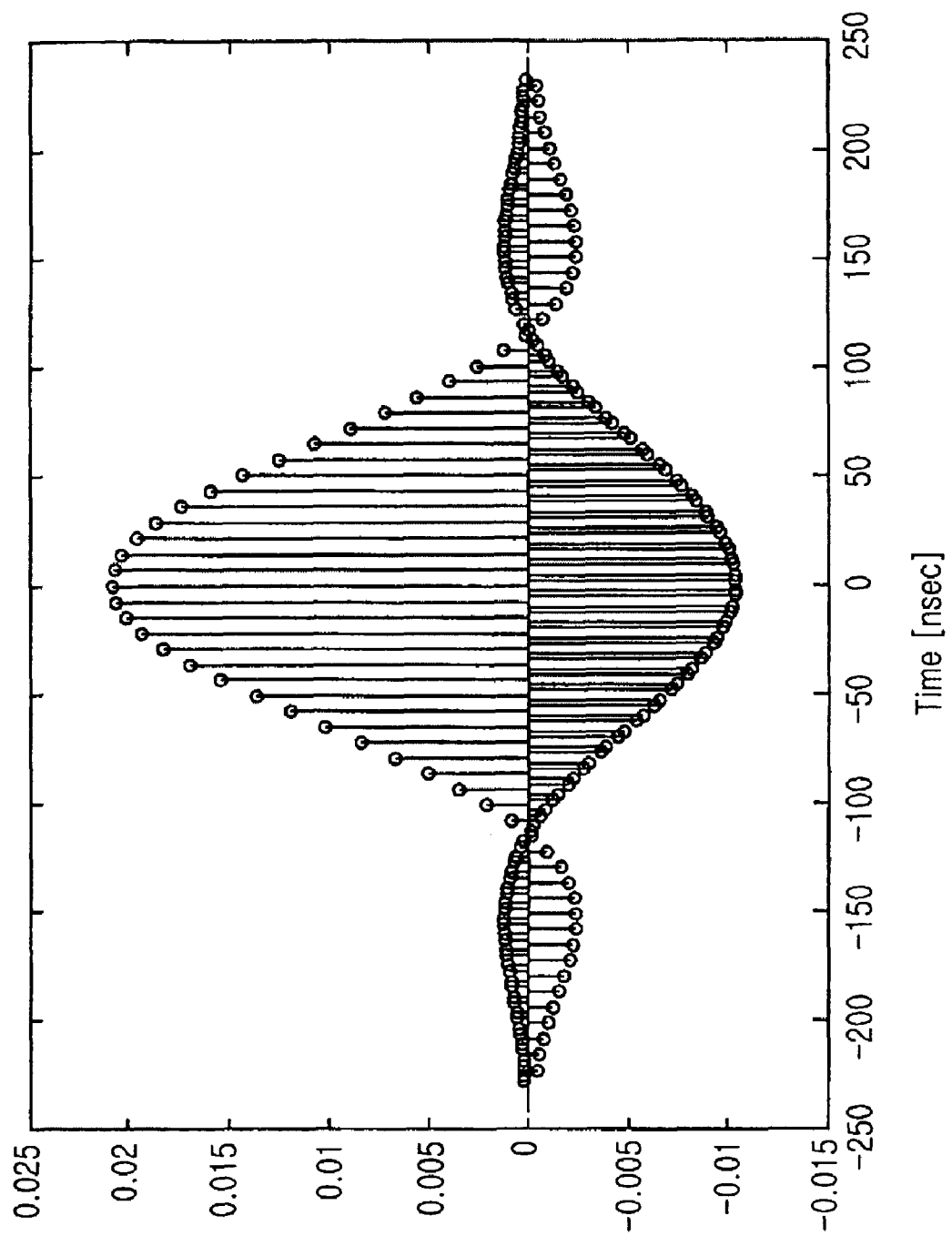
FIG. 26 illustrates an impulse response of a real part of the complex-coefficient transversal filter used in the upconverter of the low-IF scheme in accordance with the present invention.
Figure 27:
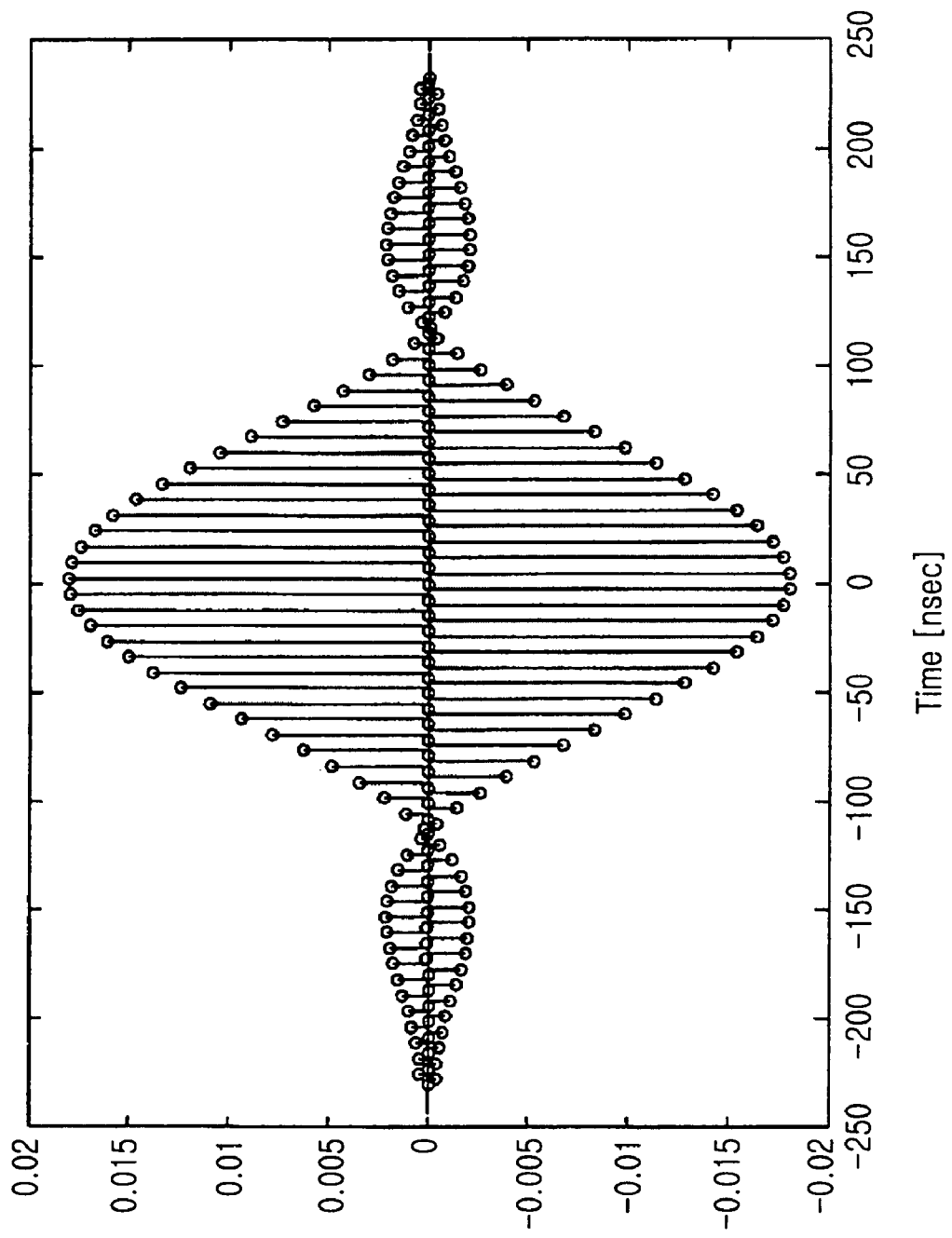
FIG. 27 illustrates an impulse response of an imaginary part of the complex-coefficient transversal filter used in the upconverter of the low-IF scheme in accordance with the present invention.

FIG. 26 illustrates an impulse response of a real part of the complex-coefficient transversal filter 340. The impulse response of the real part is an even-symmetric impulse response. FIG. 27 illustrates an impulse response of an imaginary part of the complex-coefficient transversal filter 340. The impulse response of the imaginary part is an odd-symmetric impulse response. In FIGS. 26 and 27, the vertical axis represents a normalized value.

Next, the operation of the complex-coefficient transversal filter 340 will be described. As described above, the complex-coefficient transversal filter 340 rejects image frequency interference of a complex signal input from the input terminal IrpI of the real axis component and the input terminal IrpQ and then extracts an RF signal of only the real component.

Figure 33:
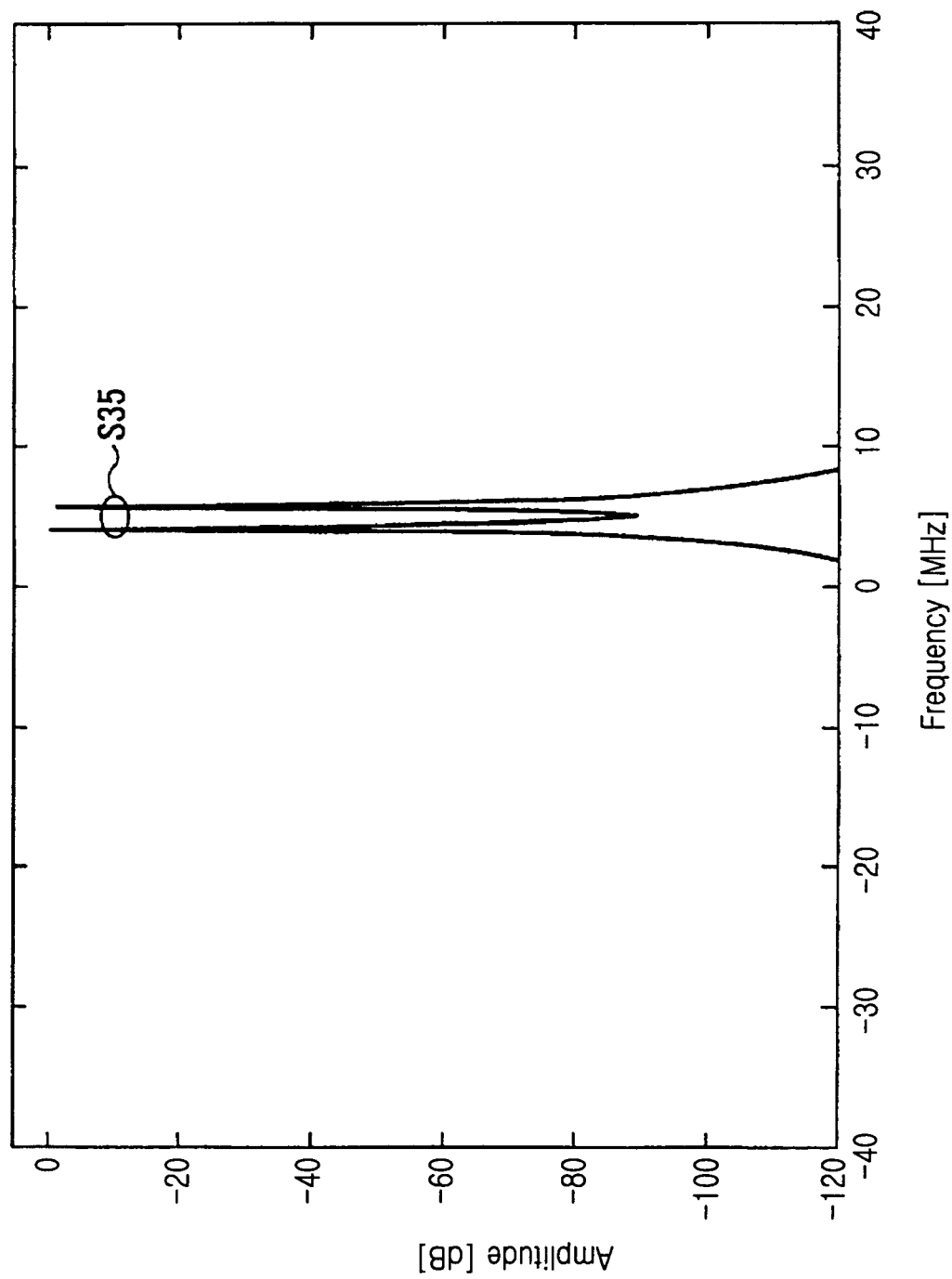
FIG. 33 illustrates spectra of complex IF signals input to the conventional upconverter and the inventive upconverter of the low-IF scheme.

Here, it is assumed that the complex IF signal of FIG. 33 is input to the half-complex mixer 330 of the upconverter 30 for explanation of the operation of the complex-coefficient transversal filter 340. The complex IF signal with the spectrum of FIG. 33 is a signal (S35) obtained by performing a frequency conversion based on the center frequency of 5 MHz for a DSB signal of a carrier interval 1.6 MHz of a complex baseband in the full-complex mixer 310.

Figure 24:
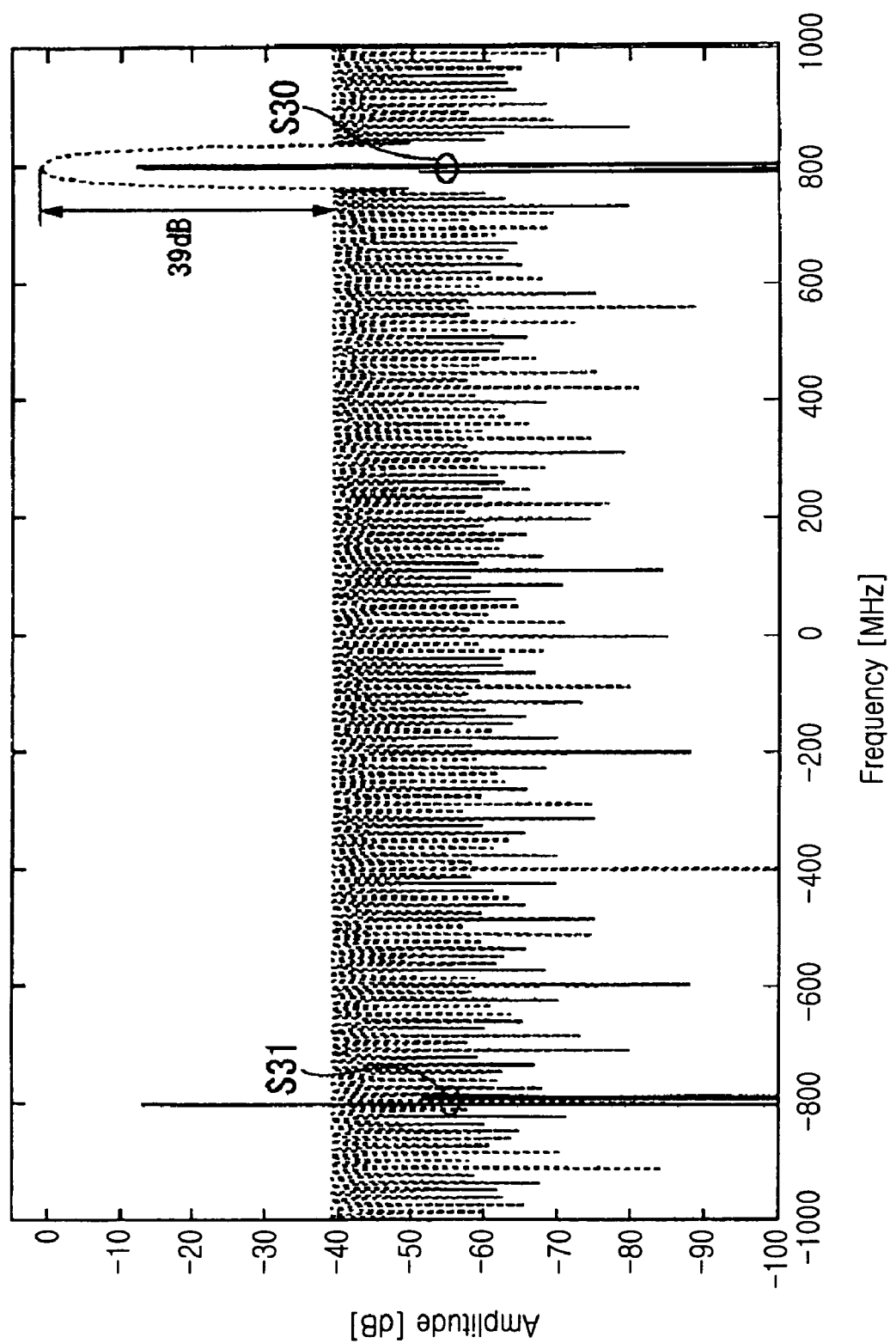
FIG. 24 illustrates an output spectrum of a half-complex mixer and frequency characteristics of a complex-coefficient transversal filter in the upconverter of the low-IF scheme in accordance with the present invention.

The full-complex mixer 330 multiplies the input complex IF signal (S35 of FIG. 33) and a frequency signal of 795 MHz close to an RF signal frequency input from the local oscillator 325, and performs up-conversion to an RF signal frequency of 800 MHz corresponding to a target frequency. FIG. 24 illustrates the up-converted RF frequency signal (S30); For a complex conjugate signal of a real local signal, a complex IF signal of 5 MHz is multiplied by a signal of −795 MHz. An image frequency signal (S31 of FIG. 24) having the same level as that of an RF signal at a frequency of 800 MHz is output at a frequency of −790 MHz.

Figure 25:
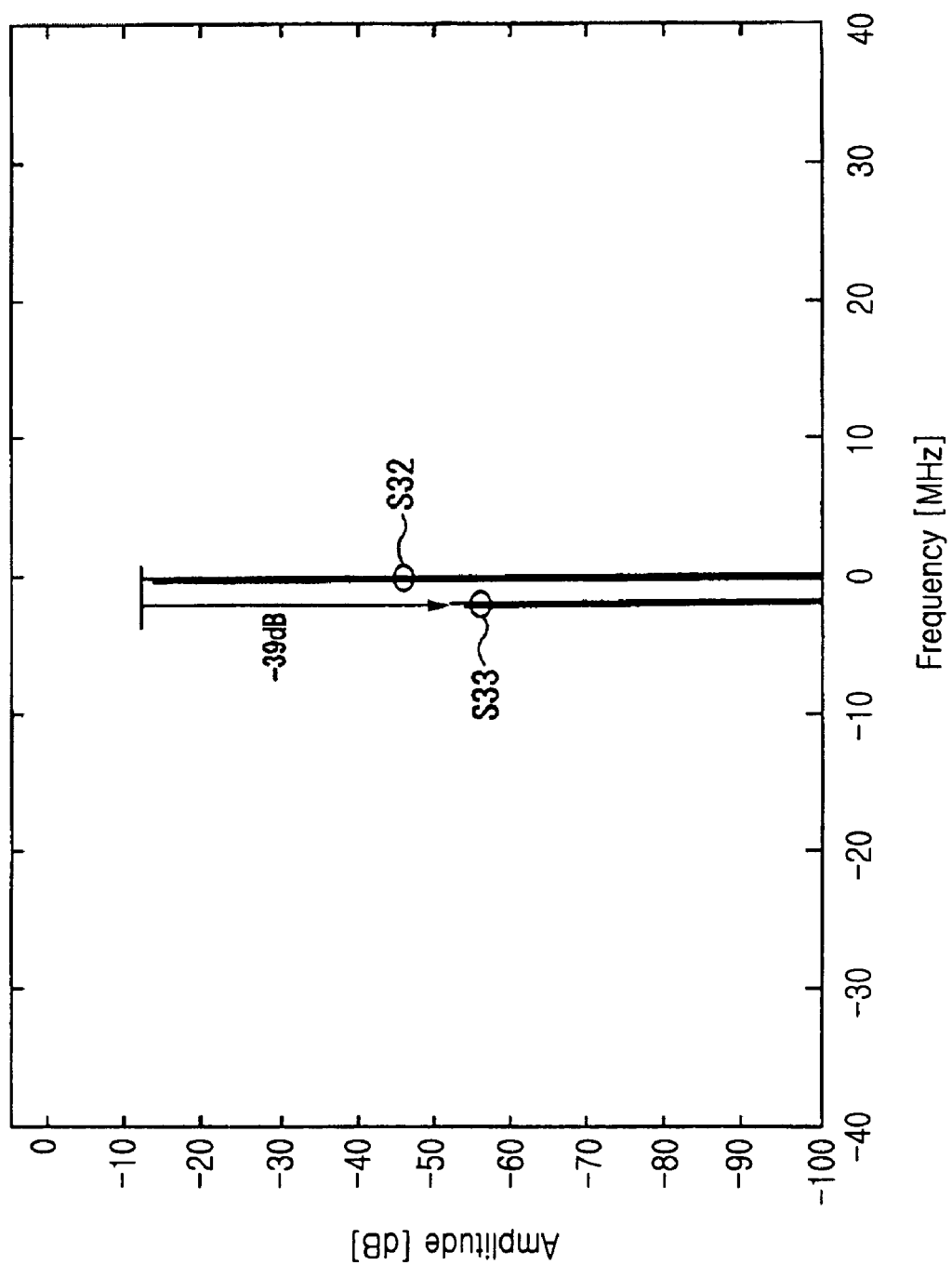
FIG. 25 illustrates an output spectrum of the complex-coefficient transversal filter in the upconverter of the low-IF scheme in accordance with the present invention.

The dashed line illustrated in FIG. 24 denotes frequency characteristics of the complex-coefficient transversal filter 340. An image frequency signal output from the half-complex mixer 330 is a signal in which 39 dB is rejected with respect to the RF signal. FIG. 25 illustrates a real signal finally output from the complex-coefficient transversal filter 340. An RF signal (S32 of FIG. 25) in which an image frequency signal of −39 dBc (S33 of FIG. 25) is rejected can be obtained.

Figure 34:
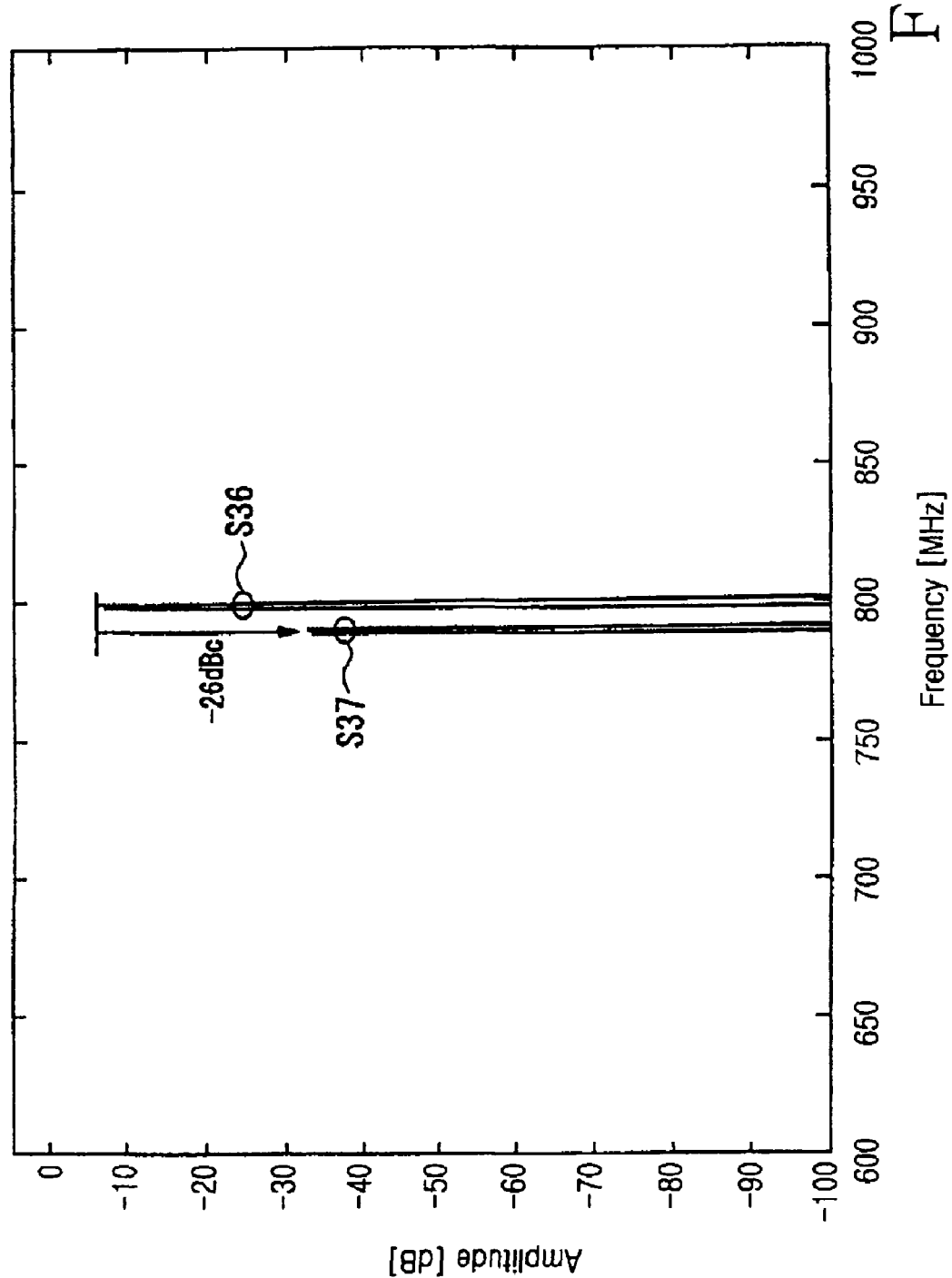
FIG. 34 illustrates an output spectrum of a half-complex mixer in the conventional upconverter of the low-IF scheme.

In the above-described prior art upconverter 35, only an image frequency signal (S37 of FIG. 34) of −26 dBc at an image frequency (790 MHz) is rejected with respect to a target signal (800 MHz: S36). The upconverter 30 of the present invention can reduce interference due to an image frequency signal.

The upconverter of the low-IF scheme of the present invention may use a switched capacitor circuit, a charge-coupled device, or a SAW filter described with reference to the downconverter of the low-IF scheme as means for implementing the complex-coefficient transversal filter 340. Specifically, the SAW filter is suitable to implement the transversal filter with a high frequency.

A structure for suppressing a negative frequency band in the complex-coefficient filter used in the upconverter of the low-IF scheme has been described. Alternatively, the complex-coefficient filter may have a structure for suppressing a positive frequency band and performing a process on the basis of a signal of an extracted negative frequency component.

K. Principle of Downconverter of Zero-IF Scheme

Figure 35:
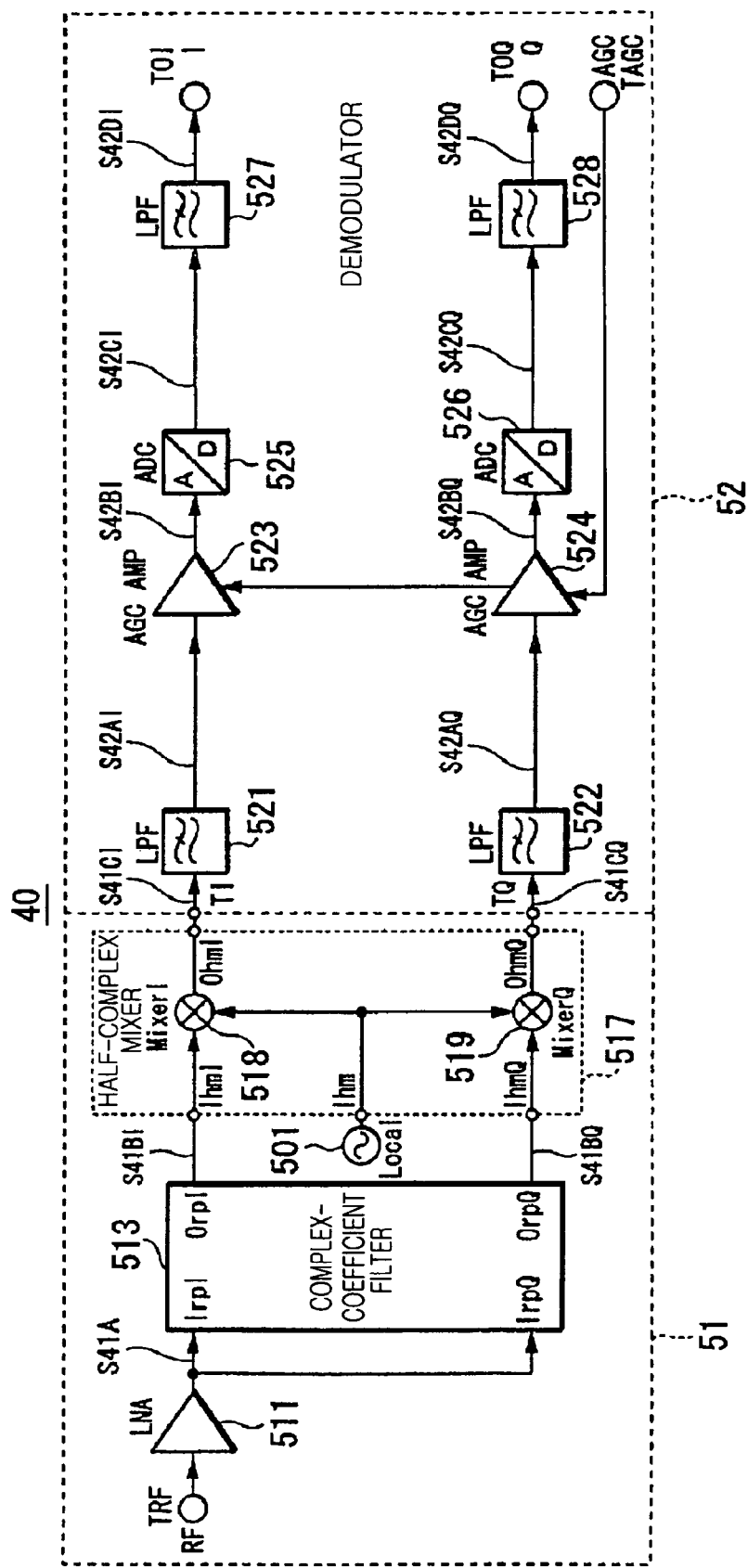
FIG. 35 illustrates a basic structure of a downconverter of a zero-IF scheme in accordance with the present invention.

Next, the principle of a downconverter of a zero-IF scheme in the present invention will be described with reference to an example of a basic structure of the downconverter based on the zero-IF scheme in the present invention. FIG. 35 illustrates a downconverter 40 serving as an example of a first structure of the upconverter of the zero-IF scheme in the present invention. For example, the downconverter 40 may be a radio receiver. The downconverter 40 converts an RF signal input from an input terminal TRF connected to an antenna to generate a complex RF signal, extracts a complex baseband signal from an associated complex RF signal according to a real local signal at the same frequency as an RF signal frequency output from a local oscillator, and outputs the complex baseband signal to a demodulator. In FIG. 35, the structure of the downconverter 40 is divided into an IF generator 51 and a baseband generator 52 such that it can be compared with a downconverter of a quasi-zero-IF scheme to be described below.

In the downconverter 40, a complex-coefficient filter 513 uses, for example, a complex-coefficient transversal filter.

The complex-coefficient filter 513 rejects a negative frequency component of signals input from input terminals IrpI and IrpQ and outputs complex signal components with a phase difference of 90 degrees from output terminals OrpI and OrpQ.

A half-complex mixer 517 is used to frequency-convert an RF signal to a complex baseband signal, and is configured by a mixer-I 518 and a mixer-Q 519, serving as multipliers. A local oscillator 501 inputs a real local signal of the same frequency as that of the RF signal in a real signal of cos or sin to an input terminal Ihm of the half-complex mixer 517. The half-complex mixer 517 multiplies the real local signal and a complex RF signal S41B input from input terminals IhmI and IhmQ, performs frequency conversion to a complex baseband signal whose center frequency is frequency zero, and outputs a complex signal S41C.

LPFs 521 and 522 band-limit a real axis component S41CI and an imaginary axis component S41Q of the input complex baseband signal S41C to a frequency band of a predetermined range based on frequency zero, and output a complex baseband signal S42A serving as a target signal.

AGC amplifiers 523 and 524 control a gain according to a voltage applied to an input terminal TAGC. ADCs 525 and 526 convert the analog complex-baseband signal to a digital signal.

Next, the overall operation of the downconverter 40 of the zero-IF scheme will be described. An LNA 511 amplifies an RF signal of a real signal input from an antenna to the input terminal TRF and then outputs a real signal S41A. The complex-coefficient filter 513, to which an associated signal is input, rejects an image frequency signal for the real signal S11A input from the input terminals IrpI and IrpQ. The complex-coefficient filter 513 outputs a real axis component S41BI and an imaginary axis component S41BQ of the complex signal S41B with a phase difference of 90 degrees from output terminals OrpI and OrpQ to the half-complex mixer 517. The half-complex mixer 517 frequency-converts the complex signal S41B on the basis of a real local signal of cos or sin input from the local oscillator 501, and then outputs a generated complex baseband signal S41C to the LPFs 512 and 522.

The LPFs 521 and 522 band-limit the complex baseband signal S41C to a predetermined range based on frequency zero, and output a complex baseband signal S42A to the AGC amplifiers 523 and 524. The AGC amplifiers 523 and 524 adjust amplitudes of a real axis component S42AI and an imaginary axis component S42AQ of the complex baseband signal S42A to levels suitable for inputs to the ADCs 525 and 526. The AGC amplifiers 523 and 524 output a complex signal S42B to the ADCs 525 and 526. The ADCs 525 and 526 convert an input signal to a digital signal and then output a complex baseband signal S42C to LPFs 527 and 528.

The LPFs 527 and 528 remove a high frequency component of a real axis component S42CI and an imaginary axis component S42CQ of the complex baseband signal S42C, and output a real axis component I and an imaginary axis component Q of the complex baseband signal to output terminals TOI and TOQ, respectively.

Figure 36:
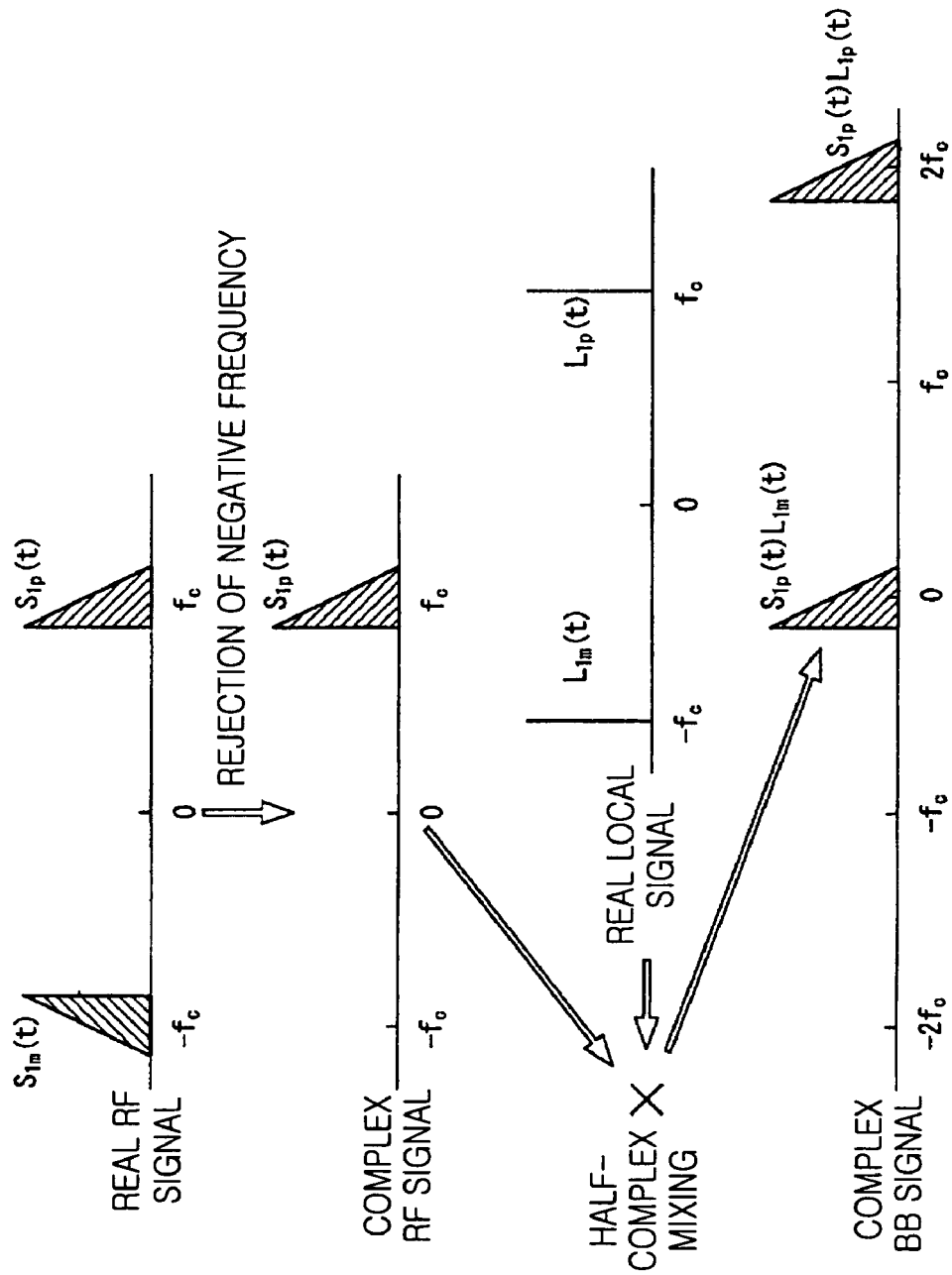
FIG. 36 illustrates a mixing process of the downconverter of the zero-IF scheme in accordance with the present invention.

FIG. 36 illustrates a mixing process in the downconverter 40 illustrated in FIG. 35. The complex-coefficient filter 513 rejects a negative frequency component of a real RF signal $s_{rf}(t)$ and then outputs a complex RF signal $S_{lp}(t)$. The half-complex mixer 517 multiplies (or half-complex mixes) the complex RF signal and a real local signal $L_l(t)$ with the same frequency as a frequency $f_c$ of an RF signal output from the local oscillator 501, performs the frequency conversion of the RF signal frequency $f_c$, and outputs a complex baseband signal ($S_{lp}(t)L_{lm}(t)+S_{lp}(t)L_{lp}(t)$). According to an associated process, the complex-coefficient filter 513 rejects a negative frequency of a real RF signal before frequency conversion, such that interference of a negative frequency component of the real RF signal can be removed.

A real RF signal, a complex local signal, a complex RF signal, and a complex baseband signal in a process as illustrated in FIG. 35 are expressed by Equations (31), (32), (33), and (34), respectively.

$$s_{rf}(t) = \frac{s_{li}(t) + js_{lq}(t)}{2} + \frac{s_{li}(t) - js_{lq}(t)}{2} \qquad \text{Equation (31)}$$
$$= s_{lp}(t) + s_{lm}(t)$$

$$L_l(t) = L_{lp}(t) + L_{lm}(t) \qquad \text{Equation (32)}$$

$$s'_{rf}(t) = s_{lp}(t) \qquad \text{Equation (33)}$$

$$s_{bb}(t) = s_{lp}(t)L_{lm}(t) + s_{lp}(t)L_{lp}(t) \qquad \text{Equation (34)}$$

L. Principle of Downconverter of Quasi-Zero-IF Scheme

Next, the principle for employing a mixer of a real local signal input of a zero-IF scheme in a downconverter of a quasi-zero-IF scheme will be described. The quasi-zero-IF scheme can be employed for a digital tuner, digital receiver, software radio device, and similar devices.

As described above, the integrity of an analog circuit for frequency-converting an RF signal is required to implement the zero-IF scheme. To provide the integrity, a Phase Locked Loop (PLL) circuit is required which can perform tuning in a fine frequency step. When a fast reply as well as the tuning in the fine frequency step is required, an expensive fractional-N PLL circuit is necessary. Accordingly, an associated fractional-N PLL circuit is applied in a conventional radio receiver.

However, the use of the expensive fractional-N PLL circuit is not cost-effective because the tuning in the fine frequency step is possible in the digital tuner, digital receiver, software radio device, and similar devices. The use of a circuit such as an associated fractional-N PLL circuit is not efficient in terms of size constraints. The digital tuner, digital receiver, software radio device, and similar devices require a simple and compact structure.

That is, the quasi-zero-IF scheme uses an integer-N PLL circuit capable of satisfying cost and size-related requirements, rather than the fractional-N PLL circuit in an analog circuit used in the zero-IF scheme. When the integer-N PLL circuit is used, an IF signal (or quasi-baseband signal) in which an offset is present with respect to frequency zero is output, but the quasi-zero-IF scheme can remove the offset from the IF signal in a digital processor and can obtain a baseband signal in which target frequency zero becomes the center frequency.

A difference between the low-IF scheme and the quasi-zero-IF scheme is as follows. The quasi-zero-IF scheme aims to perform conversion to frequency zero through frequency conversion based on a coarse frequency step in an analog circuit and frequency conversion based on a fine frequency step in a digital circuit. In the quasi-zero-IF scheme, an IF has a frequency value in a channel signal band of an RF signal. However in the low-IF scheme, an IF has a frequency value out of a channel signal band, such that the channel signal band does not overlap with an image frequency band.

Figure 37:
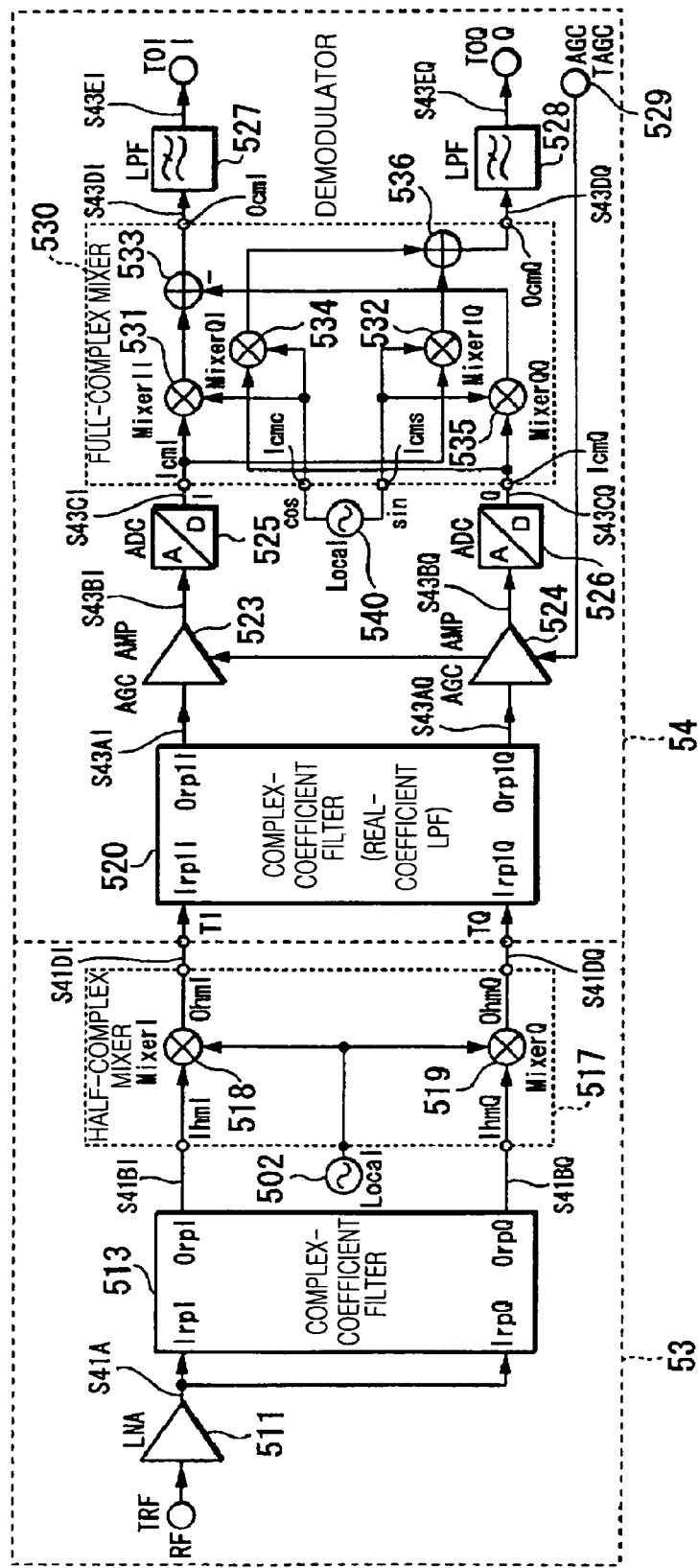
FIG. 37 illustrates a basic structure of a downconverter of a quasi-zero-IF scheme in accordance with the present invention.

FIG. 37 illustrates a downconverter 41 corresponding to an example of a basic structure of the downconverter based on the quasi-zero-IF scheme in the present invention. For example, the downconverter 41 is a radio receiver. The downconverter 41 includes an IF generator 53 for performing frequency conversion based on coarse precision for an RF signal and generates an IF signal, and a baseband generator 54 for extracting a baseband signal according to frequency conversion based on fine precision. For example, the IF generator 53 converts an RF signal, input from an input terminal TRF connected to an antenna, to a complex RF signal. Moreover, the IF generator 53 frequency-converts an associated complex signal according to a real local signal of a frequency separated by a frequency value of an RF signal band in a frequency value separated by a predetermined frequency from frequency zero output by the local oscillator. According to the frequency conversion, a complex signal frequency is converted to a complex IF signal separated by a value of a frequency (hereinafter, referred to as an offset frequency), corresponding to a difference between the RF signal frequency and the IF, from frequency zero. The baseband generator 54 converts an IF signal output from the IF generator 53 to a real axis component I and an imaginary axis component Q of a baseband signal, extracts the baseband signal, and outputs the extracted baseband signal to a demodulator.

In the frequency value separated by the predetermined frequency from the frequency zero, a frequency value of an RF signal band (i.e., an IF) is a frequency (corresponding to a predetermined frequency of a downconverter) separated by an offset frequency from the center frequency of the RF signal within a channel signal band of the RF signal.

The IF generator 53 is configured by an LNA 511, a complex-coefficient filter 513, a local oscillator 502 for outputting a real local signal, and a half-complex mixer 517. Except for a frequency output from the local oscillator, the IF generator 53 has the same function and connection structure as the IF generator 51 of the downconverter 40 of the zero-IF scheme illustrated in FIG. 35.

The baseband generator 54 is connected to the IF generator 53 through terminals TI and TQ, and is configured by a complex-coefficient filter 520, AGC amplifiers 523 and 524, ADCs 525 and 526, a local oscillator 540, a full-complex mixer 530, and LPFs 527 and 528.

In the downconverter 41, the complex-coefficient filter 513 employs, for example, a complex-coefficient transversal filter. The complex-coefficient filter 513 rejects a negative frequency component from signals input from input terminal IrpI and IrpQ, and outputs components of a complex signal with a phase difference of 90 degrees from output terminals OrpI and OrpQ.

The half-complex mixer 517 is used to frequency-convert an RF signal to a frequency separated by an offset frequency from frequency zero, and is configured by a mixer-I 518 and a mixer-Q 519 serving as multipliers. The local oscillator 502 inputs a real local signal of a frequency separated by an offset frequency from the center frequency of an RF signal within an RF signal band in a real signal of cos or sin to an input terminal Ihm of the half-complex mixer 517. The half-complex mixer 517 multiplies the real local signal and a complex RF signal S41B input from input terminals IhmI and IhmQ, performs frequency conversion to a complex IF signal separated by an offset frequency from frequency zero, and outputs a complex signal S41D.

The complex-coefficient filter 520 band-limits a real axis component S41DI and an imaginary axis component S41DQ of the input complex IF signal S41D to a frequency band of a predetermined range based on frequency zero, and outputs a complex IF signal S43A. The process for band-limiting the complex IF signal to the frequency band of the predetermined range based on frequency zero has the same performance as a real-coefficient filter.

The AGC amplifiers 523 and 524 control a gain according to a voltage applied to an input terminal TAGC. The ADCs 525 and 526 convert an analog signal to a digital signal.

The full-complex mixer 530 is used for a frequency conversion process in which an offset frequency value included in the complex IF signal is set to frequency zero, and is configured by a mixer-II 531, a mixer-IQ 532, a mixer-QI 534, and a mixer-QQ 535 serving as multipliers, a subtractor 533, and an adder 536. The full-complex mixer 530 receives a real axis local cos signal from the local oscillator 540 through an input terminal Icmc and receives an imaginary axis local sin signal from the local oscillator 540 through an input terminal Icms. The full-complex mixer 530 performs a frequency conversion process in which the center frequency is set to frequency zero for a complex signal S43C input from the input terminals IcmI and IcmQ, and then outputs a complex IF signal S43D.

Next, the overall operation of the downconverter 41 of the quasi-zero-IF scheme will be described. An LNA 511 amplifies an RF signal of a real signal input from an antenna to the input terminal TRF and then outputs a real signal S41A. The complex-coefficient filter 513, to which the 514A signal is input, rejects an image frequency signal for the real signal S41A input from the input terminals IrpI and IrpQ. The complex-coefficient filter 513 outputs a real axis component S41BI and an imaginary axis component S41BQ of a complex signal S41B with a phase difference of 90 degrees from the output terminals OrpI and OrpQ to the half-complex mixer 517. The half-complex mixer 517 frequency-converts the complex signal S41B on the basis of a real local signal of cos or sin with a frequency separated by an offset frequency from the center frequency of an RF signal input from the local oscillator 502, and then outputs a generated complex IF signal S41D to the complex-coefficient filter 520.

The complex-coefficient filter 520 band-limits a real axis component S41DI and an imaginary axis component S41DQ of the complex IF signal S41D to a frequency band of a predetermined range based on frequency zero, and outputs a complex IF signal S43A to the AGC amplifiers 523 and 524. The AGC amplifiers 523 and 524 adjust amplitudes of a real axis component S43AI and an imaginary axis component S43AQ of the complex baseband signal S43A to levels suitable for inputs to the ADCs 525 and 526. The AGC amplifiers 523 and 524 output a complex signal S43B to the ADCs 525 and 526. The ADCs 525 and 526 convert an input signal to a digital signal and then-output a real axis component S43CI and an imaginary axis component S43CQ of a complex IF signal S43C to the full-complex mixer 530.

The full-complex mixer 530 performs a frequency conversion process in which the center frequency is set to frequency zero for the real axis component S43CI and the imaginary axis component S43CQ of the complex IF signal S43C according to a real axis local cos signal and an imaginary axis local sin signal of a complex local signal output from the local oscillator 540, and outputs a complex signal S43D to LPFs 527 and 528. The LPFs 527 and 528 remove a high frequency component of the complex signal S43D, and output a real axis component I and an imaginary axis component Q of a complex baseband signal to output terminals TOI and TOQ, respectively.

Figure 38:
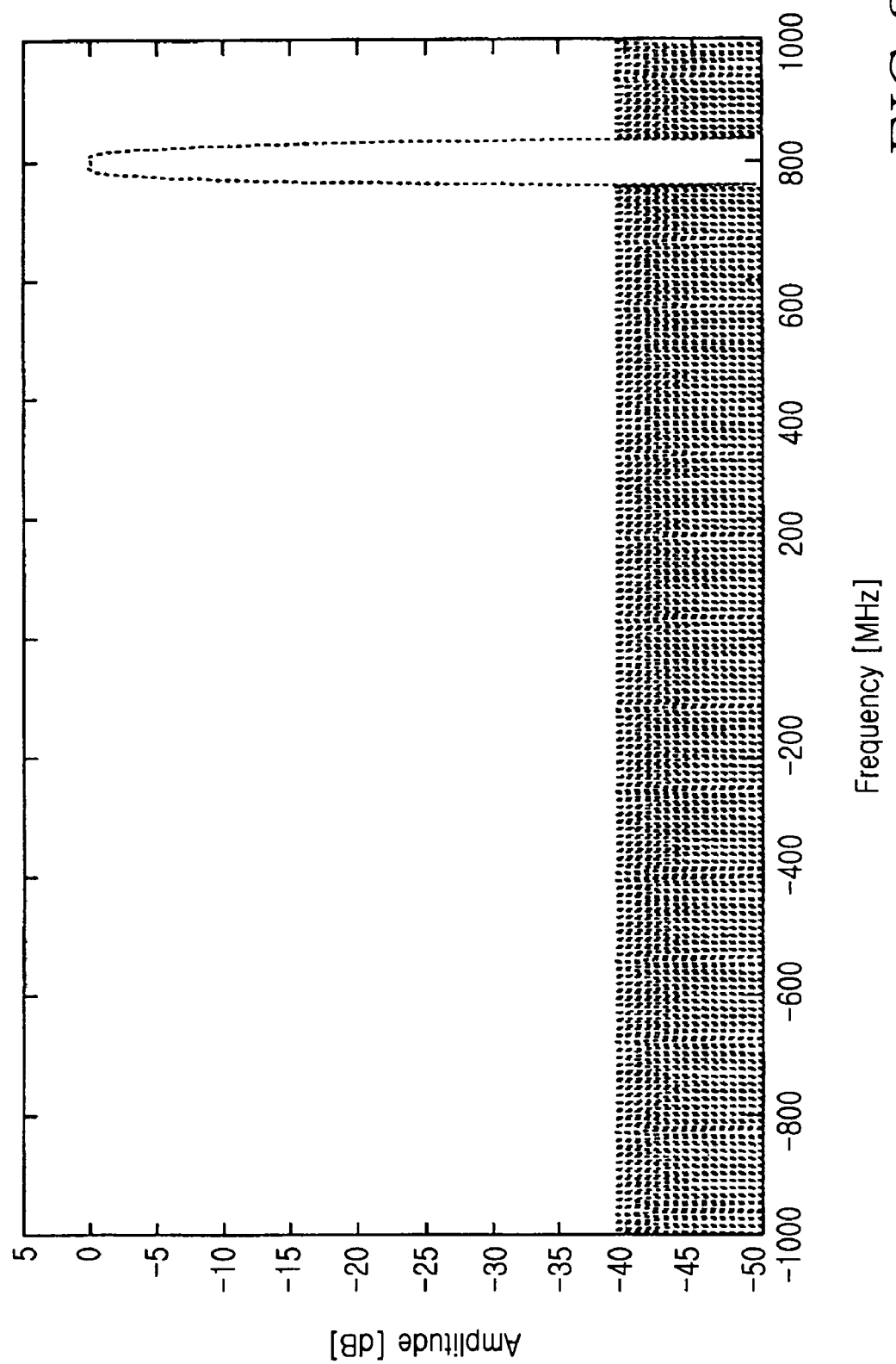
FIG. 38 illustrates frequency characteristics of a complex-coefficient filter used in a downconverter of the zero-IF scheme and the quasi-zero-IF scheme.

FIG. 38 illustrates an example of frequency characteristics of a complex-coefficient transversal filter applied to the complex-coefficient filter 513 of the downconverter 40 and the upconverter 41 in the present invention. An associated complex-coefficient transversal filter can be designed in the same design method as that of the complex-coefficient transversal filter applied to the downconverter of the above-described low-IF scheme. In the zero-IF scheme and the quasi-zero-IF scheme, a filter is configured to reject 39 dB in a frequency band out of a frequency band of a predetermined range with the center of an RF signal frequency of 800 MHz as illustrated in FIG. 38.

Figure 39:
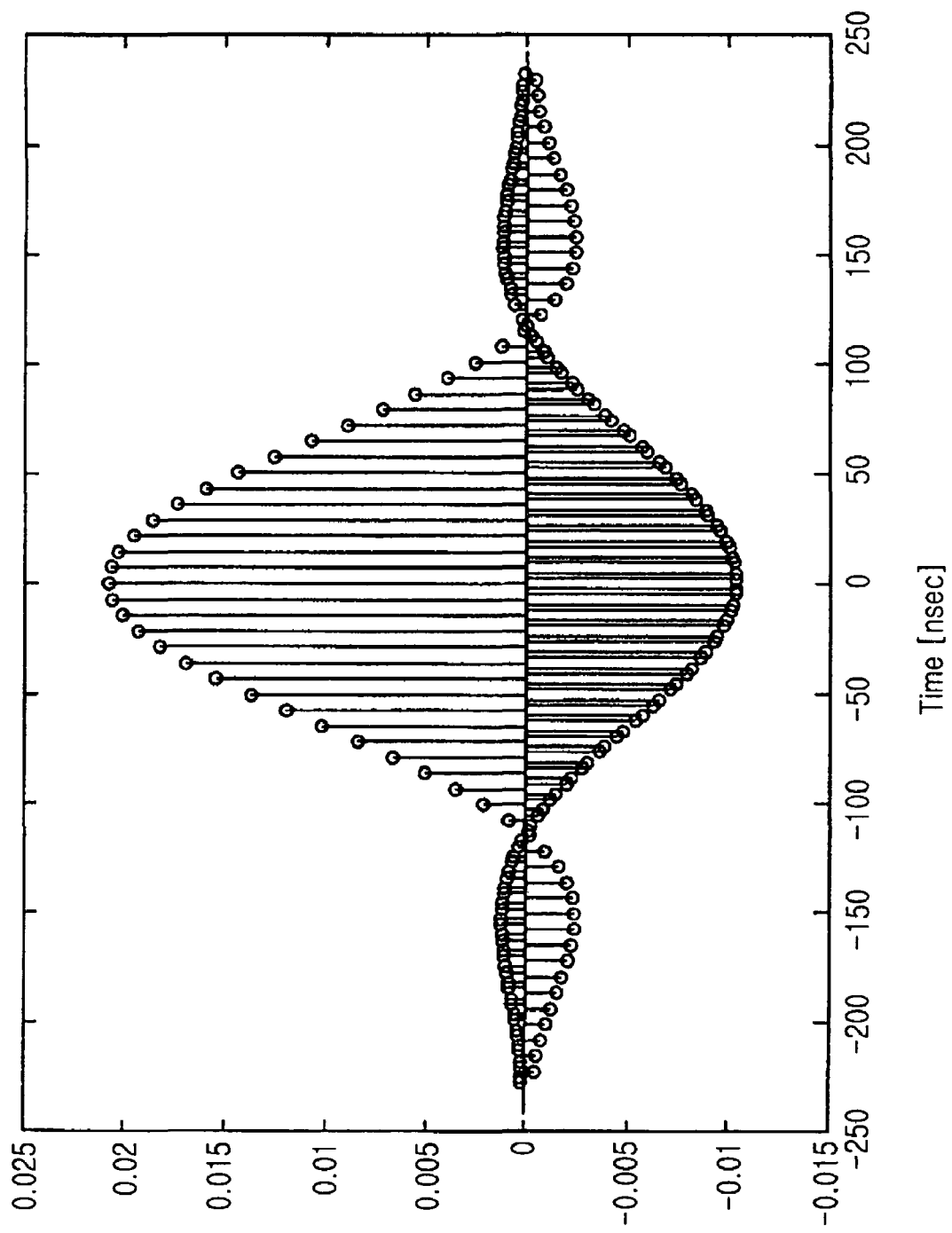
FIG. 39 illustrates an impulse response of a real part of the complex-coefficient filter used in the downconverter of the zero-IF scheme and the quasi-zero-IF scheme in accordance with the present invention.
Figure 40:
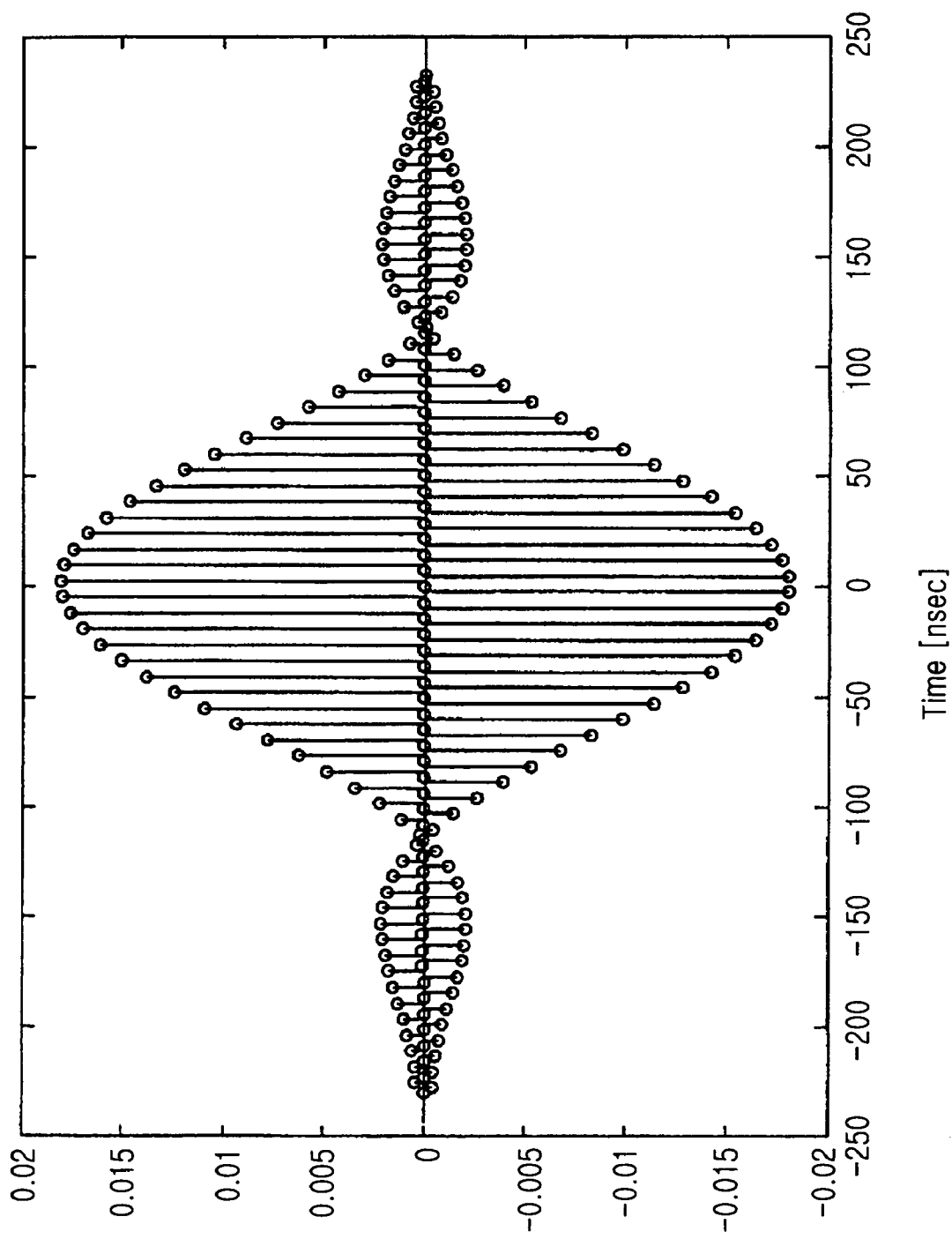
FIG. 40 illustrates an impulse response of an imaginary part of the complex-coefficient filter used in the downconverter of the zero-IF scheme and the quasi-zero-IF scheme in accordance with the present invention.

FIG. 39 illustrates an impulse response of a real part of the complex-coefficient transversal filter. The impulse response of the real part is an even-symmetric impulse response. FIG. 40 illustrates an impulse response of an imaginary part of the complex-coefficient transversal filter. The impulse response of the imaginary part is an odd-symmetric impulse response. A convolution integral process for the impulse responses and the input signals can output components of a complex signal with a phase difference of 90 degrees while suppressing a negative frequency band. In FIGS. 39 and 40, the vertical axis represents a normalized value.

A structure for suppressing a negative frequency band in the complex-coefficient filter used in the downconverter of the zero-IF scheme and the quasi-zero-IF scheme has been described. Alternatively, the complex-coefficient filter may have a structure for suppressing a positive frequency band and performing a process on the basis of a signal of an extracted positive frequency component.

M. Principle of Upconverter of Zero-IF Scheme

Figure 50:
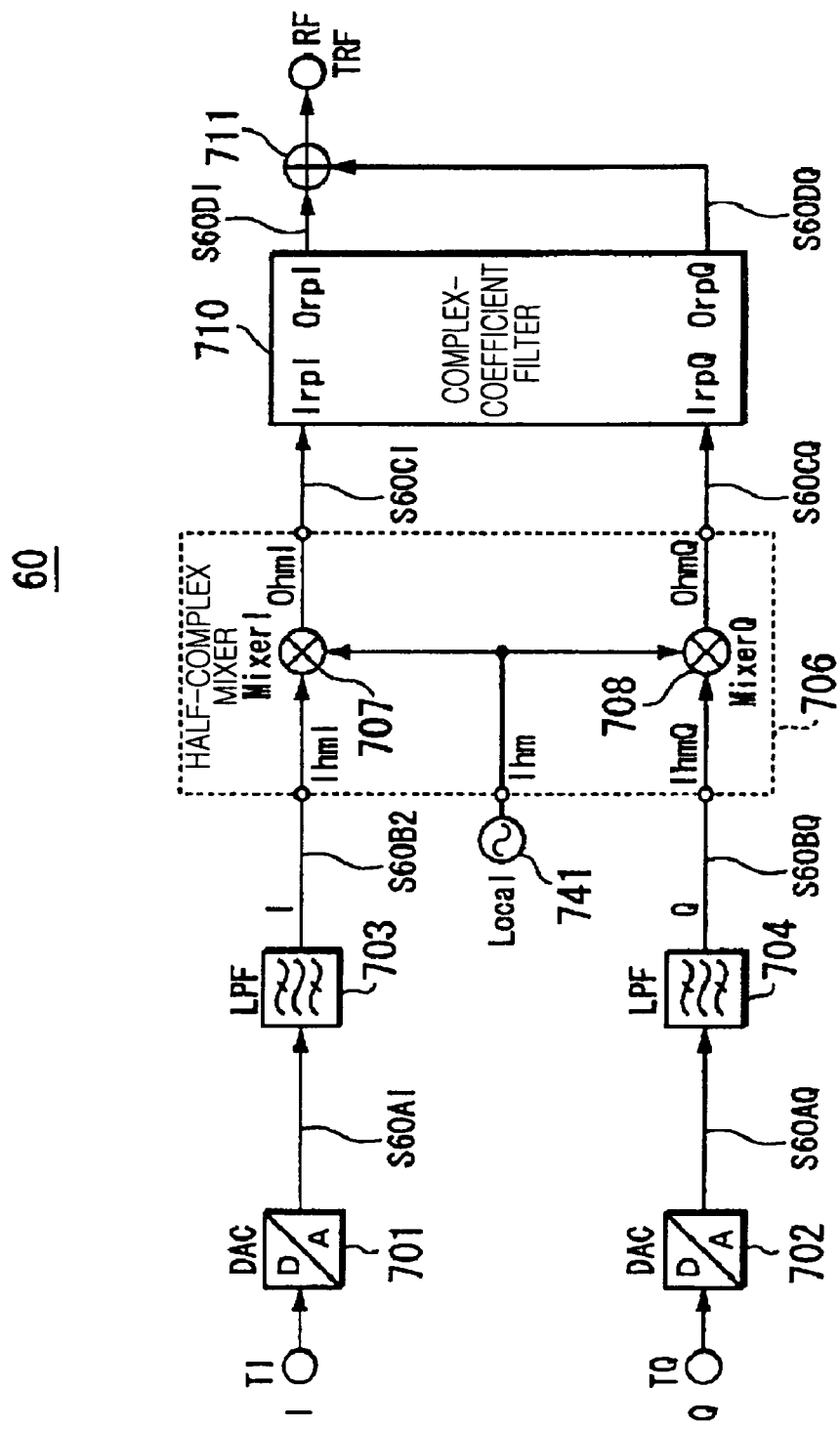
FIG. 50 illustrates a basic structure of an upconverter of a zero-IF scheme in accordance with the present invention.

Next, the principle of an upconverter of a zero-IF scheme in the present invention will be described with reference to an example of a basic structure of the upconverter based on the zero-IF scheme in the present invention. FIG. 50 illustrates an upconverter 60 serving as an example of a first structure of the upconverter of the zero-IF scheme in the present invention. For example, the upconverter 60 may be a radio transmitter. The upconverter 60 converts digital signals received from input terminals TI and TQ with real and imaginary parts to analog baseband signals, performs a frequency conversion process based on an RF signal frequency for the analog baseband signals, and generates a complex RF signal, extracts only a real part of the complex RF signal, and outputs the real RF signal to an output terminal TRF connected to an antenna.

In the upconverter 60, Digital-to-Analog Converters (DACs) 701 and 702 convert digital signals input from TI and TQ to analog baseband signals. LPFs 703 and 704 remove a high frequency component of a complex signal S60A output from the DACs 701 and 702 and then output a complex signal S60B.

A half-complex mixer 706 is configured by a mixer-I 707 and a mixer-Q 708 serving as multipliers. A local oscillator 741 inputs a real local signal with a frequency of a target RF signal in a real signal of cos or sin to an input terminal Ihm of the half-complex mixer 706. The half-complex mixer 706 multiplies the real local signal and a complex RF signal S60B input from input terminals IhmI and IhmQ, and outputs a complex signal S60C. The complex signal S60C has the RF signal frequency.

Next, the overall operation of the above-described upconverter 60 will be described. The DAC 701 converts a real component of digital signals input from the input terminals TI and TQ to an analog signal S60AI. The DAC 702 converts an imaginary component of the digital signals input from the input terminals TI and TQ to an analog signal S60AQ. As a result, a complex signal S60A is generated. The LPFs 703 and 704 remove a high frequency component from the complex signal S60A and then output a complex signal S60B including S60BQ.

The half-complex mixer 706 frequency-converts the complex signal S60B on the basis of the real local signal of cos or sin input from the local oscillator 741, and outputs a complex signal S60C with an RF signal frequency to the complex-coefficient filter 710.

The complex-coefficient filter 710 outputs a real axis component S60DI and an imaginary axis component S60DQ of a complex signal S60D with a phase difference of 90 degrees to output terminals OrpI and OrpQ while rejecting a negative frequency of the input complex RF signal 60C. A subtractor 711 subtracts the imaginary axis component S60DQ from the real axis component S60DI of the complex RF signal output from the complex-coefficient filter 710 and extracts a real RF signal.

Figure 51:
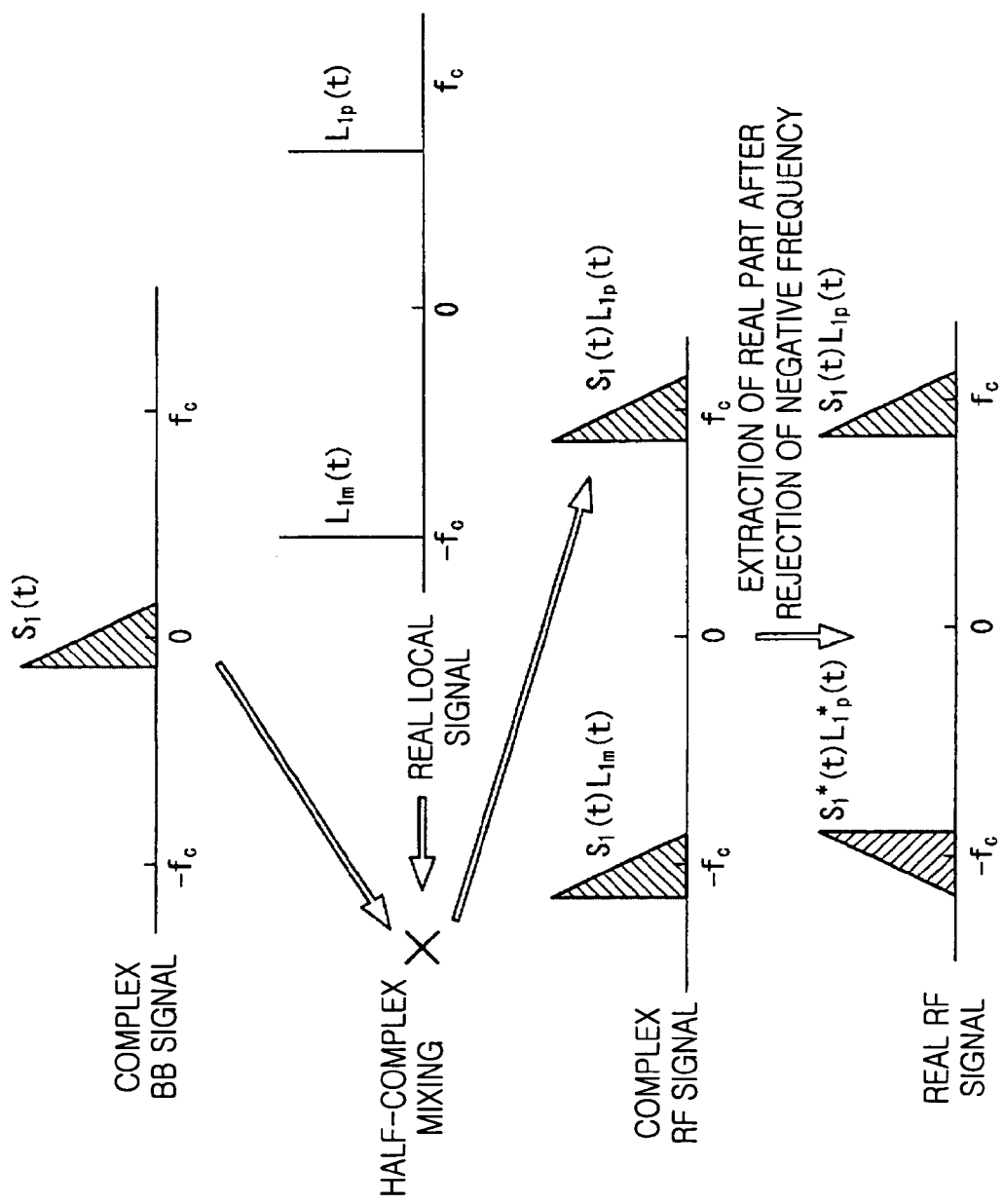
FIG. 51 illustrates a mixing process of the upconverter of the zero-IF scheme in accordance with the present invention.

FIG. 51 illustrates a mixing process in the upconverter 60 illustrated in FIG. 50. The half-complex mixer 706 multiplies (or half-complex mixes) a complex baseband (BB) signal and a real local signal $L_l(t)$ with a frequency $f_c$ of an RF signal output from the local oscillator 741, performs frequency conversion to the RF signal frequency $f_c$ and outputs a complex RF signal $s_{rf}(t)$.

The complex-coefficient filter 710 rejects a negative frequency component of the complex RF signal $s_{rf}(t)$ and the subtractor 711 subtracts an imaginary component from a real component of the complex RF signal, such that a real RF signal $(\frac{1}{2}(S_l(t)L_{lp}(t)+S_l^*(t)L_{lp}^*(t)))$ is output. When the subtraction operation of the subtractor 711 is performed after the complex-coefficient filter 710 rejects the negative frequency component of the complex RF signal, the influence of a signal frequency-converted in a reverse direction at the RF signal frequency $f_c$ can be removed.

A complex baseband signal, a complex local signal, a complex RF signal, and a real RF signal in a process as illustrated in FIG. 51 are expressed by Equations (35), (36), (37), and (38), respectively.

$$s_{bb}(t) = s_{li}(t) + js_{lq}(t) = s_l(t) \quad \text{Equation (35)}$$

$$L_l(t) = L_{lm}(t) + L_{lp}(t) \quad \text{Equation (36)}$$

$$s_{rf}(t) = s_l(t) + L_l(t) \quad \text{Equation (37)}$$

$$s_{rf}(t) = \text{Re}[s_l(t) + L_{lp}(t)] \quad \text{Equation (38)}$$
$$= \frac{1}{2}(s_l(t)L_{lp}(t) + s_l^*(t)L_{lp}^*(t))$$

N. Principle of Upconverter of Quasi-Zero-IF Scheme

Figure 52:
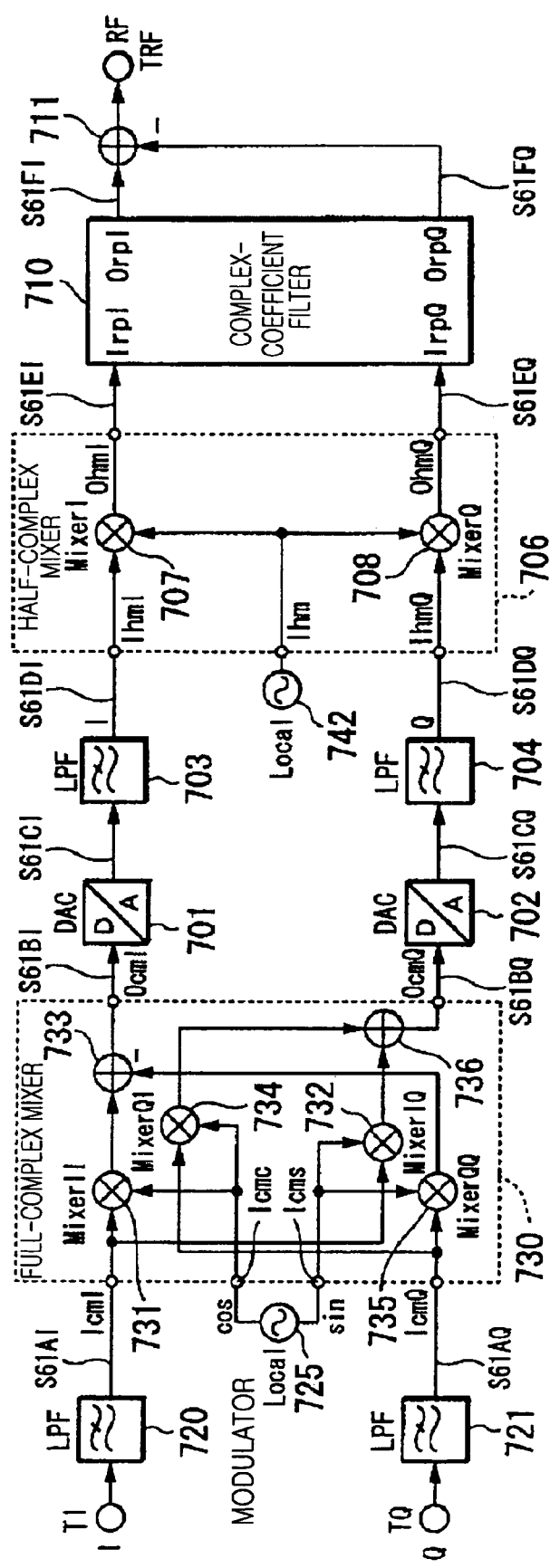
FIG. 52 illustrates a basic structure of an upconverter of a quasi-zero-IF scheme in accordance with the present invention.

Next, the principle of an upconverter of a quasi-zero-IF scheme in the present invention will be described with reference to an example of a basic structure of the upconverter based on the quasi-zero-IF scheme in the present invention. FIG. 52 illustrates an upconverter 61 serving as an example of a first structure of the upconverter of the quasi-zero-IF scheme in the present invention. For example, the upconverter 61 may be a radio transmitter. The upconverter 61 converts digital signals received from input terminals TI and TQ with real and imaginary parts to analog baseband signals, and converts the analog baseband signals to a complex IF signal of an IF separated by an offset frequency value from frequency zero according to a first local signal output from a first local oscillator. Moreover, the upconverter 61 frequency-converts the complex IF signal to an RF signal capable of being transmitted on the basis of a second local signal output from a second local oscillator, extracts only a real part of the complex RF signal, and transmits the extracted real part from an output terminal TRF such as an antenna.

Here, the offset frequency in the upconverter of the quasi-zero scheme is a frequency of the first local signal. The frequency of the first local signal has a frequency value when the frequency value obtained by adding the RF signal frequency to the frequency of the first local signal is in a frequency band of the RF signal.

The upconverter of the zero-IF scheme has a structure for frequency-converting a complex baseband signal to a complex RF signal according to the second local signal output from the second local oscillator. It is assumed that a frequency difference is present between the second local signal and the RF signal when a resolution of the second local oscillator is not fine. The upconverter of the quasi-zero-IF scheme is provided with the first local oscillator to compensate for the frequency difference. The upconverter performs a fine frequency conversion process in which the offset frequency is set to a center frequency and first generates a quasi-baseband signal. The upconverter can perform frequency conversion to a signal with a target RF signal frequency according to the second local signal.

The upconverter 61 has the same structure as the upconverter 60 illustrated in FIG. 50 in terms of a structure after the DACs 701 and 702, except that the local oscillator 741 connected to the half-complex mixer 706 is replaced with a local oscillator 742 for outputting a signal of a frequency separated by an offset frequency from an RF signal. Components not provided in the upconverter 60 (FIG. 50), but utilized in the upconverter 61 of FIG. 52, will be described.

LPFs 720 and 721 remove high frequency components of digital signals.

A full-complex mixer 730 is used for frequency conversion in which the offset frequency is set to a center frequency, and is configured by a mixer-II 731, a mixer-IQ 732, a mixer-QI 734, and a mixer-QQ 735 serving as multipliers, a subtractor 733, and an adder 736. The full-complex mixer 730 receives a real axis local cos signal from a local oscillator 725 through an input terminal Icmc and receives an imaginary axis local sin signal from the local oscillator 725 through an input terminal Icms. The full-complex mixer 730 performs a frequency conversion process in which the offset frequency is set to the center frequency for a complex signal S61A input from the input terminals IcmI and IcmQ, and then outputs a complex IF signal S61B.

A half-complex mixer 706 is configured by a mixer-I 707 and a mixer-Q 708 serving as multipliers. The local oscillator 742 inputs a real local signal with a frequency of a target RF signal in a real signal of cos or sin to an input terminal Ihm of the half-complex mixer 706. The half-complex mixer 706 multiplies the real local signal and a complex signal S61D input from input terminals IhmI and IhmQ, and outputs a complex signal S61E. The complex signal S61E has the RF signal frequency.

Here, a center frequency of the complex IF signal S61D input to the half-complex mixer 706 is the offset frequency. A frequency value obtained by adding the IF to the center frequency of the RF signal is a frequency value (corresponding to a predetermined frequency of an upconverter) in an RF signal frequency band.

Next, the overall operation of the above-described upconverter 61 of the quasi-zero-IF scheme will be described. LPFs 720 and 721 remove high frequency components of digital signals input from input terminals TI and TQ, and output a real axis component S61AI and an imaginary axis component S61AQ of a complex baseband signal S61A.

According to the real axis local cos signal and the imaginary axis sin signal of the complex local signal output from the local oscillator 725, the full-complex mixer 730 performs a frequency conversion process in which the offset frequency is set to the center frequency of the complex signal S61A for a real axis component S61AI and an imaginary axis component S61AQ of the complex signal S61A. Then, the full-complex mixer 730 outputs a real axis component S61BI and an imaginary axis component S61BQ of a complex IF signal S61B to the DACs 701 and 702.

The DACs 701 and 702 convert the complex IF signal S61B output from the full-complex mixer 730 to an analog signal and generate an analog complex IF signal S61C. LPFs 703 and 704 remove a high frequency component from the complex IF signal S61C and output a complex signal S61D.

The half-complex mixer 706 frequency-converts the complex IF signal S61D in a real signal of cos or sin input from the local oscillator 742 on the basis of a real local signal with a frequency separated by the offset frequency from an RF signal frequency. The half-complex mixer 706 outputs a complex RF signal S61E with an RF signal frequency to the complex-coefficient filter 710.

The complex-coefficient filter 710 outputs a real axis component S61FI and an imaginary axis component S61FQ of a complex RF signal S61F with a phase difference of 90 degrees to output terminal OrpI and OrpQ while rejecting a negative frequency of the input complex RF signal 61E. A subtractor 711 subtracts the imaginary axis component S61FQ from the real axis component S61FI of the complex RF signal output from the complex-coefficient filter 710 and extracts a real RF signal. The extracted real RF signal is output to TRF.

For example, the complex-coefficient filter 710 for the upconverter of the zero-IF scheme and the quasi-zero-IF scheme uses a complex-coefficient transversal filter. When the complex-coefficient transversal filter is used, impulse responses illustrated in FIGS. 39 and 40 are provided. A complex-coefficient transversal filter, with frequency characteristics illustrated in FIG. 38, can be applied.

The complex-coefficient filter 710 of the upconverter based on the zero-IF scheme and the quasi-zero-IF scheme for suppressing a negative frequency band has been described. Alternatively, the complex-coefficient filter 710 may have a structure for suppressing a positive frequency band and performing a process on the basis of an extracted positive frequency component.

If flat group delay characteristics are required for the complex-coefficient transversal filter, an impulse response used for the complex-coefficient transversal filter must be exactly an even or odd symmetric impulse response. However, if flat group delay characteristics are not required, an approximately even or odd symmetric impulse response can also be accepted because it is allowable that symmetry may be slightly lost when the impulse response is generated on the basis of an even or odd function.

N. First Embodiment of Downconverter of Low-IF Scheme

Next, an embodiment of a downconverter of a low-IF scheme in accordance with the present invention will be described with reference to the accompanying drawings.

Figure 16:
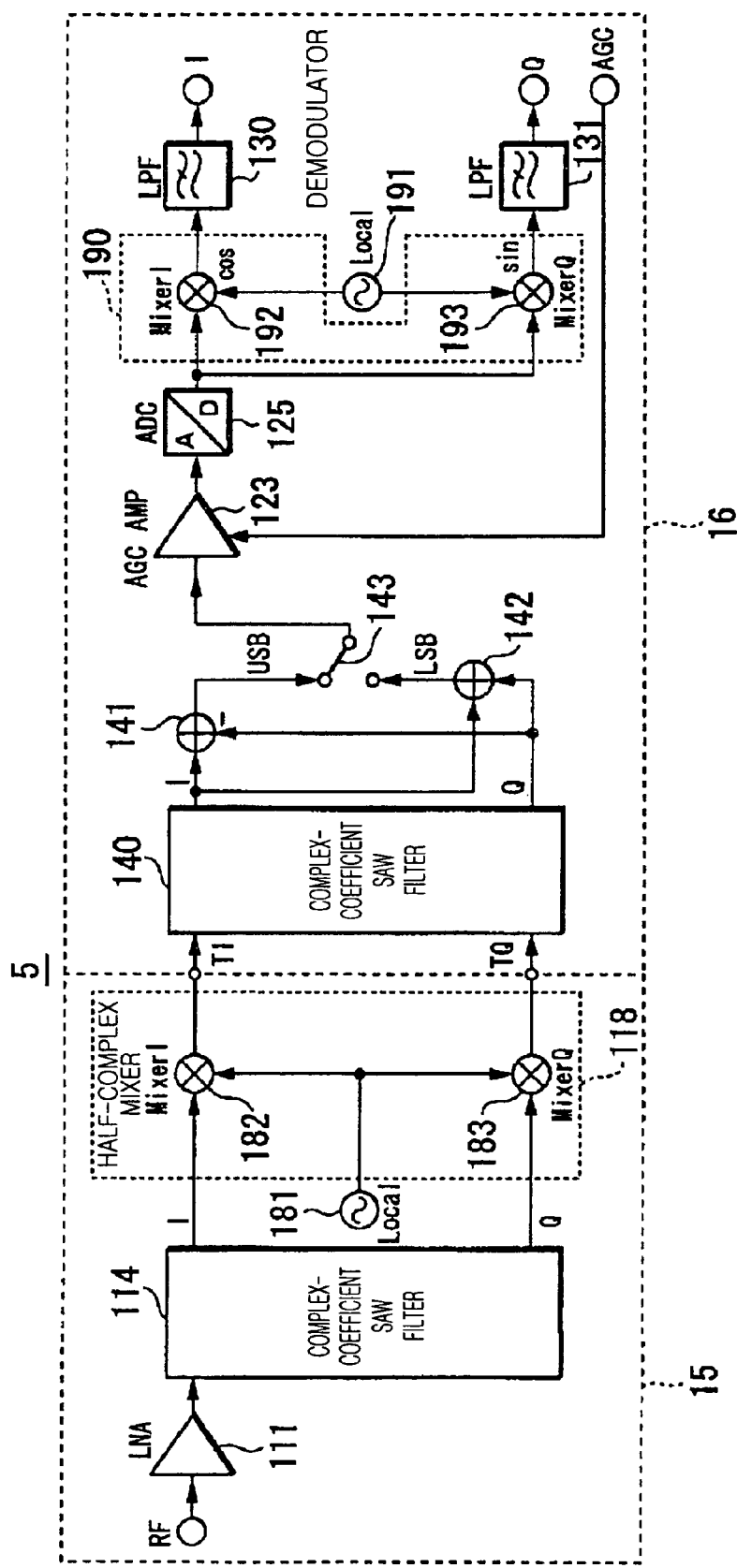
FIG. 16 illustrates a first embodiment of the downconverter of the low-IF scheme in accordance with the present invention.

FIG. 16 is a block diagram illustrating a first embodiment of the downconverter of the low-IF scheme. A downconverter 5 illustrated in FIG. 16 is configured by an IF generator 15 for converting an RF signal to an IF signal, and a baseband generator 16 for converting the IF signal to a real axis component I and an imaginary axis component Q of a baseband signal, extracting the baseband signal, and outputting the extracted baseband signal to a demodulator.

The components with the same functions in the downconverter 5 of FIG. 16 and the downconverter 3 of FIG. 13 are denoted by the same reference numerals, and their description is omitted here. The complex-coefficient transversal filter 115 of the downconverter 3 of FIG. 13 is replaced with a complex-coefficient SAW filter 114, implemented by the SAW filter 1150 of FIG. 6 or the SAW filter 1156 of FIG. 7, in the downconverter 5 of FIG. 16. The downconverter 5 of FIG. 16 is different from the downconverter 3 of FIG. 13 in that an adder 142 is connected to an output terminal of a complex-coefficient SAW filter 140 of the baseband generator in addition to a subtractor 141 and a switch 143 selectively outputs a positive or negative frequency band.

Next, the operation of the downconverter 5 will be described. An LNA 111 of the IF generator 15 receives an RF signal of a real signal from an antenna, amplifies the input RF signal, and outputs the amplified RF signal. The complex-coefficient SAW filter 114 converts the amplified real RF signal, output by the LNA 111, to a complex RF signal and then outputs the complex RF signal to a half-complex mixer 118. The half-complex mixer 118 receives a real local signal, from a local oscillator 181, with a frequency that is an IF value lower than an RF signal frequency. The half-complex mixer 118 multiplies the real local signal and a real axis component of the complex RF signal, output from the complex-coefficient SAW filter 114, in a mixer-I 182. Moreover, the half-complex mixer 118 multiplies the real local signal and an imaginary axis component of the complex RF signal in a mixer-Q 183, converts the complex RF signal to a complex IF signal with an IF, and outputs the complex IF signal. Here, a pass bandwidth of the complex-coefficient SAW filter 114 is an RF signal frequency bandwidth, i.e., a radio system bandwidth.

The complex-coefficient SAW filter 140 of the baseband generator 16 is the same as the SAW filter 140 of FIG. 14. The complex-coefficient SAW filter 140 receives a complex IF signal from the half-complex mixer 118 and removes an image frequency signal by rejecting a negative frequency signal of the complex IF signal. Here, a pass bandwidth of the complex-coefficient SAW filter 140 is a channel bandwidth. The subtractor 141 subtracts an output of an imaginary part from an output of a real part of the complex-coefficient SAW filter 140. That is, the subtractor 141 selects a positive frequency and produces a real signal. On the other hand, the adder 142 adds the output of the real part and the output of the imaginary part of the complex-coefficient SAW filter 140. That is, the adder 142 selects a negative frequency and produces a real signal. The switch 143 selects the positive frequency (or Upper Side Band (USB)) or a negative frequency (or Lower Side Band (LSB)), separates the USB and the LSB, and cuts off power of a circuit of an unselected side.

An AGC amplifier 123 controls a gain by adjusting a band-limited IF signal output from the subtractor 141 or the adder 142 to a level suitable for an input of the ADC 125 according to a voltage applied from a terminal AGC. The ADC 125 converts an IF signal, output from the AGC amplifier 123, to a digital IF signal. A half-complex mixer 190 converts the digital IF signal, output from the ADC 125, to a complex baseband signal. After real and imaginary parts of the complex baseband signal are band-limited by LPFs 130 and 131, the band-limited real and imaginary parts are output to a demodulator.

P. Second Embodiment of Downconverter of Low-IF Scheme

Figure 17:
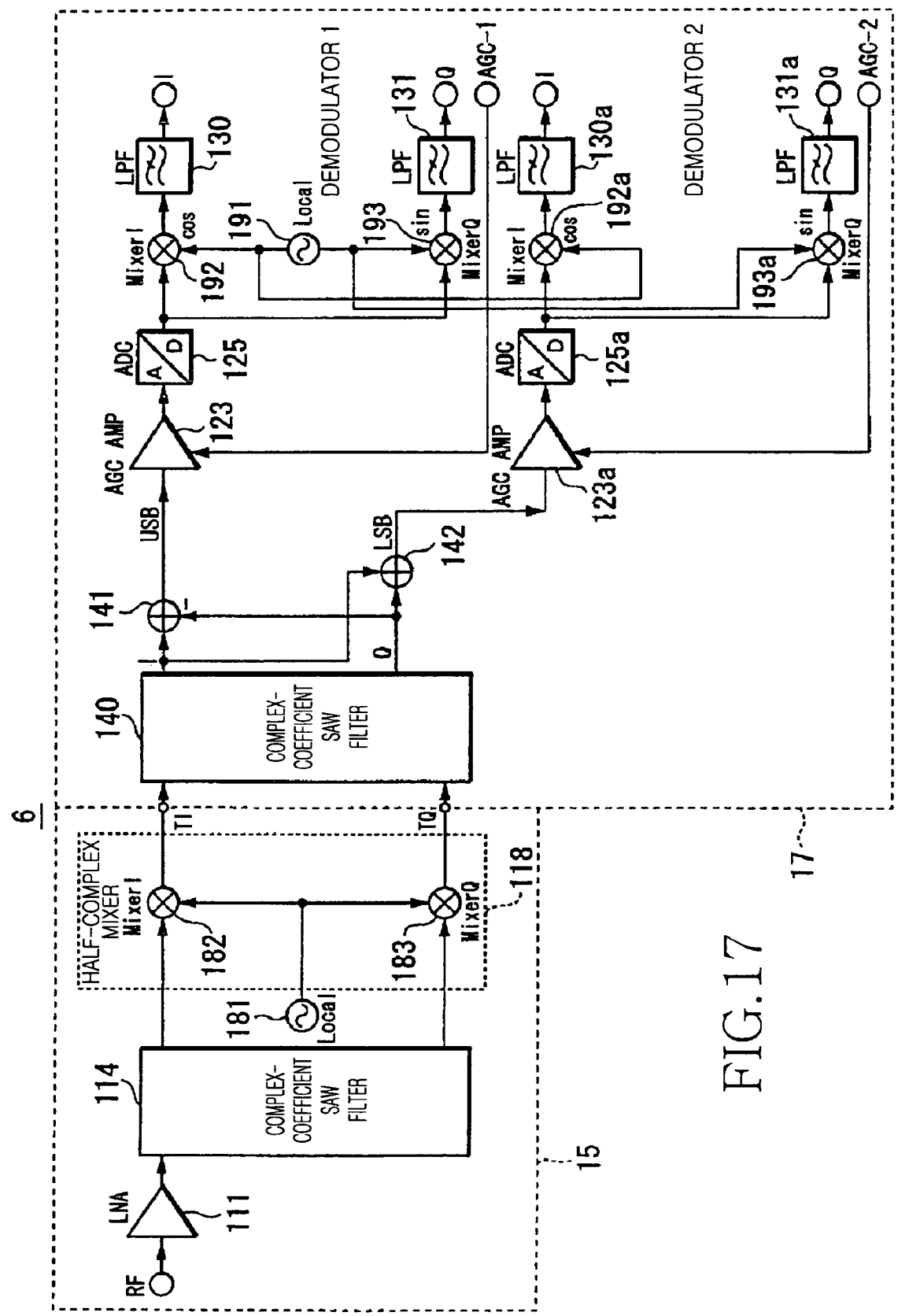
FIG. 17 illustrates a second embodiment of the downconverter of the low-IF scheme in accordance with the present invention.

FIG. 17 is a block diagram illustrating a second embodiment of a downconverter of a low-IF scheme. A structure of a downconverter 6 illustrated in FIG. 17 is different from that of the downconverter 5 illustrated in FIG. 16 in that the downconverter 5 selects a USB or LSB but the downconverter 6 simultaneously processes both the USB and the LSB. The components with the same functions in the downconverter 6 of FIG. 17 and the downconverter 5 of FIG. 16 are denoted by the same reference numerals, and their description is omitted here.

The downconverter 6 is different from the structure of the downconverter 5, in that downconverter 6 is additionally provided with an AGC amplifier 123*a*, a mixer-I 192*a*, a mixer-Q 193*a*, an LPF 130*a*, and an LPF 131*a* to process the LSB. An input terminal of the AGC amplifier 123*a* is connected to an output terminal of the adder 142, and an input terminal of the ADC 125*a* is connected to an output terminal of the AGC amplifier 123*a*. The mixer-I 192*a* is connected to the ADC 125*a* through one input terminal, and is connected to a local oscillator 191 through the other input terminal. The mixer-Q 193*a* is connected to the ADC 125*a* through one input terminal, and is connected to the local oscillator 191 through the other input terminal. The LPFs 130*a* and 131*a* are connected to the output terminals of the mixer-I 192*a* and the mixer-Q 193*a*, respectively. In the second embodiment, it is assumed that absolute values of frequencies of the USB and the LSB are the same as each other. The local oscillator 191 is shared between the USB and the LSB. If frequencies of the USB and the LSB are different from each other, different local oscillators are required.

The processes for the USB and the LSB are the same as the processes in FIG. 16 when the switch 143 is connected to a side of the USB or LSB. A complex baseband signal of the USB side is output to Demodulator 1 and a complex baseband signal of the LSB side is output to Demodulator 2.

Q. Third Embodiment of Downconverter of Low-IF Scheme

Figure 18:
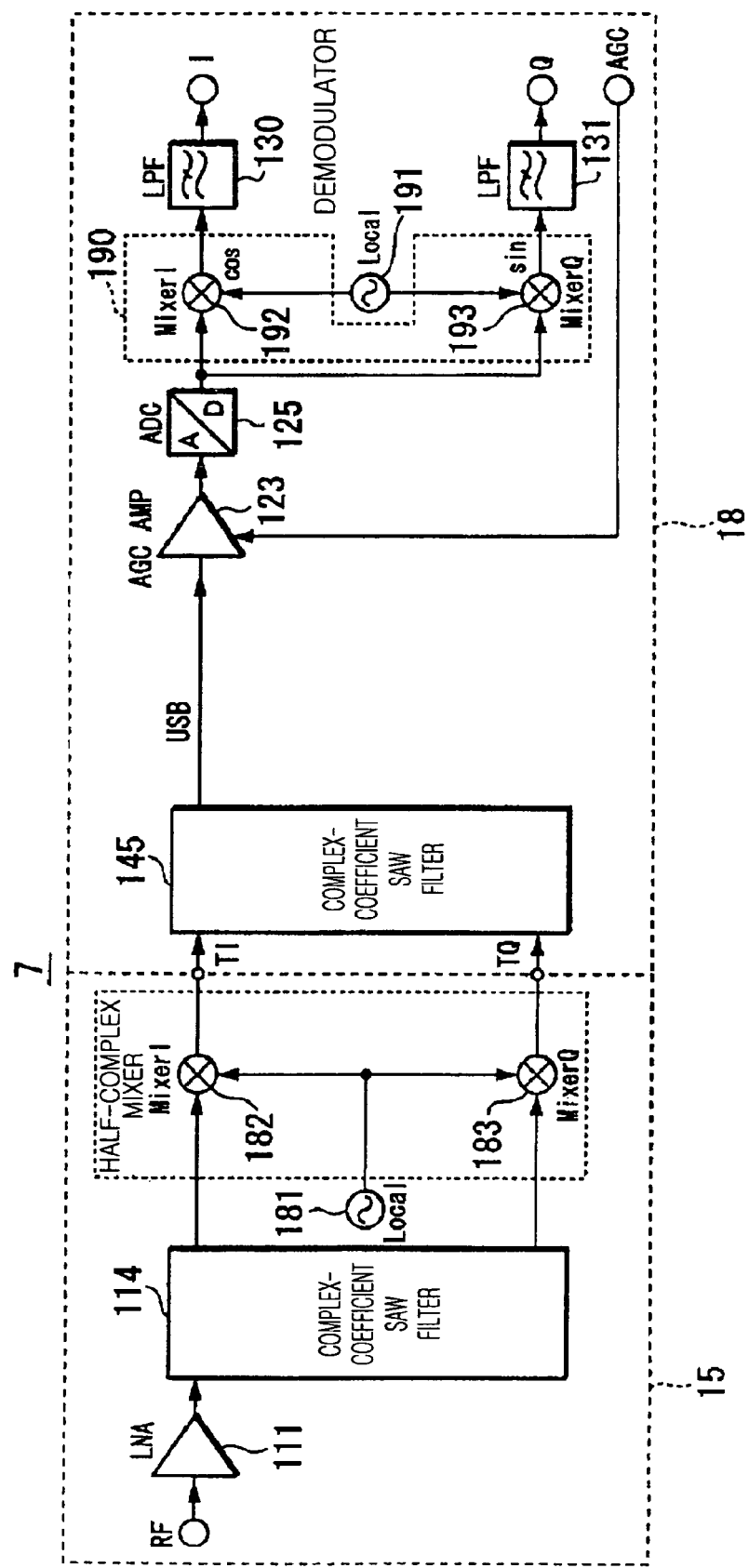
FIG. 18 illustrates a third embodiment of the downconverter of the low-IF scheme in accordance with the present invention.

FIG. 18 is a block diagram illustrating a third embodiment of a downconverter of a low-IF scheme. The structure of a downconverter 7 illustrated in FIG. 18 is different from that of the downconverter 5 illustrated in FIG. 16. The downconverter 5 has a structure for performing an operation in the subtractor 141 or the adder 142 coupled to an output of the complex-coefficient SAW filter 140, but the downconverter 7 has a structure for processing a computational operation on real and imaginary parts-within a complex-coefficient SAW filter 145. The components with the same functions in the downconverter 7 of FIG. 18 and the downconverter 5 of FIG. 16 are denoted by the same reference numerals, and their description is omitted here.

Figure 19:
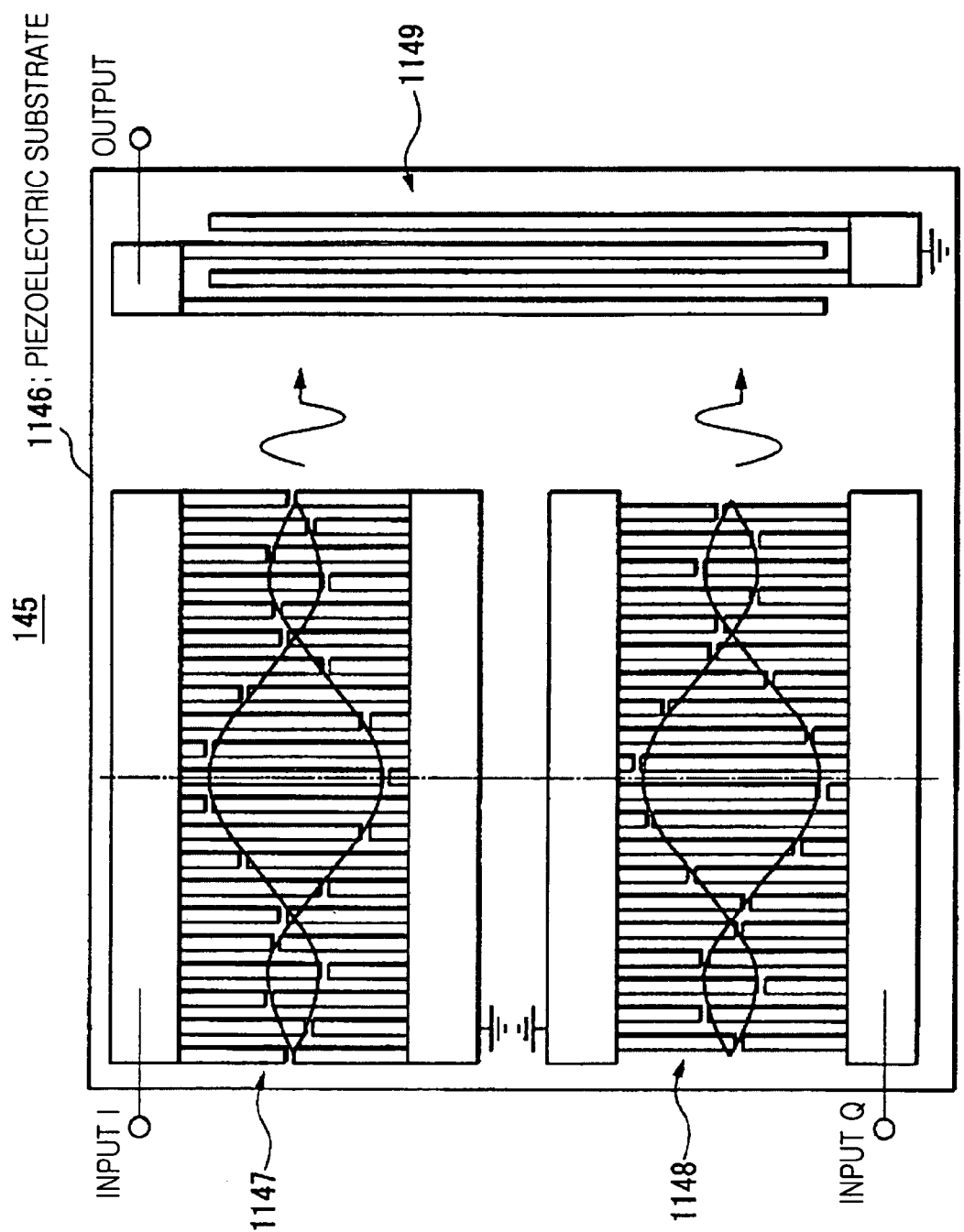
FIG. 19 illustrates a structure of a SAW filter used in the third embodiment of the downconverter of the low-IF scheme in accordance with the present invention.

FIG. 19 illustrates a structure of the complex-coefficient SAW filter 145 provided in the downconverter 7 of FIG. 18. The complex-coefficient SAW filter 145 has IDTs 1147 to 1149 provided on a piezoelectric substrate 1146. The IDT 1147 is coupled to an input I of a real part, and the IDT 1148 is coupled to an input Q of an imaginary part. The IDT 1149 is connected to an output terminal, and is provided such that it is placed across propagation paths of the IDTs 1147 and 1148.

Here, if a local signal frequency is lower than an IF and the USB is extracted, the polarity of an impulse response is inverted when a weighting operation is performed for the IDT 1148 of the imaginary part. The IDT 1149 can perform in-phase reception and can subtract the imaginary part from the real part.

On the other hand, if a local signal frequency is higher than an IF and the LSB is extracted, weighting operations of the IDTs 1147 and 1148 are performed according to impulse responses of the real and imaginary parts. The IDT 1149 can perform in-phase reception and can add the real and imaginary parts.

The downconverter 7 of FIG. 18 performs the same operation as that of the USB side of the switch 143 in the downconverter 5 of FIG. 16.

R. Fourth Embodiment of Downconverter of Low-IF Scheme

Figure 20:
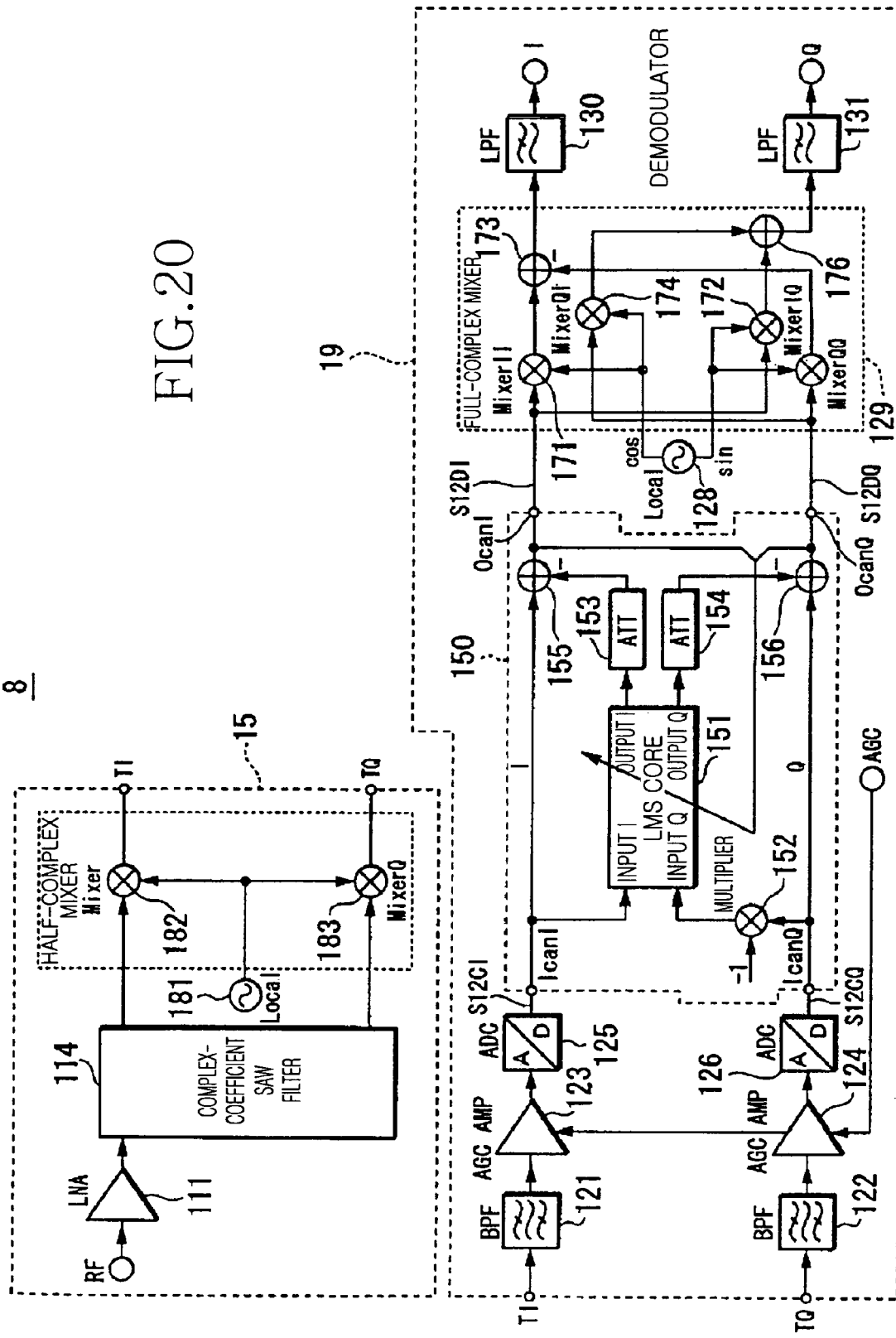
FIG. 20 illustrates a fourth embodiment of the downconverter of the low-IF scheme in accordance with the present invention.

FIG. 20 is a block diagram illustrating a fourth embodiment of a downconverter of a low-IF scheme.

The previously-described downconverter 1 illustrated in FIG. 1 can simultaneously process positive and negative frequencies, and can select the positive and negative frequencies or select the simultaneous processing in a digital part after performing conversion to digital signals in the ADCs 125 and 126. Moreover, the downconverter 1 of FIG. 1 fixedly corrects a difference between the amplitude of the output signal S12CI of the ADC 125 and the amplitude of the output signal S12CQ of the ADC 126 by means of the imbalance corrector 127 in relation to interference of an image frequency signal in the AGC amplifiers 123 and 124 varying with AGC voltage.

To perform an adaptive correction process rather than a fixed correction process in a downconverter 8 of the fourth embodiment, an image interference canceller 150 serving as an adaptive filter based on a Least Mean Square (LMS) algorithm is inserted between ADCs 125 and 126 and a full-complex mixer 129. The components with the same functions in the downconverter 8 of FIG. 20 and the downconverter 1 of FIG. 1 are denoted by the same reference numerals, and their description is omitted here. The downconverter 8 of FIG. 20 is different from the downconverter 1 of FIG. 1, in that the downconverter 8 employs a complex-coefficient SAW filter 114 implemented by a SAW filter in place of the complex-coefficient transversal filter 115 of the downconverter 1.

Next, a structure of the image interference canceller 150 in the downconverter 8 will be described. The image interference canceller 150 is configured by a multiplier 152, an LMS core 151, attenuators (ATTs) 153 and 154, and subtractors 155 and 156. A real-part input terminal IcanI of the image interference canceller 150 is connected to an output terminal of the ADC 125, and an imaginary-part input terminal IcanQ of the image interference canceller 150 is connected to an output terminal of the ADC 126. A real-part output terminal OcanI of the image interference canceller 150 is connected to a real-part input terminal of a full-complex mixer 129, and an imaginary-part output terminal OcanQ of the image interference canceller 150 is connected to an imaginary-part input terminal of the full-complex mixer 129. The real-part input terminal IcanI of the image interference canceller 150 is connected to a real-part input terminal of the LMS core 151 and a positive input terminal of the subtractor 155. The imaginary-part input terminal IcanQ of the image interference canceller 150 is connected to one input terminal of the multiplier 152 and a positive input terminal of the subtractor 156. The other input terminal of the multiplier 152 receives "−1" and an output terminal of the multiplier 152 is connected to an imaginary-part input terminal of the LMS core 151. A real-part output terminal of the LMS core 151 is connected to the ATT 153, and an imaginary-part output terminal of the LMS core 151 is connected to the ATT 154. An output terminal of the ATT 153 is connected to a negative input terminal of the subtractor 155, and an output terminal of the ATT 154 is connected to a negative input terminal of the subtractor 156.

Next, the function of each block will be described. The multiplier 152 inverts a sign of a signal by multiplying the signal of an imaginary part of an input complex IF signal by "−1". The LMS core 151 generates a complex conjugate signal for a complex IF signal S12C1 and S12CQ from a signal of a real part of a complex IF signal input from the ADC 125 and a signal of an imaginary part of the inverted complex IF signal input from the multiplier 152. The LMS core 151 is a core of the adaptive filter, sets an output signal of the subtractors 155 and 156 to an error signal, sets the generated complex conjugate signal to a reference signal, and controls a filter coefficient on the basis of the LMS algorithm. The ATTs 153 and 154 adjust a level of an output (corresponding to an image frequency interference cancel signal) of the LMS core 151. The subtractors 155 and 156 combine the image frequency interference cancel signal, adjusted by the ATTs 153 and 154, with the complex IF signal S12CI and S12CQ input from the ADCs 125 and 126.

Next, the operation of the image interference canceller 150 will be described. The adaptive filter of the image interference canceller 150 sets the complex conjugate signal generated by the multiplier 152 from an original signal of the image frequency signal to the reference signal. The adaptive filter operates such that an error, between the reference signal and the image frequency signal included in the input complex IF signal, is minimized. Because the image frequency signal is completely rejected when an error is absent, characteristics for excluding the image frequency interference can be improved up to an adaptive precision limit of the adaptive filter.

The adaptive filter of the image interference canceller 150 may obtain an adaptive filter coefficient by inputting a calibration signal. When an image frequency signal slowly varies on a time axis because a characteristic variation of an analog part occurs in a relatively short time, an adaptive process always does not need to operate but is performed only in a predetermined time. The remaining time is used to operate an equalizer as an adaptive filter based on the obtained coefficient. This operation is repeated such that a desired object is achieved.

The ATTs 153 and 154 for the real and imaginary parts capable of adjusting an output level of the LMS core 151 are inserted to operate a filter coefficient word length of the LMS core 151 in a minimum coefficient word length. When the ATTs 153 and 154 cannot be used because a signal level of the image frequency signal is significantly lower than that of a complex conjugate signal serving as a reference signal input to the adaptive filter, a coefficient value varies in the LMS core 151, such that an image frequency interference cancel signal serving as an output can be changed to the same level as that of the image frequency signal. If a coefficient value of the LMS core 151 is set to be small, it means that a filter coefficient word length is short.

The above-described first, second, and third embodiments are suitable for the purpose of obtaining low power consumption. When an IF is increased to at least 40 MHz but a SAW filter limits a band, a dynamic range or the number of bits becomes small, such that the power consumption is reduced. When a complex-coefficient filter of an IF stage is set as a polyphase filter, filter characteristics are degraded as compared with the case of using SAW. Because an IF may be decreased although the dynamic range is increased, counterbalance or low power consumption is possible according to the effect of reduction of an input bandwidth and a sampling frequency for an ADC. The fourth embodiment is suitable for the purpose of obtaining a very high image rejection ratio in a narrow band radio scheme and so on.

The complex-coefficient SAW filter of the downconverter of the low-IF scheme for suppressing a negative frequency band has been described. Alternatively, the complex-coefficient filter may have a structure for suppressing a positive frequency band and performing a process on the basis of a signal of an extracted positive frequency component.

S. First Embodiment of Upconverter of Low-IF Scheme

Next, an embodiment of an upconverter of a low-IF scheme in accordance with the present invention will be described with reference to the accompanying drawings.

Figure 28:
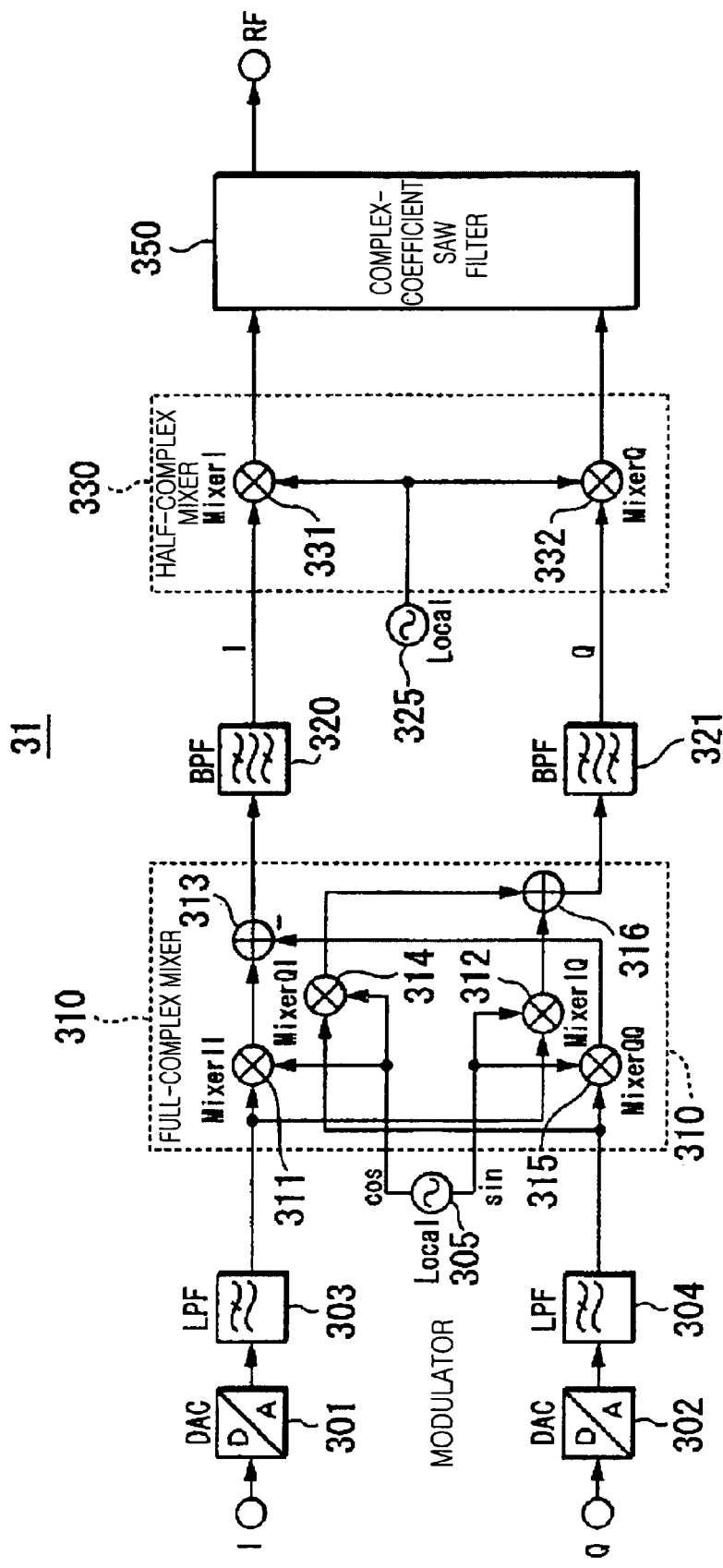
FIG. 28 illustrates a first embodiment of the upconverter of the low-IF scheme in accordance with the present invention.

FIG. 28 is a block diagram illustrating a first embodiment of the upconverter of the low-IF scheme. The components with the same functions in an upconverter 31 of FIG. 28 and the upconverter 30 of FIG. 23 are denoted by the same reference numerals, and their description is omitted here. The upconverter 31 of FIG. 28 has a different structure in that a complex-coefficient transversal filter 340 in the upconverter 30 of FIG. 23 is replaced with a complex-coefficient SAW filter 350.

Next, the operation of the upconverter 31 of FIG. 28 will be described. DACs 301 and 302 convert digital signals output in real and imaginary parts of a modulator to analog baseband signals. LPFs 303 and 304 remove high frequency components of the analog baseband signals output from the DACs 301 and 302. A full-complex mixer 310 converts a complex signal, output from the LPFs 303 and 304, to a complex IF signal on the basis of a complex local signal input from a local oscillator 305. BPFs 320 and 321 reject unnecessary signals by band-limiting the complex IF signal output from the full-complex mixer 310. A half-complex mixer 330 converts the complex IF signal, output from the BPFs 320 and 321, to a complex RF signal on the basis of a real local signal input from a local oscillator 325. A complex-coefficient SAW filter 350 rejects a negative frequency of the complex RF signal output from the half-complex mixer 330, extracts a real part after rejection, and outputs an RF signal. Here, a pass bandwidth of the complex-coefficient SAW filter 350 is a radio system bandwidth.

Figure 29:
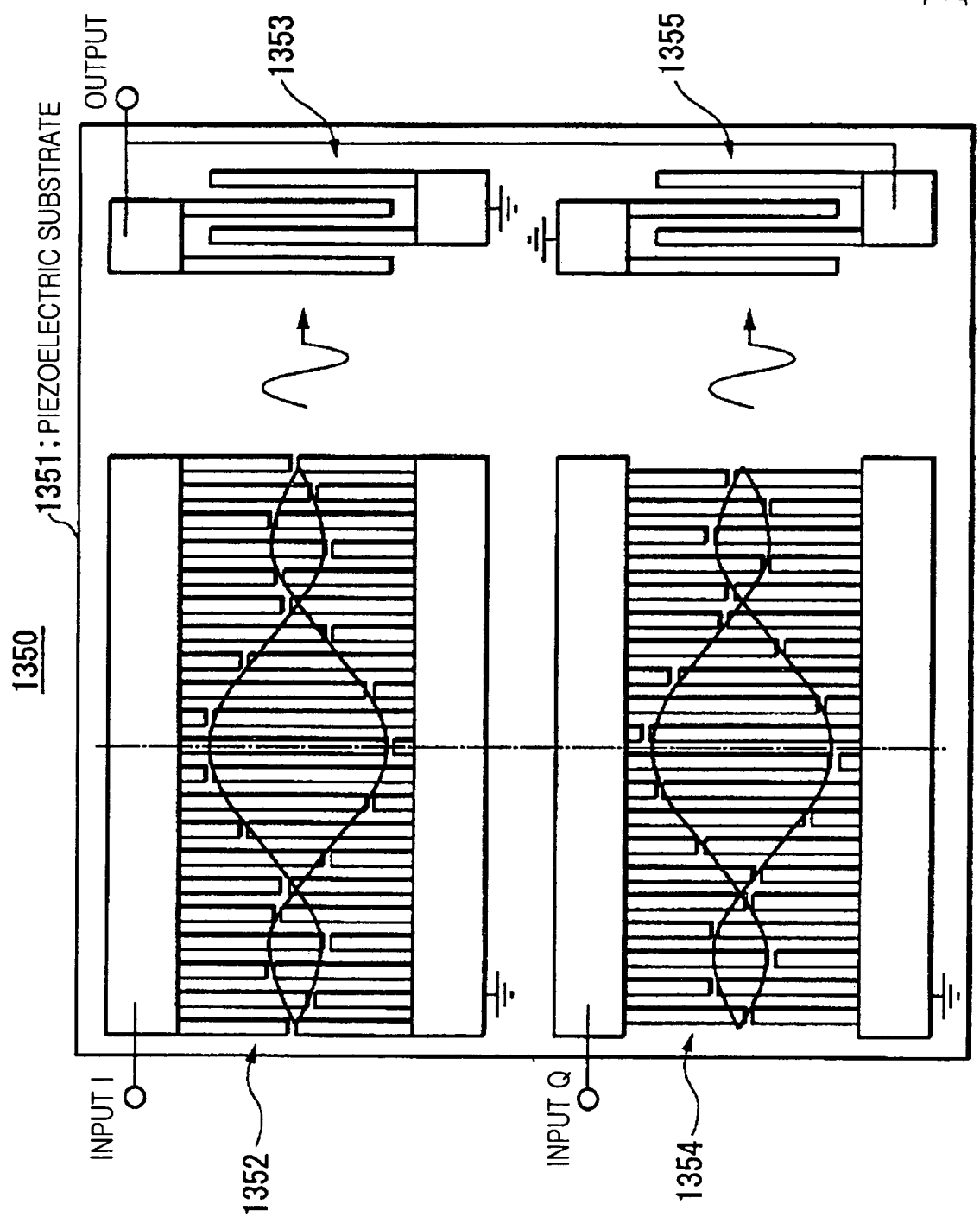
FIG. 29 illustrates a structure of SAW Filter 1 used in the first embodiment of the upconverter of the low-IF scheme in accordance with the present invention.
Figure 30:
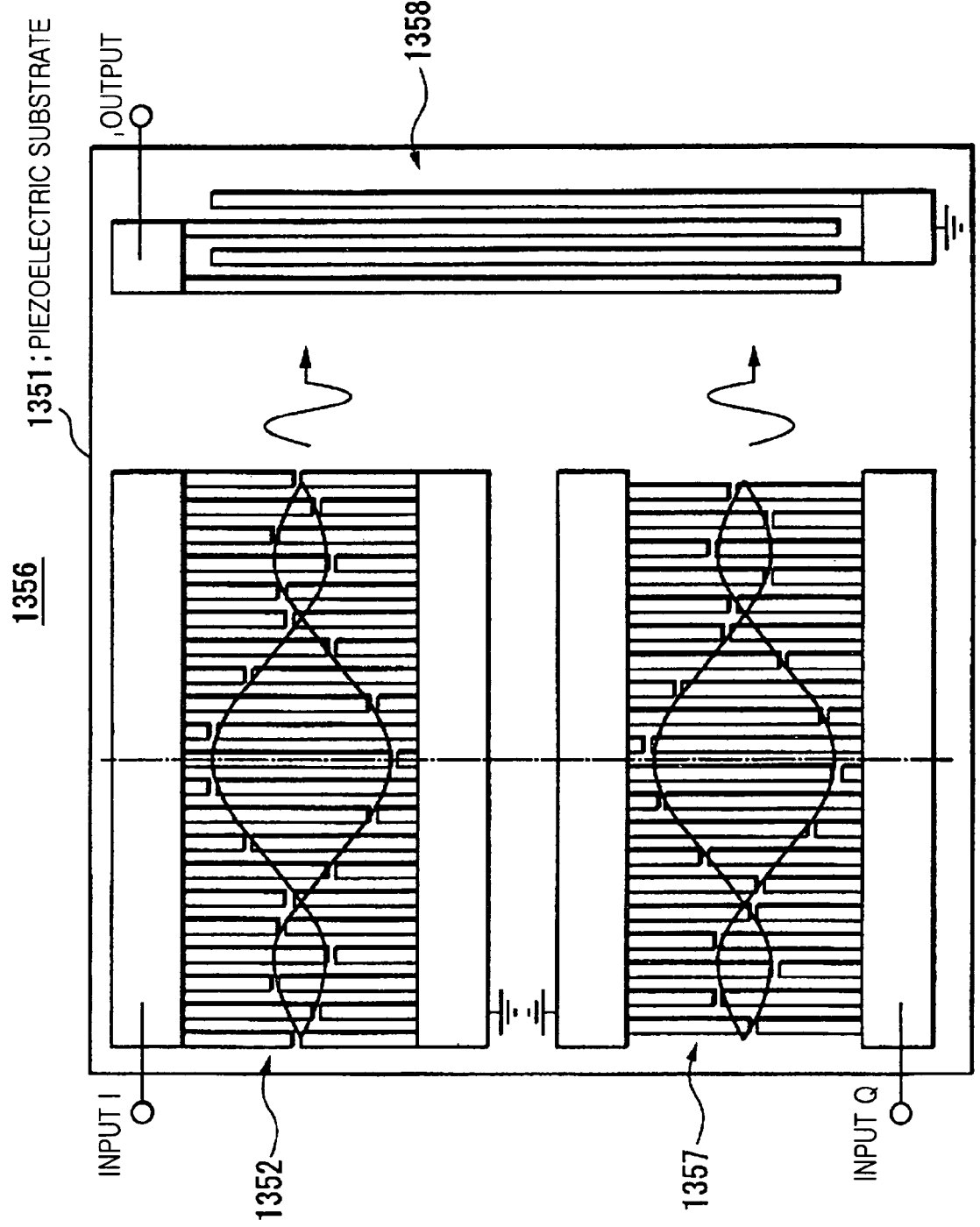
FIG. 30 illustrates a structure of SAW Filter 2 used in the first embodiment of the upconverter of the low-IF scheme in accordance with the present invention.

A SAW filter used in the complex-coefficient SAW filter 350 uses the structure of FIG. 29 or 30. Because the principle of the SAW filter is the same as previously described, its description is omitted here. Next, the structure and operation of the SAW filter used in the upconverter 31 will be described.

A SAW filter 1350 illustrated in FIG. 29 is provided with four IDTs 1352 to 1355 that have two propagation paths on a piezoelectric substrate 1351. To perform a weighting operation mapped to an impulse response of a real part (i.e., an even-symmetric impulse response) the IDT 1352, connected to an input terminal I for inputting a real axis component, is provided with an electrode finger such that even symmetry is made with respect to the envelope center. To perform a weighting operation mapped to an impulse response of an imaginary part (i.e., an odd-symmetric impulse response), the IDT 1354, connected to an input terminal Q for inputting an imaginary axis component, is provided with an electrode finger such that odd symmetry is made with respect to the envelope center. The IDT 1353 is connected to an output terminal, and is provided on a propagation path of the IDT 1352 for performing a convolution integral of a real part. The IDT 1355 is connected to an output terminal, and is provided on a propagation path of the IDT 1354 for performing a convolution integral of an imaginary part. According to the above-described structure, SAWs excited from the IDTs 1352 and 1354 on an input side are propagated at a phase difference of 90 degrees, and are received in the IDTs 1353 and 1355 on an output side. The IDTs 1353 and 1355 are connected to each other such that phases are reverse to each other. According to this structure, an imaginary component is subtracted from a real component, such that a real RF signal is output from an output terminal.

Similarly, a real RF signal can be output even when the IDTs 1352 and 1354 for which a weighting operation mapped to an impulse response is performed are connected to the output terminal, and the IDTs 1352 and 1354 are connected to the input terminals.

Next, the operation of the SAW filter 1350 will be described. First, when a complex RF signal is input to the input terminals, SAWs are excited in the IDTs 1352 and 1354 and SAW signals are propagated while a convolution integral is performed on impulse responses of real and imaginary parts and the complex RF signal. The SAW signals propagated from the IDTs 1352 and 1354 are received by the IDTs 1353 and 1355 provided in propagation directions of the SAW signals. A convolution integral is performed on the basis of impulse responses mapped to the SAW signals, such that they are converted to electric signals. At this time, the IDT 1353 outputs a real component of the RF signal, and the IDT 1355 outputs an imaginary component of the RF signal whose polarity is inverted. The output terminal outputs a real RF signal obtained by subtracting the imaginary component from the real component. When a convolution integral is performed for a complex RF signal and impulse responses illustrated in FIGS. 26 and 27, a real RF signal is output while a negative frequency band of the complex RF signal is suppressed.

The two IDTs 1353 and 1355 are provided on the output side as illustrated in FIG. 29. A SAW filter 1356 illustrated in FIG. 30 has a structure for receiving SAWs in one IDT 1358 connected to an output side. In this case, an IDT 1357 is provided which has an inverse of the polarity of the IDT 1354 mapped to the imaginary part of the input side of FIG. 28, such that a subtraction process can be realized. The inverse polarity is limited to the imaginary part. The polarity of the real part may be inverted. According to this structure, one IDT is provided on the output side.

In the structure of the first embodiment of the upconverter based on the low-IF scheme, a process for setting an image rejection ratio according to an attenuation amount of a negative frequency of the complex-coefficient SAW filter 350 and a circuit of up to the half-complex mixer 330 can be standardized. When the complex-coefficient SAW filter 350 is changed according to a target, the variation due to manufacturing variation can be reduced and a better image rejection ratio can be obtained.

T. Second Embodiment of Upconverter of Low-IF Scheme

Figure 31:
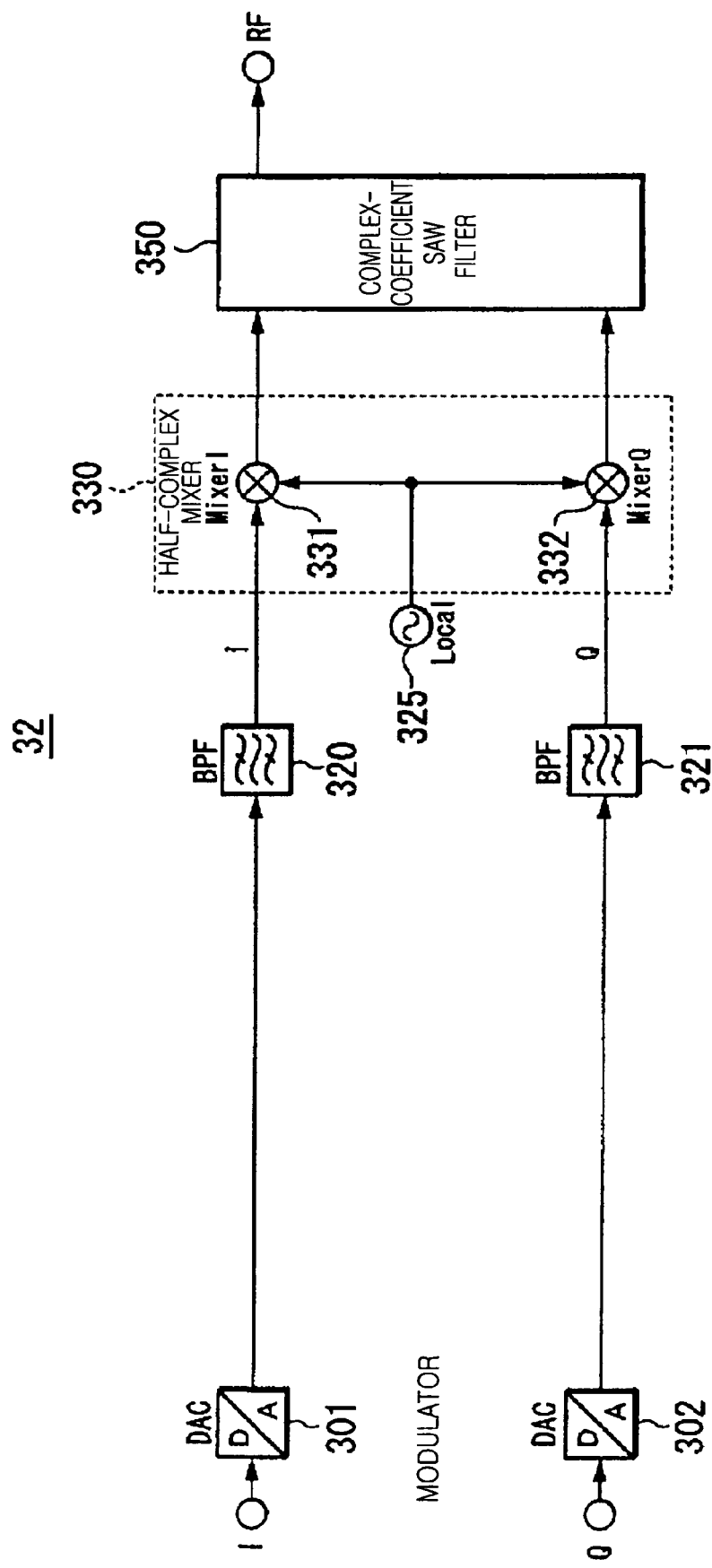
FIG. 31 illustrates a second embodiment of the upconverter of the low-IF scheme in accordance with the present invention.
Figure 32:
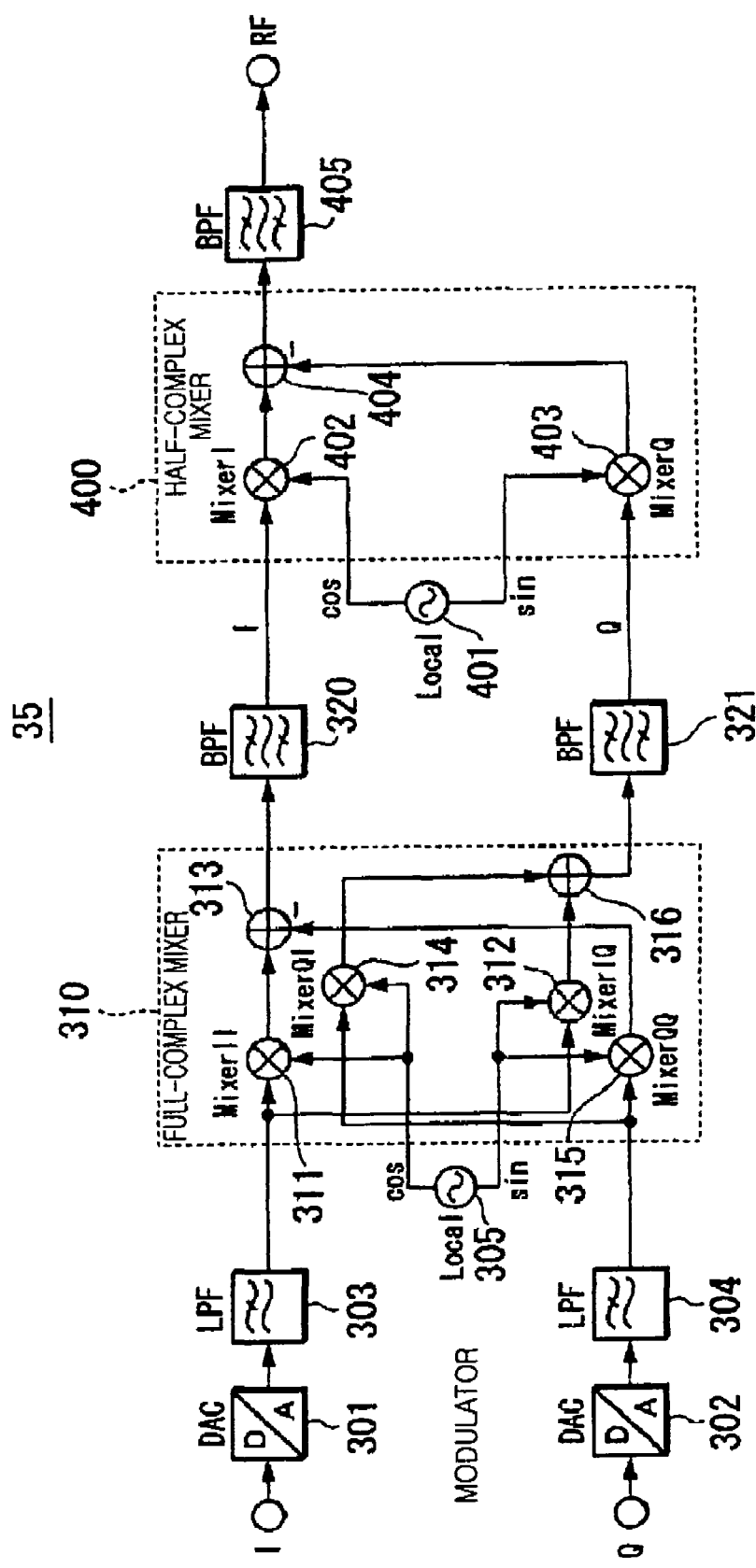
FIG. 32 illustrates a structure of a conventional upconverter of the low-IF scheme.

FIG. 31 is a block diagram illustrating a second embodiment of an upconverter of a low-IF scheme. An upconverter 32 illustrated in FIG. 31 has a structure in which the LPFs 303 and 304, the full-complex mixer 310, and the local oscillator 305 are removed from the upconverter 31 illustrated in FIG. 28 and DACs 301 and 302 directly output a complex IF signal.

In a structure of the second embodiment of the upconverter based on the low-IF scheme, a structure for converting an analog baseband signal to a complex IF signal can be omitted. A local signal is generated from only a local oscillator 325 used in a half-complex mixer 330, such that a compact upconverter can be realized with low power consumption.

A complex-coefficient SAW filter used in the upconverter of the low-IF scheme has a structure for suppressing a negative frequency band. Alternatively, the complex-coefficient SAW filter may have a structure for suppressing a positive frequency band and performing a process on the basis of a signal of an extracted positive frequency component.

U. Embodiment of Downconverter Based on Zero-IF Scheme and Quasi-Zero-IF Scheme

Figure 41:
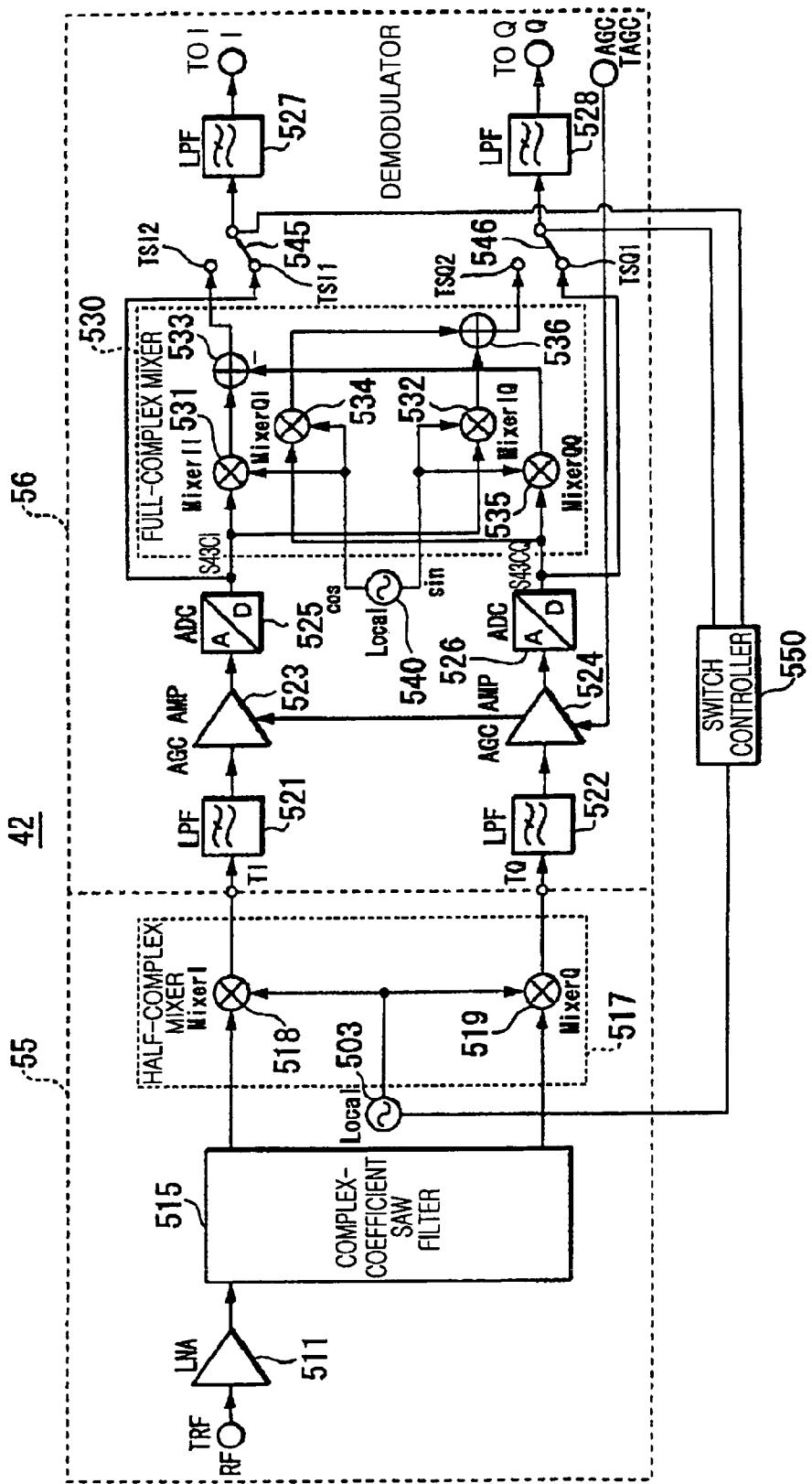
FIG. 41 illustrates an embodiment of the downconverter of the zero-IF scheme and the quasi-zero-IF scheme in accordance with the present invention.

Next, an embodiment of a downconverter based on a zero-IF scheme and a quasi-zero-IF scheme in the present invention will be described with reference to the accompanying drawings. FIG. 41 illustrates a downconverter 42 in accordance with an embodiment of the present invention. The downconverter 42 is provided with an IF generator 55 and a baseband generator 56 as in the downconverter 40 of the zero-IF scheme and the downconverter 41 of the quasi-zero-IF scheme. When an oscillation frequency of a local oscillator 503 is switched, the IF generator 55 can perform a process as in the IF generator 51 of the zero-IF scheme or the IF generator 53 of the quasi-zero-IF scheme. According to switching operations of changeover switches 545 and 546, the baseband generator 56 can perform a function of the baseband generator 52 of the zero-IF scheme or the baseband generator 54 of the quasi-zero-IF scheme. The components with the same functions between the downconverters 40, 41, and 42 are denoted by the same reference numerals. Next, the downconverter 42 will be described.

In the IF generator 55 of the downconverter 42, the local oscillator 503 (capable of outputting frequency signals mapped to the zero-IF scheme and the quasi-zero-IF scheme) is connected as a local oscillator connected to the half-complex mixer 517. A complex-coefficient filter of the IF generator 55 uses a complex-coefficient SAW filter 515. The complex-coefficient SAW filter 515 is connected to an LNA 511 and the half-complex mixer 517.

The baseband generator 56 has a structure in which LPFs 521 and 522, AGC amplifiers 523 and 524, and ADCs 525 and 526 are commonly used with the baseband generators 52 and 54 of the other downconverter schemes. In the zero-IF scheme, the baseband generator 56 is not connected to the full-complex mixer 530. To connect the full-complex mixer 530 in the quasi-zero-IF scheme, the changeover switch 545 is connected to an input terminal of an LPF 527, one switching point TSI2 is connected to an output terminal of a real axis of the full-complex mixer 530, and the other switching point TSI1 is connected to an output terminal of the ADC 525. The changeover switch 546 is connected to an input terminal of an LPF 528, one switching point TSQ2 is connected to an output terminal of an imaginary axis of the full-complex mixer 530, and the other switching point TSQ1 is connected to an output terminal of the ADC 526.

The downconverter 42 is additionally provided with a switch controller 550. The switch controller 550 controls a switching operation between the zero-IF scheme and the quasi-zero-IF scheme. The switch controller 550 is connected to the local oscillator 503 of the IF generator 55 and switching element terminals of the changeover switches 545 and 546 of the baseband generator 56. When a frequency output from the local oscillator 503 is mapped to the zero-IF scheme, the switch controller 550 controls the changeover switches 545 and 546 to be connected to the switching points TSI1 and TSQ1. When a frequency output from the local oscillator 503 is mapped to the quasi-zero-IF scheme, the switch controller 550 controls the changeover switches 545 and 546 to be connected to the switching points TSI2 and TSQ2.

Figure 42:
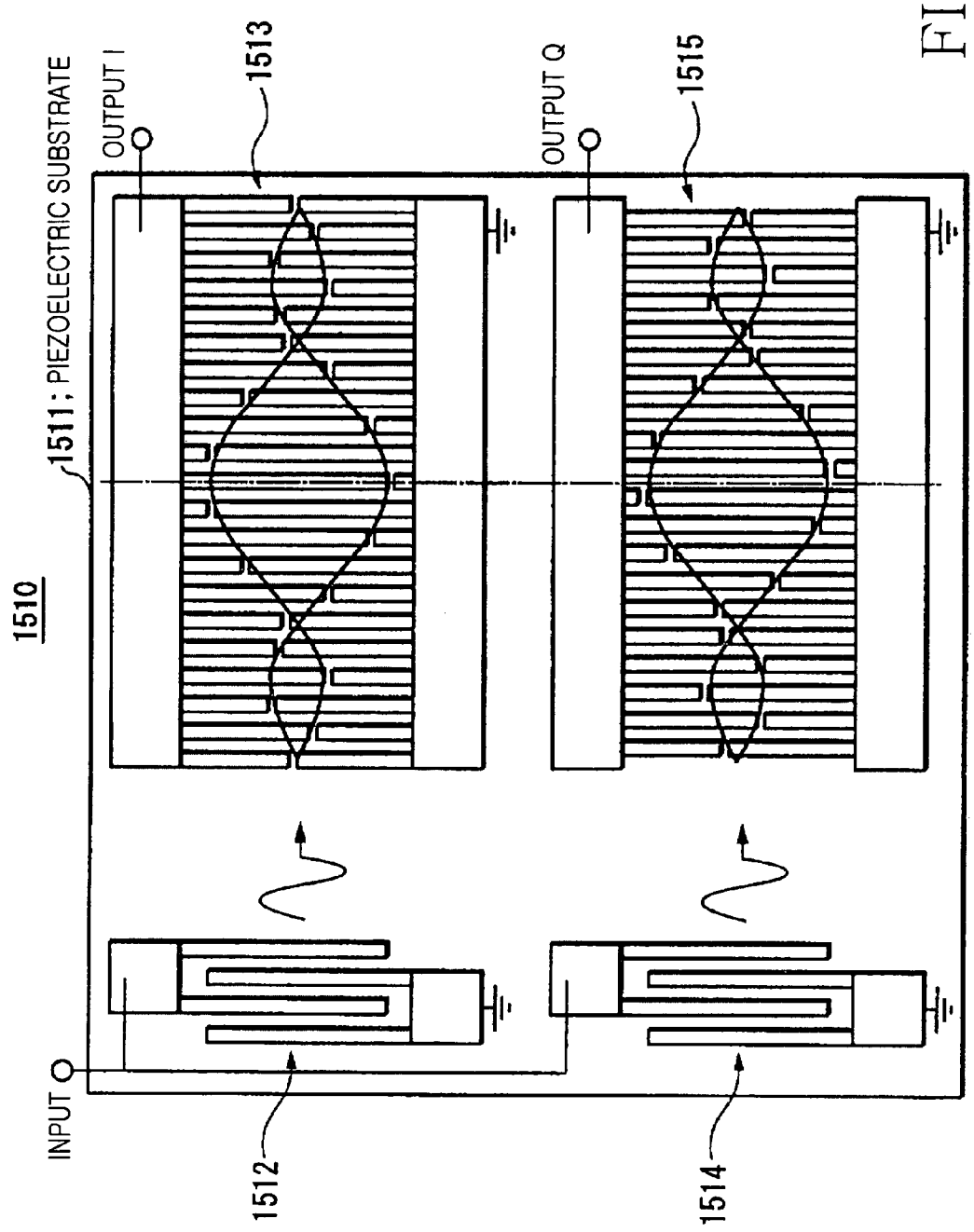
FIG. 42 illustrates a structure of SAW Filter 1 applied to a complex-coefficient SAW filter in the embodiment of the downconverter of the zero-IF scheme and the quasi-zero-IF scheme in accordance with the present invention.

FIG. 42 illustrates a structure of the SAW filter used in the complex-coefficient SAW filter 515 of the IF generator 55 provided in the downconverter 42 of FIG. 41. Because the principle of the SAW filter is the same as described above, its description is omitted here. Next, only the structure and operation of the SAW filter used in the downconverter 42 will be described.

A SAW filter 1510 is configured by a piezoelectric substrate 1511 and IDTs 1512 to 1515 in which an intersection width is different according to a position on the piezoelectric substrate 1511. When the IDTs 1512 and 1514 connected to an input terminal receive an impulse electric signal, they are mechanically distorted and SAWs are excited and propagated to the left and right directions of the piezoelectric substrate 1511. The IDT 1513 is connected to an output terminal I for outputting a real axis component and is located in a position capable of receiving the SAW from the IDT 1512. The IDT 1515 is connected to an output terminal Q for outputting an imaginary axis component and is located in a position capable of receiving the SAW from the IDT 1514. To perform a weighting operation mapped to an impulse response of a real part (i.e., an even-symmetric impulse response) the IDT 1513, connected to the output terminal I for outputting a real axis component, is provided with an electrode finger such that even symmetry is made with respect to the envelope center. To perform a weighting operation mapped to an impulse response of an imaginary part (i.e., an odd-symmetric impulse response) the IDT 1515, connected to the output terminal Q for outputting an imaginary axis component, is provided with an electrode finger such that odd symmetry is made with respect to the envelope center. According to this structure, a real RF signal can be converted to a complex RF signal with a phase difference of 90 degrees between the real part and the imaginary part.

Next, the operation of the SAW filter 1510 will be described. First, when a real RF signal is input to the input terminal, SAWs are excited in the IDTs 1512 and 1514 and SAW signals are propagated. The SAW signals, propagated from the IDTs 1512 and 1514, are received by the IDTs 1513 and 1515 located in propagation directions of the SAW signals. A convolution integral is performed on the basis of impulse responses mapped to the SAW signals, such that they are converted to electric signals. The IDT 1513 outputs a real component of the RF signal from the output terminal I, and the IDT 1515 outputs an imaginary component of the RF signal from the output terminal Q. When a convolution integral is performed for a complex RF signal and impulse responses illustrated in FIGS. 39 and 40, a real RF signal is output while a negative frequency band of the complex RF signal is suppressed.

Figure 43:
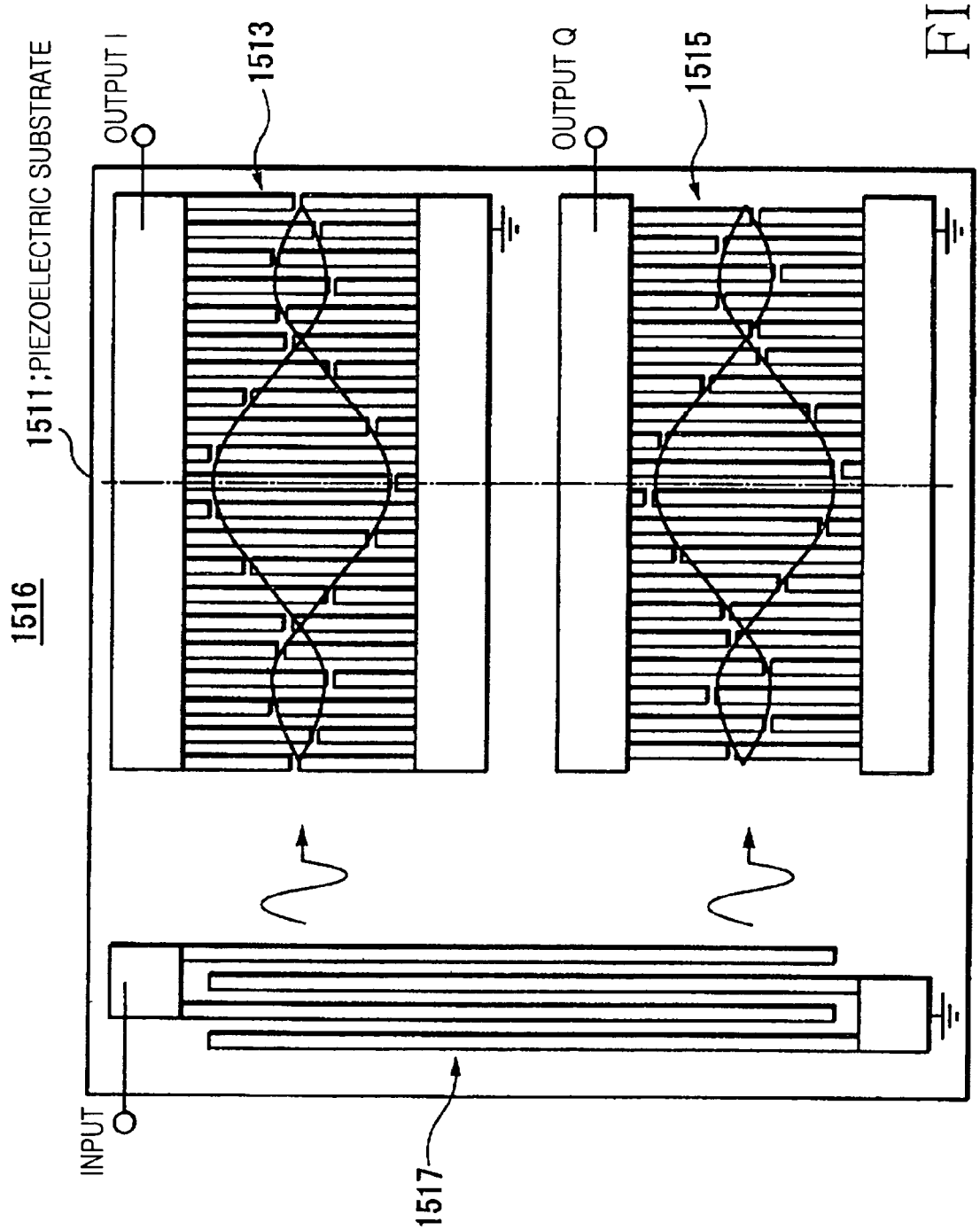
FIG. 43 illustrates a structure of SAW Filter 2 applied to a complex-coefficient SAW filter in the embodiment of the downconverter of the zero-IF scheme and the quasi-zero-IF scheme in accordance with the present invention.
Figure 44:
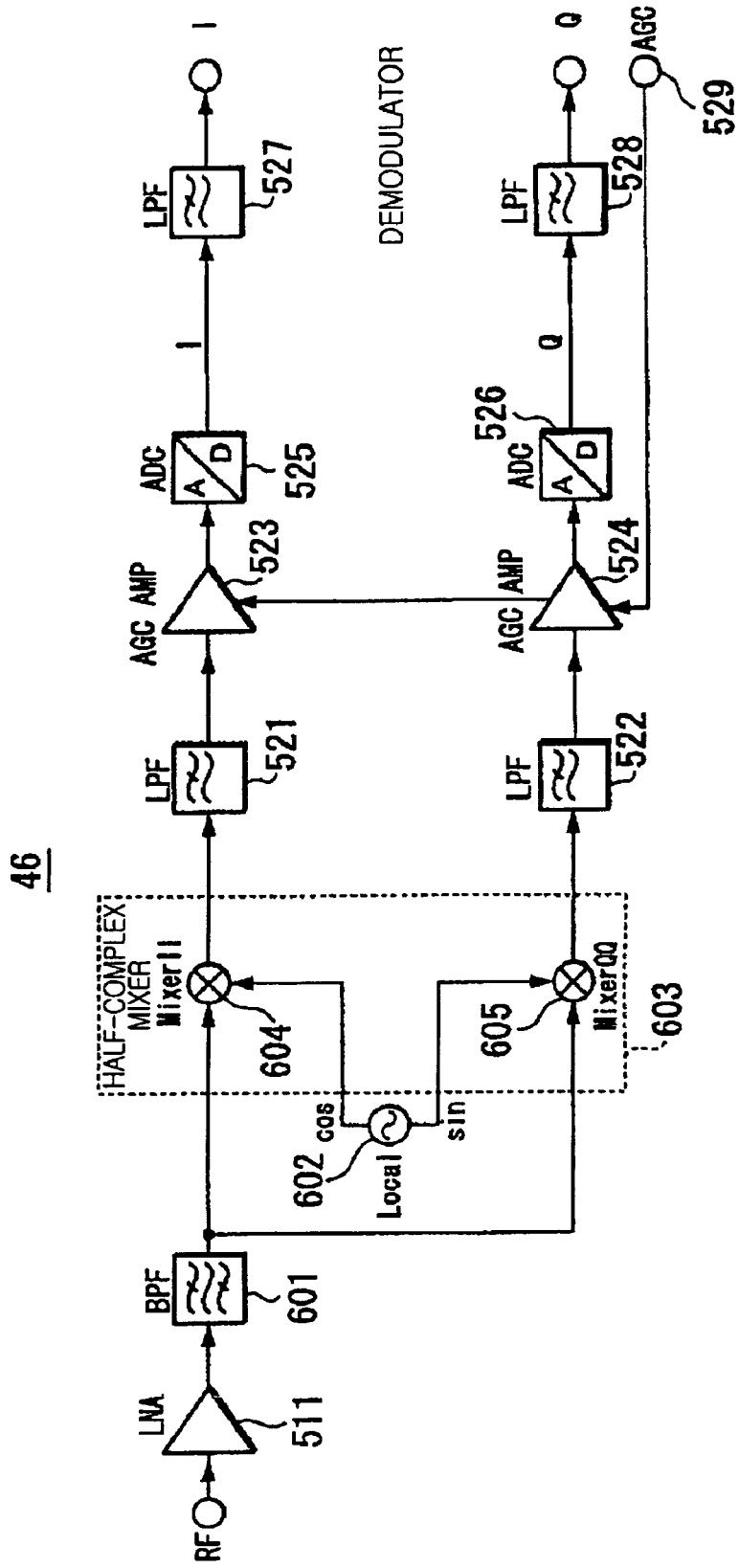
FIG. 44 illustrates a structure of a conventional downconverter of the zero-IF scheme.
Figure 45:
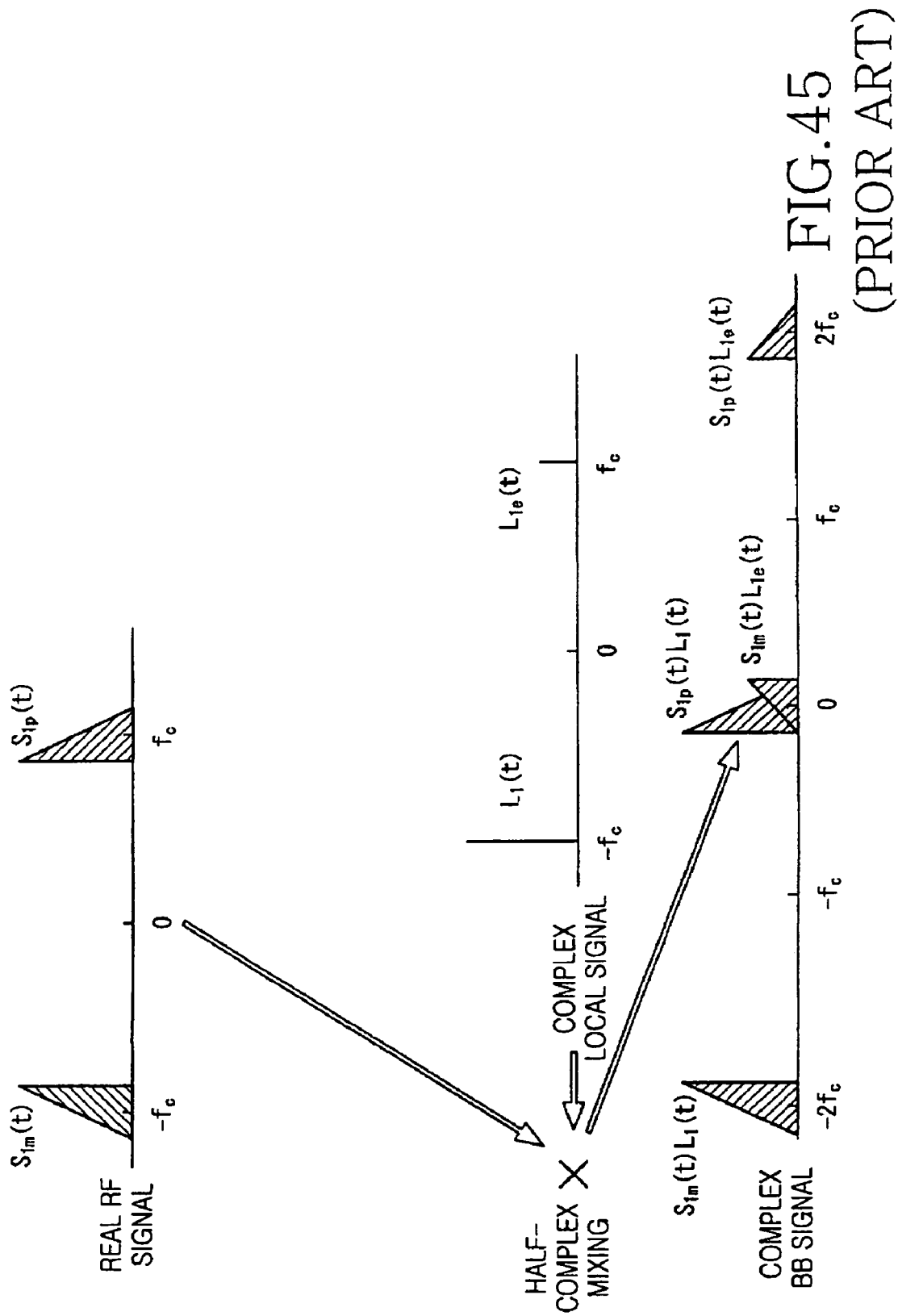
FIG. 45 illustrates a mixing process of the conventional downconverter of the zero-IF scheme.
Figure 46:
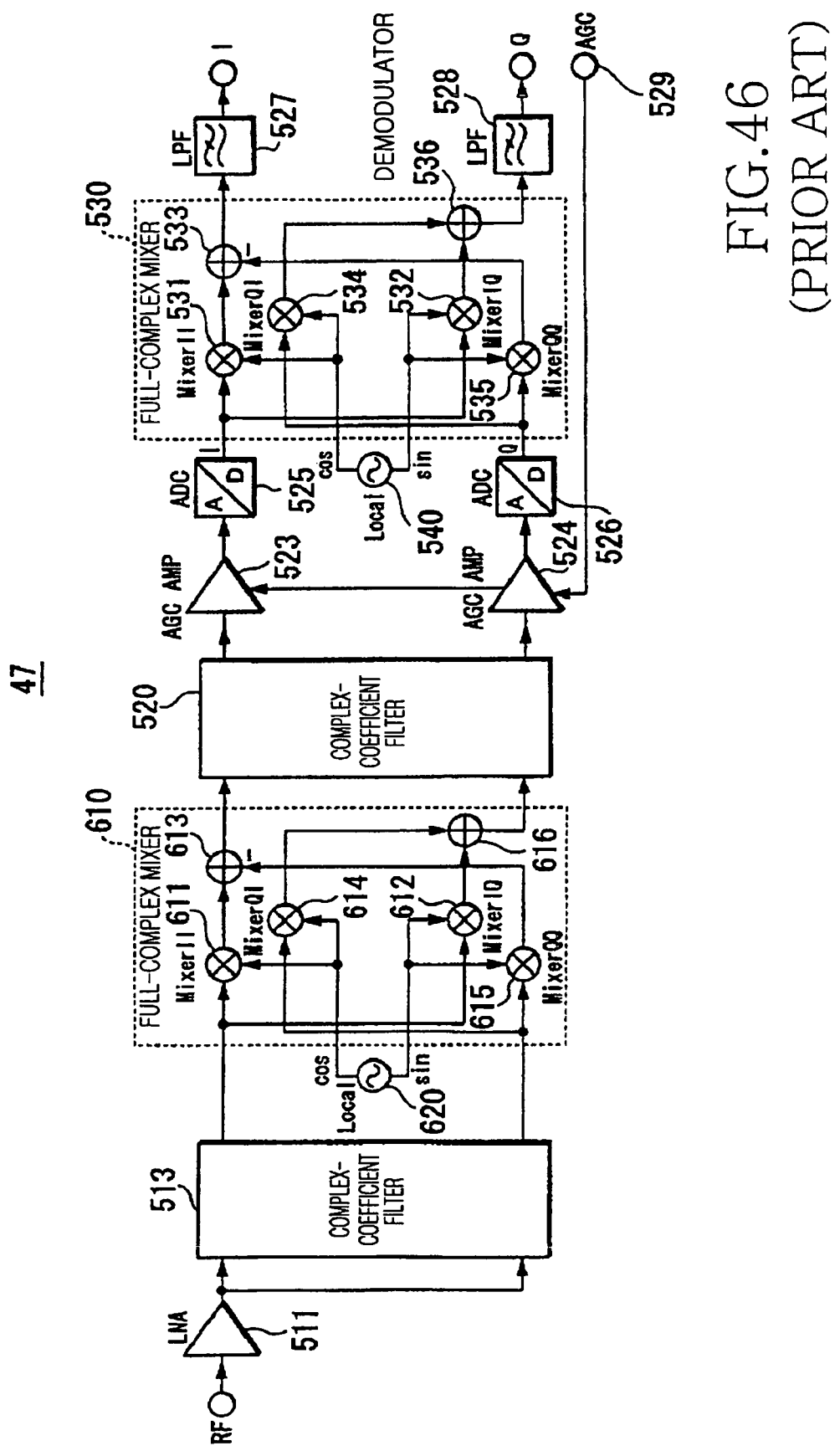
FIG. 46 illustrates a structure of a conventional image-rejection downconverter.
Figure 47:
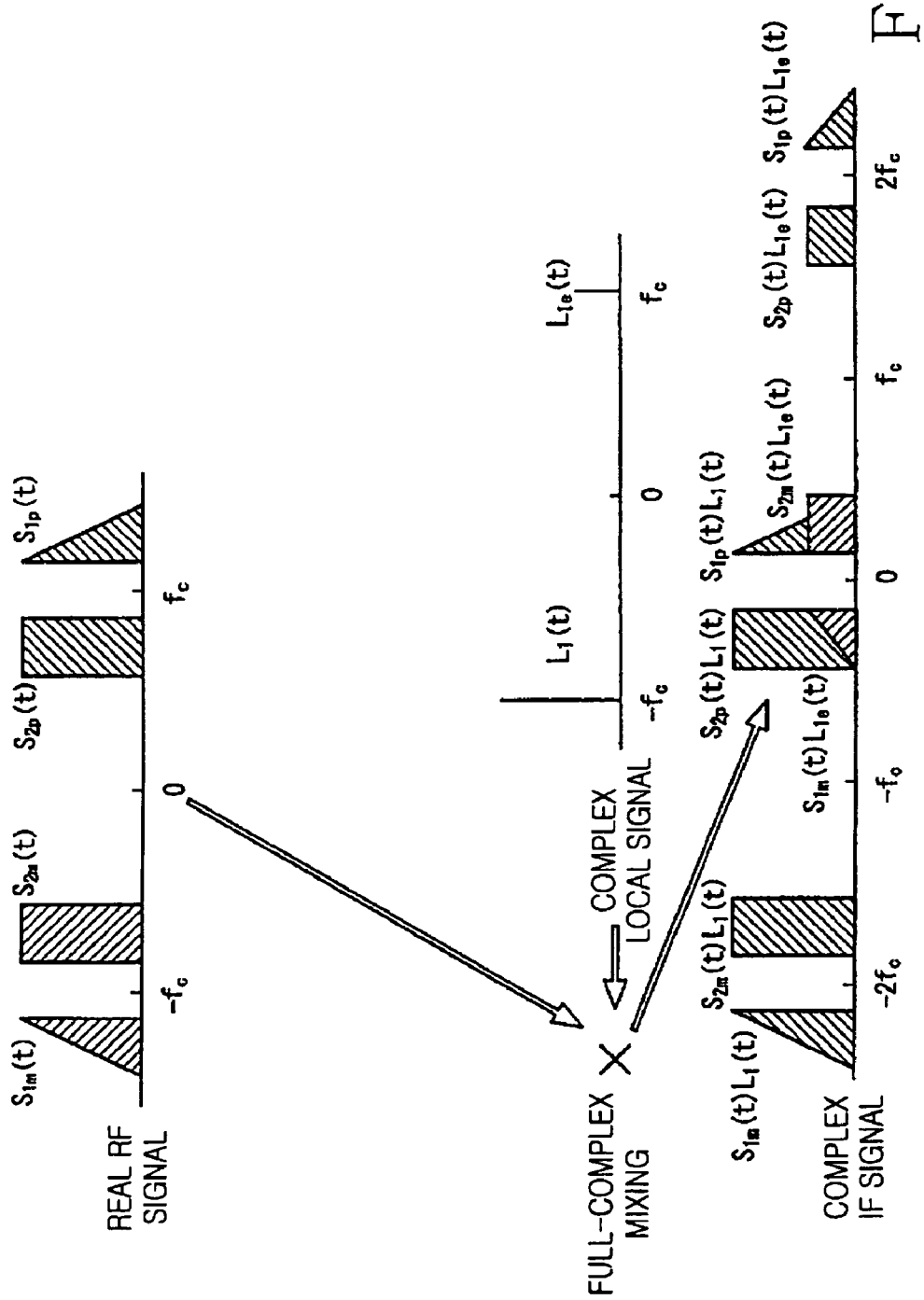
FIG. 47 illustrates Mixing Process 1 of the conventional image-rejection downconverter.
Figure 48:
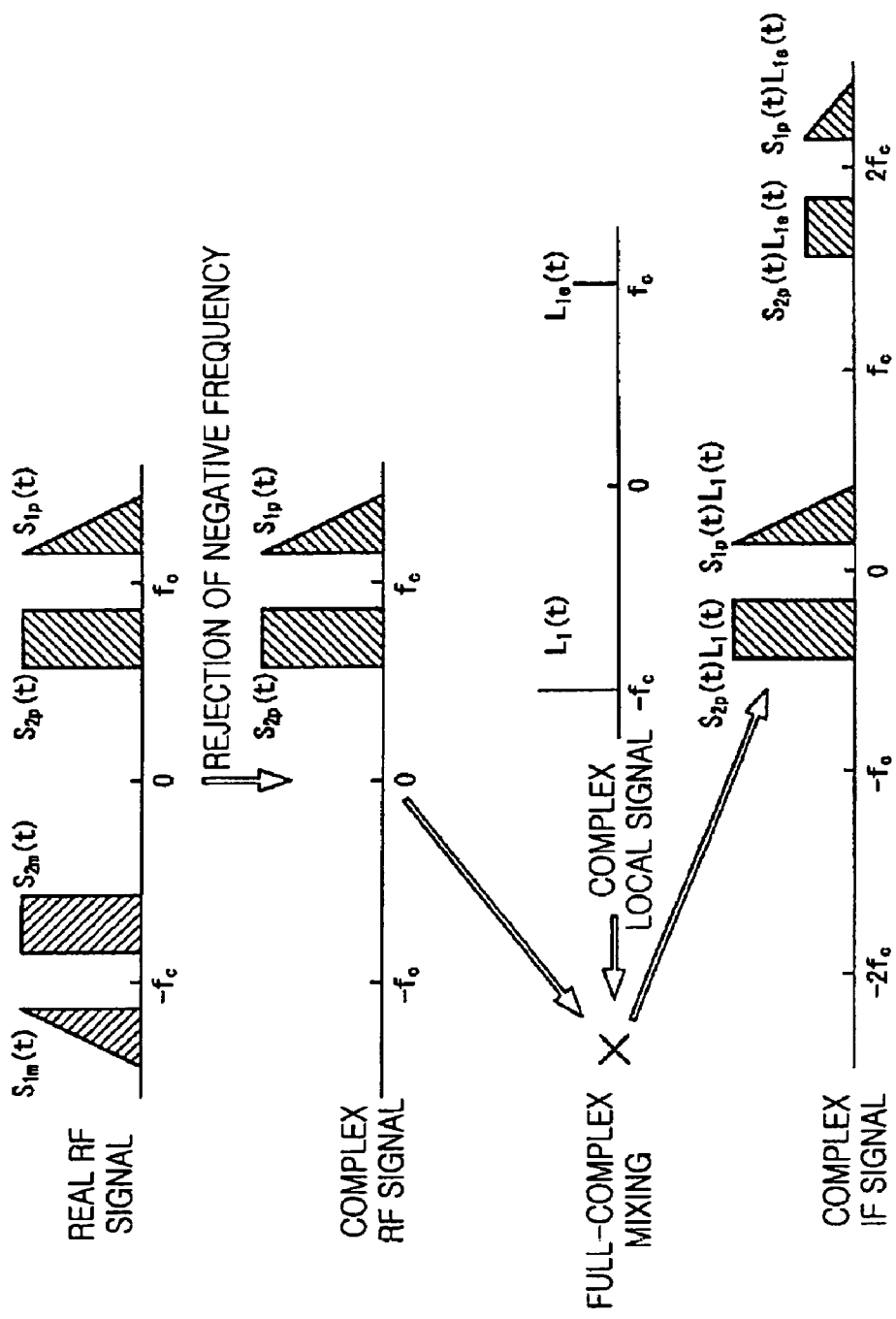
FIG. 48 illustrates Mixing Process 2 of the conventional image-rejection downconverter.
Figure 49:
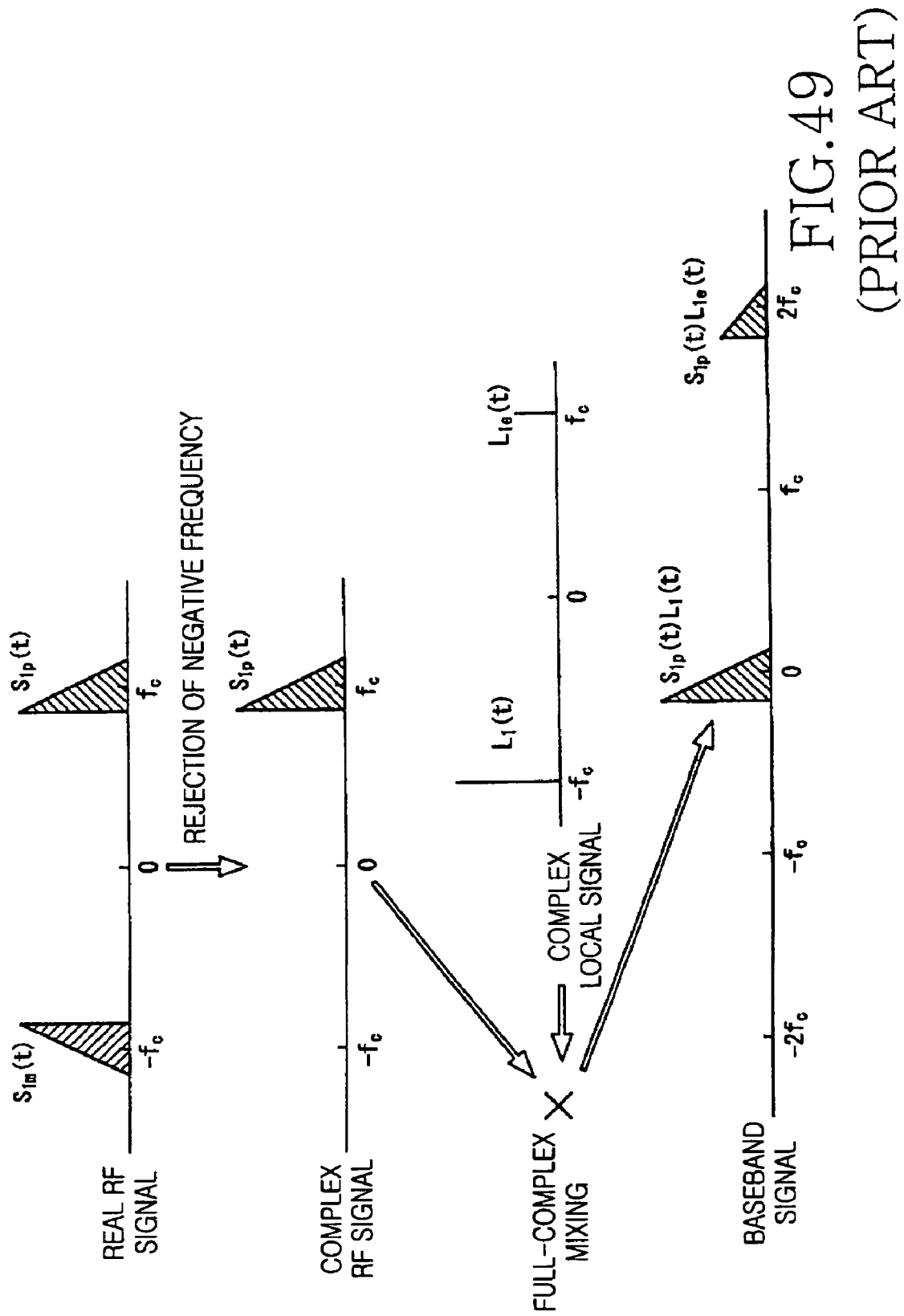
FIG. 49 illustrates Mixing Process 3 of the conventional image-rejection downconverter.

The SAW filter can be implemented by the structure as illustrated in FIG. 43. Because a SAW filter 1516 of FIG. 43 is provided with an IDT 1517 of an input side placed across both propagation paths of IDTs 1513 and 1515, the SAW filter 1516 of FIG. 43 is different from the SAW filter of FIG. 42 provided with the two IDTs 1512 and 1514 on an input side. According to this structure, one IDT can be provided in the input side.

The operation of the downconverter 42 illustrated in FIG. 41 will be described. First, the operation of the zero-IF scheme will be described. In the zero-IF scheme, the switch controller 550 first sets a frequency of a signal output from the local oscillator 503 to a value corresponding to a frequency of an input RF signal. The switch controller 550 controls the changeover switches 545 and 546 to be connected to TSI1 and TSQ1. At this time, the full-complex mixer 530 is stopped.

The LNA 511 of the IF generator 55 receives an RF signal of a real signal from an antenna and amplifies and outputs the received RF signal. The complex-coefficient SAW filter 515 converts the real RF signal amplified and output by the LNA 511 to a complex RF signal configured by real and imaginary axis components with a phase difference of 90 degrees. The complex-coefficient SAW filter 515 outputs the complex RF signal to the half-complex mixer 517. Here, a pass bandwidth of the complex-coefficient SAW filter 515 is a radio system bandwidth.

The half-complex mixer 517 receives a real local signal with a frequency equal to the frequency of the RF signal input from the local oscillator 503, and multiplies the real local signal and a real axis component of the complex RF signal output from the complex-coefficient SAW filter 515 in the mixer-I 518. Moreover, the half-complex mixer 517 multiplies the real local signal and an imaginary axis component of the complex RF signal output from the complex-coefficient SAW filter 515 in the mixer-Q 519. As a result, the half-complex mixer 517 converts the complex RF signal to a complex baseband signal in which frequency zero is set as a center frequency, and outputs the complex baseband signal.

In the baseband generator 56, the LPFs 521 and 522 band-limit the complex baseband signal to a frequency band of a predetermined range based on the frequency zero and output the complex baseband signal to the AGC amplifiers 523 and 524. The AGC amplifiers 523 and 524 adjust the amplitude of the complex baseband signal to levels suitable for inputs to the ADCs 525 and 526. The AGC amplifiers 523 and 524 output a complex signal to the ADCs 525 and 526. The ADCs 525 and 526 convert an input signal to a digital signal and then output a complex baseband signal to the LPFs 527 and 528 through the changeover switches 545 and 546. The LPFs 527 and 528 remove a high frequency component of the complex baseband signal, and output a real axis component I and an imaginary axis component Q of the complex baseband signal to output terminals TOI and TOQ, respectively.

Next, the operation of the downconverter 42 in the quasi-zero-IF scheme will be described. In the quasi-zero-IF scheme, the switch controller 550 first sets a frequency of a signal output from the local oscillator 503 to a value separated by an offset frequency from a frequency of an input RF signal. The switch controller 550 controls the changeover switches 545 and 546 to be connected to TS12 and TSQ2.

The LNA 511 amplifies an RF signal of a real signal input to an input terminal TRF from an antenna and outputs the real RF signal. The complex-coefficient SAW filter 515 to which an associated signal is input rejects a negative frequency component of the real RF signal output from the LNA 511, performs conversion to a complex RF signal configured by real and imaginary axis components with a phase difference of 90 degrees, and outputs the complex RF signal to the half-complex mixer 517. The half-complex mixer 517 receives a real local signal of a frequency separated by an offset frequency from a frequency of an RF signal output from the local oscillator 503, and multiplies the real local signal and a real axis component of a complex RF signal output from the complex-coefficient SAW filter 515 in the mixer-I 518. Moreover, the half-complex mixer 517 multiplies the real local signal and an imaginary axis component of the complex RF signal output from the complex-coefficient SAW filter 515 in the mixer-Q 519. As a result, the half-complex mixer 517 converts the complex RF signal to a complex IF signal in which frequency zero is set as a center frequency, and outputs the complex IF signal.

In the baseband generator 56, the LPFs 521 and 522 band-limit the complex IF signal to a frequency band of a predetermined range based on the frequency zero and output the complex IF signal to the AGC amplifiers 523 and 524. The AGC amplifiers 523 and 524 adjust the amplitude of a complex baseband signal to levels suitable for inputs to the ADCs 525 and 526. The AGC amplifiers 523 and 524 output the complex signal to the ADCs 525 and 526. The ADCs 525 and 526 convert an input signal to a digital signal and then output the digital signal to the full-complex mixer 530.

The full-complex mixer 530 performs a frequency conversion process in which the center frequency is set to frequency zero for a real axis component S43CI and an imaginary axis component S43CQ of a complex signal S43C according to a real axis local cos signal and an imaginary axis local sin signal of a complex local signal output from the local oscillator 540, and outputs a complex baseband signal to the LPFs 527 and 528 through the changeover switches 545 and 546. The LPFs 527 and 528 remove a high frequency component of the complex baseband signal, and output a real axis component I and an imaginary axis component Q of the complex baseband signal to output terminals TOI and TOQ, respectively.

The structure of the downconverter 42 can perform both the zero-IF scheme and the quasi-zero-IF scheme in a small space. Consequently, both the zero-IF scheme and the quasi-zero-IF scheme can be applied in a mobile terminal and other devices where the available space is very limited.

In the downconverter 42, EVM-related degradation may occur due to an error between I and Q signals occurring in the LPFs 521 and 522 and the ADCs 525 and 526. This error is not associated with the operation of the complex-coefficient SAW filter 515 and the full-complex mixer 530. The EVM-related degradation can be avoided by employing means for compensating for the error between the I and Q signals according to a conventional digital signal process.

V. Embodiment of Upconverter Based on Zero-IF Scheme and Quasi-Zero-IF Scheme

Figure 53:
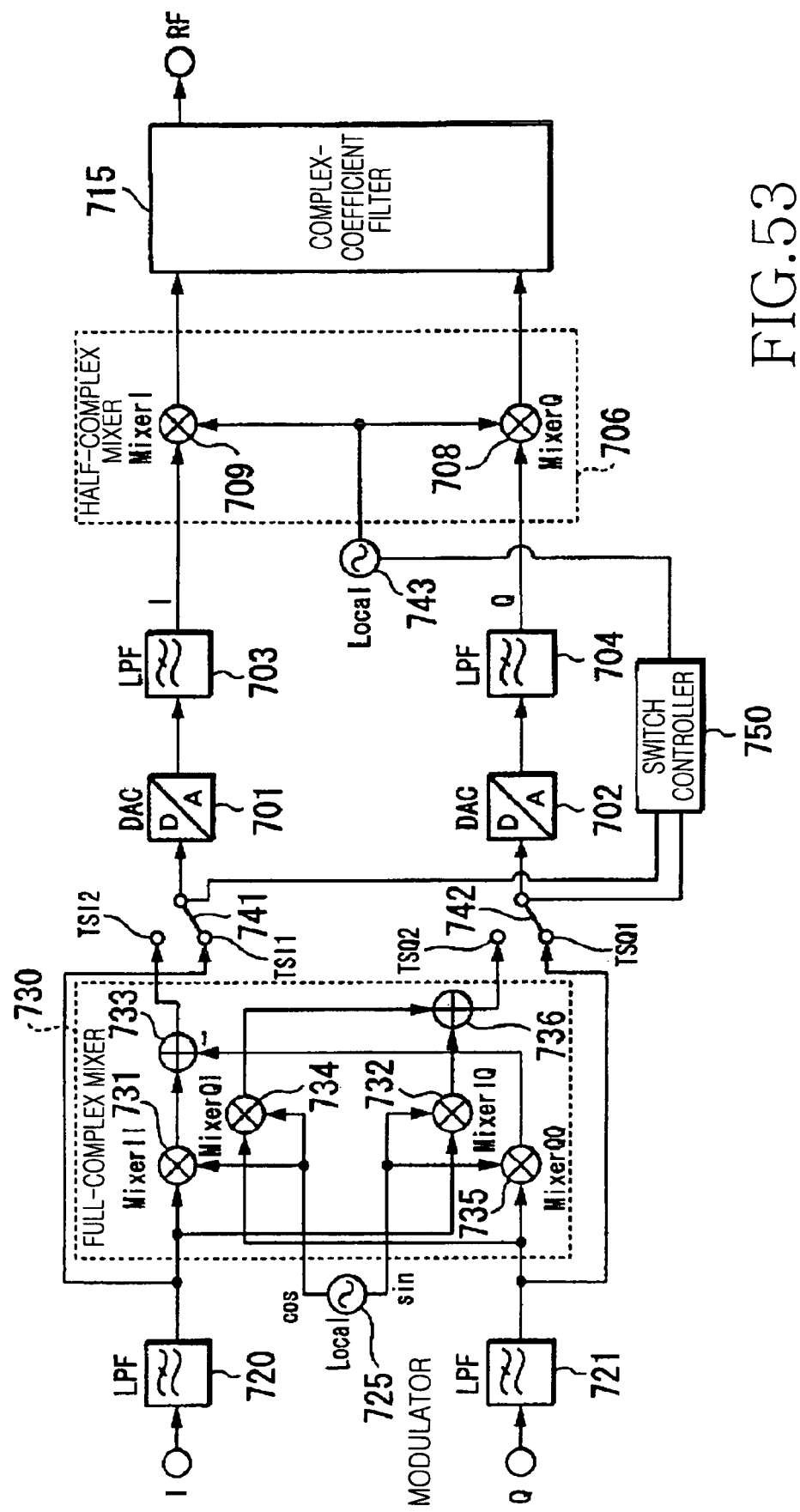
FIG. 53 illustrates an embodiment of an upconverter of the zero-IF scheme and the quasi-zero-IF scheme in accordance with the present invention.

Next, an embodiment of an upconverter based on a zero-IF scheme and a quasi-zero-IF scheme in the present invention will be described with reference to the accompanying drawings. FIG. 53 illustrates an upconverter 62 in accordance with an embodiment of the present invention. The upconverter 62 is provided with functions of both the upconverter 60 of the zero-IF scheme and the upconverter 61 of the quasi-zero-IF scheme. The upconverter 62 is provided with a local oscillator 743 capable of outputting a real local signal with a frequency mapped to the zero-IF scheme and a real local signal with a frequency mapped to the quasi-zero-IF scheme. The upconverter 62 can perform an operation for switching between the zero-IF scheme and the quasi-zero-IF scheme through changeover switches 741 and 742. The upconverter 62 is provided with a complex-coefficient SAW filter 715 as an embodiment of the complex-coefficient filter 710 connected to the half-complex mixer 706. The components with the same functions in the upconverter 62 of FIG. 53, the upconverter 60 of FIG. 50, and the upconverter 61 of FIG. 52 are denoted by the same reference numerals, and their description is omitted here.

The upconverter 62 has the following structure to perform the functions of both the upconverters 60 and 61. That is, an LPF 720 connected to an input terminal TI and an LPF 721 connected to an input terminal TQ are branched from their output terminals. One side is connected to a full-complex mixer 730 and the other side is connected to switching points TSI1 and TSQ1. Output terminals of the full-complex mixer 730 are connected to switching points TS12 and TSQ2 of the changeover switches 741 and 742.

The upconverter 62 is provided with a switch controller 750. The switch controller 750 controls an operation for switching between the zero-IF scheme and the quasi-zero-IF scheme. The switch controller 750 is connected to the local oscillator 743 and switching element terminals of the changeover switches 741 and 742. When a frequency output from the local oscillator 743 is mapped to the zero-IF scheme, the switch controller 750 controls the changeover switches 741 and 742 to be connected to the switching points TSI1 and TSQ1. When a frequency output from the local oscillator 743 is mapped to the quasi-zero-IF scheme, the switch controller 750 controls the changeover switches 741 and 742 to be connected to the switching points TS12 and TSQ2.

Figure 54:
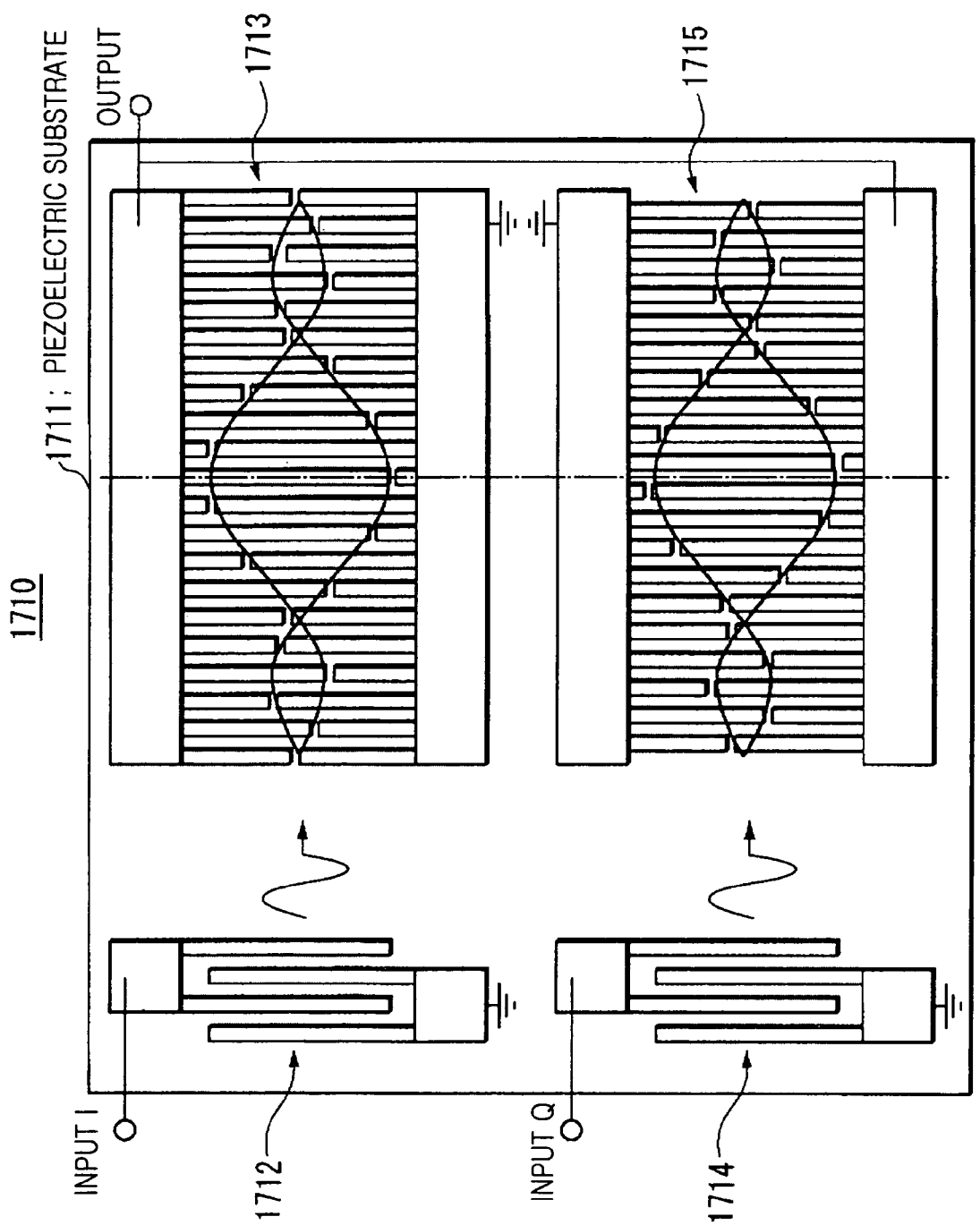
FIG. 54 illustrates a structure of SAW Filter 1 applied to a complex-coefficient SAW filter in the embodiment of the upconverter of the zero-IF scheme and the quasi-zero-IF scheme in accordance with the present invention.

FIG. 54 illustrates a structure of the SAW filter used in the complex-coefficient SAW filter 715 provided in the upconverter 62 of FIG. 53. Because the principle of the SAW filter is the same as described above, its description is omitted here. Next, only the structure and operation of the SAW filter as used in the upconverter 62 will be described.

A SAW filter 1710 illustrated in FIG. 54 is provided with four IDTs 1712 to 1715 that have two propagation paths on a piezoelectric substrate 1711. To perform a weighting operation mapped to an impulse response of a real part (i.e., an even-symmetric impulse response) the IDT 1713, connected to an output terminal I for outputting a real axis component, is provided with an electrode finger such that even symmetry is made with respect to the envelope center. To perform a weighting operation mapped to an impulse response of an imaginary part (i.e., an odd-symmetric impulse response) the IDT 1715, connected to an output terminal Q for outputting an imaginary axis component, is provided with an electrode finger such that odd symmetry is made with respect to the envelope center. The IDT 1713 is connected to the output terminal, and is provided on a propagation path of the IDT 1712. The IDT 1715 is connected to the output terminal, and is provided on a propagation path of the IDT 1714. According to the above-described structure, SAWs excited from the IDTs 1712 and 1714 of an input side are received in the IDTs 1713 and 1715, and are output from the IDTs 1713 and 1715 at a phase difference of 90 degrees. The IDTs 1713 and 1715 are connected to each other such that phases are opposite to each other. According to this structure, an imaginary component is subtracted from a real component, such that a real RF signal is output from the output terminal.

Similarly, a real RF signal can be output even when the IDTs 1713 and 1715 for which a weighting operation mapped to an impulse response is performed are connected to the input terminals and the IIDTs 1712 and 1714 are connected to the output terminal.

Next, the operation of the SAW filter 1710 will be described. First, when a complex RF signal is input to the input terminals, SAWs are excited in the IDTs 1712 and 1714 and SAW signals are propagated. The SAW signals propagated from the IDTs 1712 and 1714 are received by the IDTs 1713 and 1715 located in propagation directions of the SAW signals. A convolution integral is performed on the basis of impulse responses mapped to the SAW signals, such that they are converted to electric signals. At this time, the IDT 1713 outputs a real component of the complex RF signal, and the IDT 1715 outputs an imaginary component of the complex RF signal whose polarity is inverted. The output terminal outputs a real RF signal obtained by subtracting the imaginary component from the real component of the complex RF signal. When a convolution integral is performed for a complex RF signal and impulse responses illustrated in FIGS. 39 and 40, a real RF signal can be output while a negative frequency band of the complex RF signal is suppressed.

Figure 55:
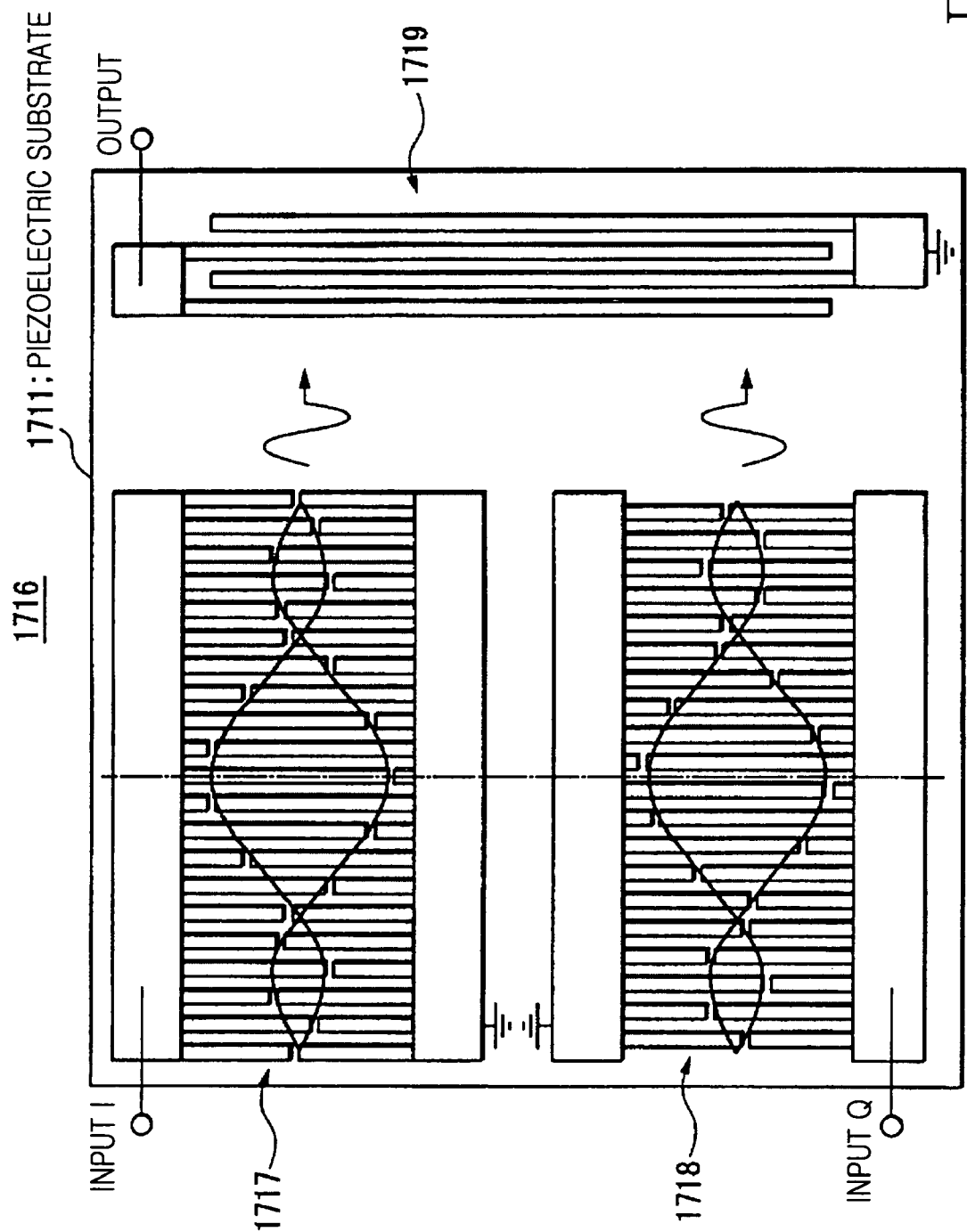
FIG. 55 illustrates a structure of SAW Filter 2 applied to a complex-coefficient SAW filter in the embodiment of the upconverter of the zero-IF scheme and the quasi-zero-IF scheme in accordance with the present invention.
Figure 56:
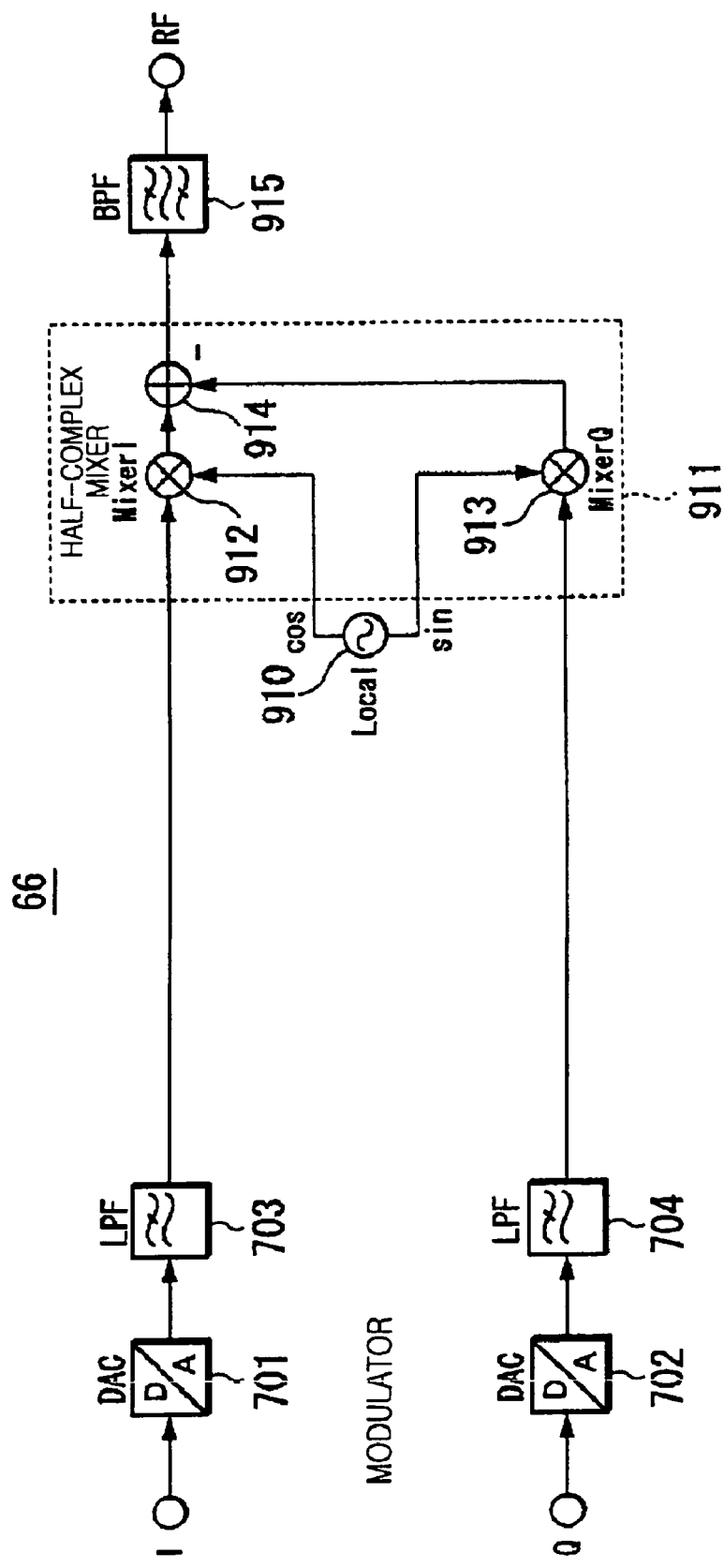
FIG. 56 illustrates a structure of a conventional upconverter of the zero-IF scheme.
Figure 57:
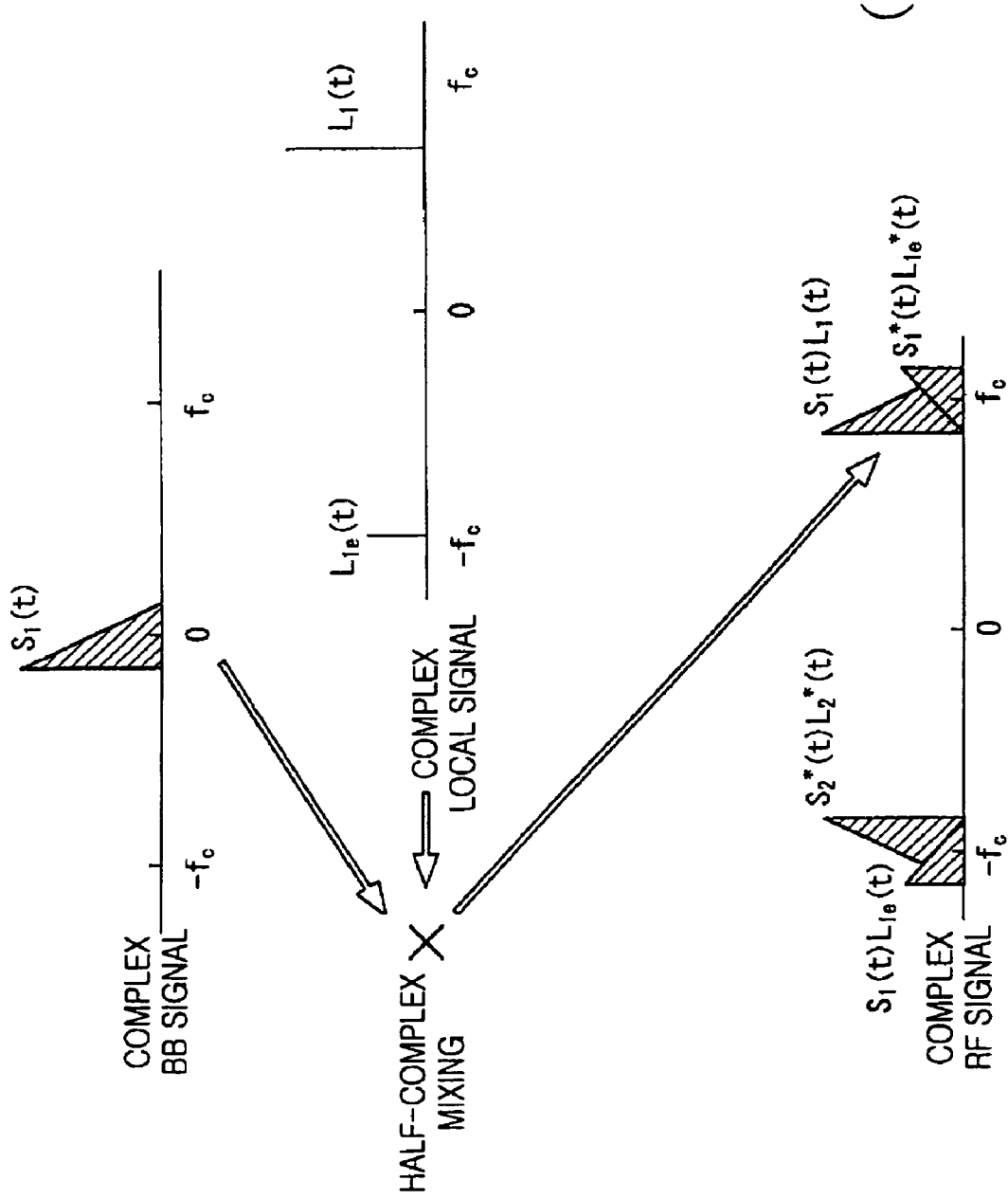
FIG. 57 illustrates a mixing process of the conventional upconverter of the zero-IF scheme.
Figure 58:
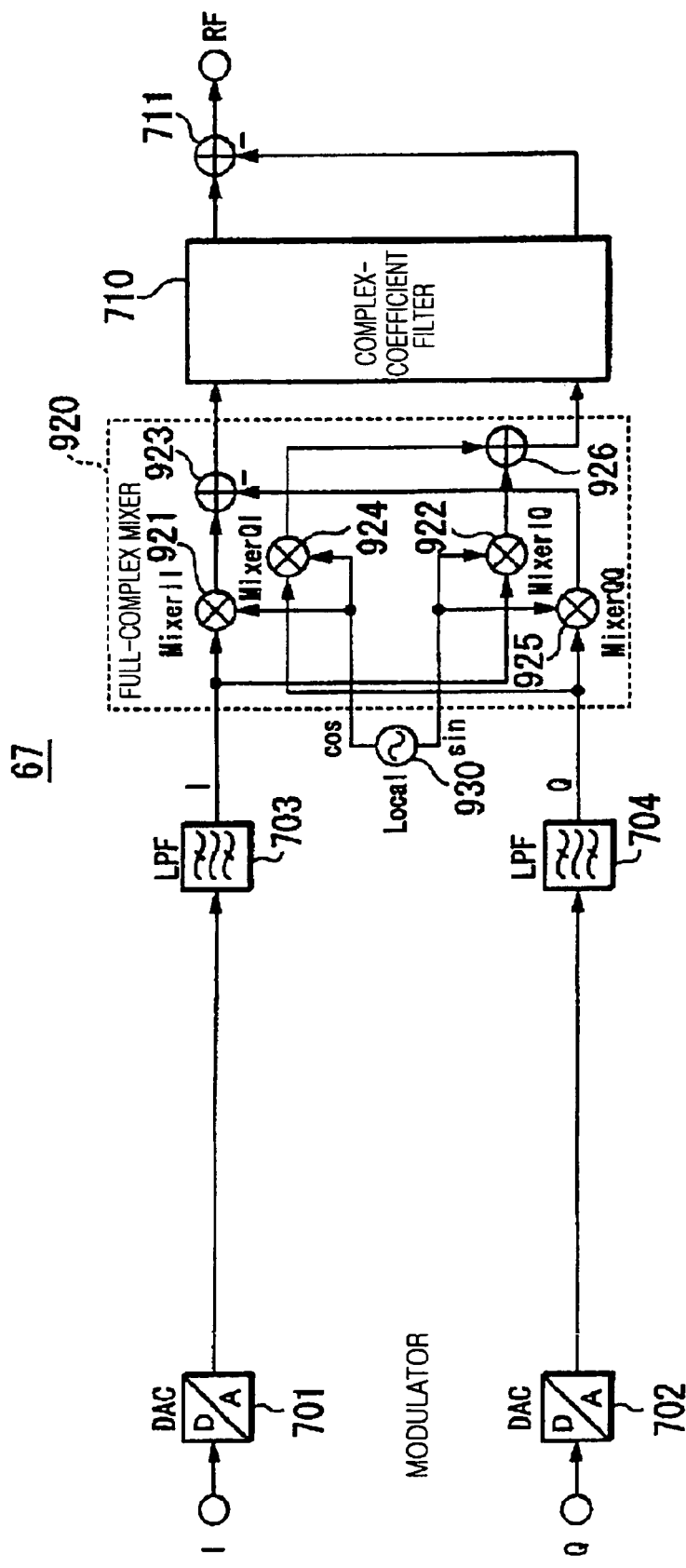
FIG. 58 illustrates a structure of a conventional upconverter of the zero-IF scheme with a complex-coefficient filter.
Figure 59:
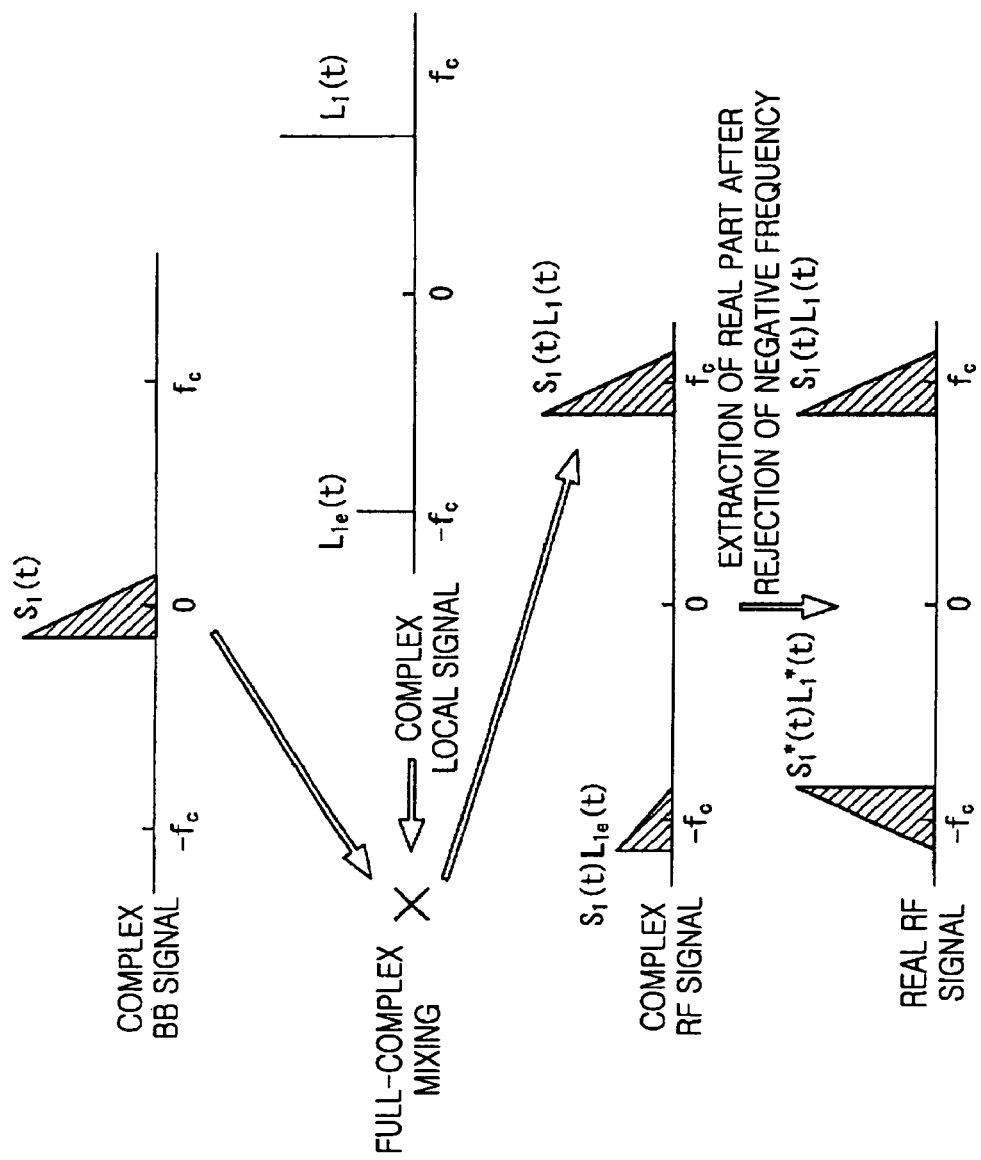
FIG. 59 illustrates a mixing process of the conventional upconverter of the zero-IF scheme with the complex-coefficient filter.

In FIG. 54, the two IDTs 1713 and 1715 for which a weighting operation for an impulse response is performed are provided in an output terminal side. In a SAW filter 1716 illustrated in FIG. 55, IDTs 1717 and 1718 for which a weighting operation for an impulse response is performed are connected to an output terminal of an output side in which one IDT 1719 is placed across propagation paths of the IDTs 1717 and 1718. Because the polarity of an output of the IDT 1718 mapped to the imaginary part of the input side of FIG. 55 is inverted, a subtraction process can be realized in the IDT 1719. The inverse of the polarity is not limited to the IDT 1718 of the imaginary part. Alternatively, the polarity of the IDT 1717 of the real part may be inverted. In this structure, one IDT on the output terminal side is sufficient.

The operation of the upconverter 62 illustrated in FIG. 53 will be described. First, the operation of the zero-IF scheme will be described. In the zero-IF scheme, the switch controller 750 first sets a frequency of a signal output from the local oscillator 743 to a value corresponding to a frequency of an output RF signal. The switch controller 750 controls the changeover switches 741 and 742 to be connected to TSI1 and TSQ1. At this time, the full-complex mixer 730 is stopped.

After a high-frequency component is removed in LPFs 720 and 721, real and imaginary components of digital signals input from input terminals TI and TQ are converted to analog signals in the DACs 701 and 702, such that a complex signal is generated. LPFs 703 and 704 remove a high-frequency component from the complex signal.

The half-complex mixer 706 frequency-converts the complex signal on the basis of a real local signal with a frequency equal to an RF signal frequency of cos or sin input from the local oscillator 743, and outputs a complex RF signal with the RF signal frequency to the complex-coefficient SAW filter 715.

The complex-coefficient filter 715 generates real and imaginary axis components of the complex RF signal while rejecting a negative frequency of the input complex RF signal. Moreover, the complex-coefficient filter 715 extracts a real RF signal by subtracting the imaginary axis component from the real axis component. Here, a pass bandwidth of the complex-coefficient filter 715 is a radio system bandwidth.

Next, the operation of the upconverter 62 in the quasi-zero-IF scheme will be described. In the quasi-zero-IF scheme, the switch controller 750 first sets a frequency of a signal output from the local oscillator 743 to a value separated by an offset frequency from a frequency of an input RF signal. The switch controller 750 controls the changeover switches 741 and 742 to be connected to TSI2 and TSQ2. After a high-frequency component is removed in the LPFs 720 and 721, real and imaginary components of digital signals input from input terminals TI and TQ are output to the full-complex mixer 730.

The full-complex mixer 730 performs a frequency conversion process in which an offset frequency is set to a center frequency for an input complex signal according to a real axis local cos signal and an imaginary axis local sin signal of a complex local signal output from a local oscillator 725, and then outputs a complex IF signal to the DACs 701 and 702.

The complex IF signal output from the fill-complex mixer 730 is converted to an analog signal in the DACs 701 and 702. The complex IF signal based on the analog signal is generated and output to the LPFs 703 and 704. After a high-frequency component is removed in the LPFs 703 and 704, the complex IF signal is output to the half-complex mixer 706.

The half-complex mixer 706 frequency-converts the complex IF signal on the basis of a real local signal with a frequency separated by an offset frequency from an RF signal frequency in a real signal of cos or sin input from the local oscillator 742. Moreover, the half-complex mixer 706 outputs a complex RF signal with the RF signal frequency to the complex-coefficient SAW filter 715.

The complex-coefficient SAW filter 715 subtracts an imaginary axis component from a real axis component of the complex RF signal while rejecting a negative frequency of the input complex RF signal, and extracts a real RF signal.

The structure of the upconverter 62 can perform both the zero-IF scheme and the quasi-zero-IF scheme in a small space. Consequently, both the zero-IF scheme and the quasi-zero-IF scheme can be applied in a mobile terminal or other device where the available space is very limited.

In the upconverter 62, an error occurs between I and Q signals in the DACs 701 and 702 and the LPFs 703 and 704. The error is not associated with an operation of the half-complex mixer 706 or the full-complex mixer 730. If an RF signal with an error is output without correction, the improvement can be made by compensating for an error between I and Q signals according to the conventional digital signal processing.

W. Broadband and Multi-Band Means in Downconverter

In a downconverter based on any one of the low-IF scheme, the zero-IF scheme, and the quasi-zero-IF scheme, a frequency band of an input real RF signal may exceed (be broader) that of a first-level complex-coefficient filter connected to an LNA. In this case, a broadband or multi-band structure for the downconverter is required.

There is provided a plurality of complex-coefficient filters with different frequency characteristics and means for switching the plurality of complex-coefficient filters using a switch as the broadband or multi-band means for the downconverter. Means can be provided for switching a total of a reception front-end, for switching only LNAs and complex-coefficient filters, and for switching LNAs, a complex-coefficient filter, and half-complex mixers as a switching part. The three switching means may be applied to the downconverter 40 of the zero-IF scheme. A broadband and multi-band downconverter of the present invention will be described.

The components with the same functions in the downconverter 40 and the broadband and multi-band downconverter are denoted by the same reference numerals. A structure for processing a high frequency band is provided in relation to a structure for processing a low band. A component for processing a high band is designated with an "a" suffix attached to reference numeral of a component for processing a low frequency band. For example, when a complex-coefficient filter and a half-complex mixer serving as components for processing the low frequency band are denoted by reference numerals 513 and 517, a complex-coefficient filter and a half-complex mixer serving as components for processing the high frequency band are denoted by reference numerals 513a and 517a.

Figure 62:
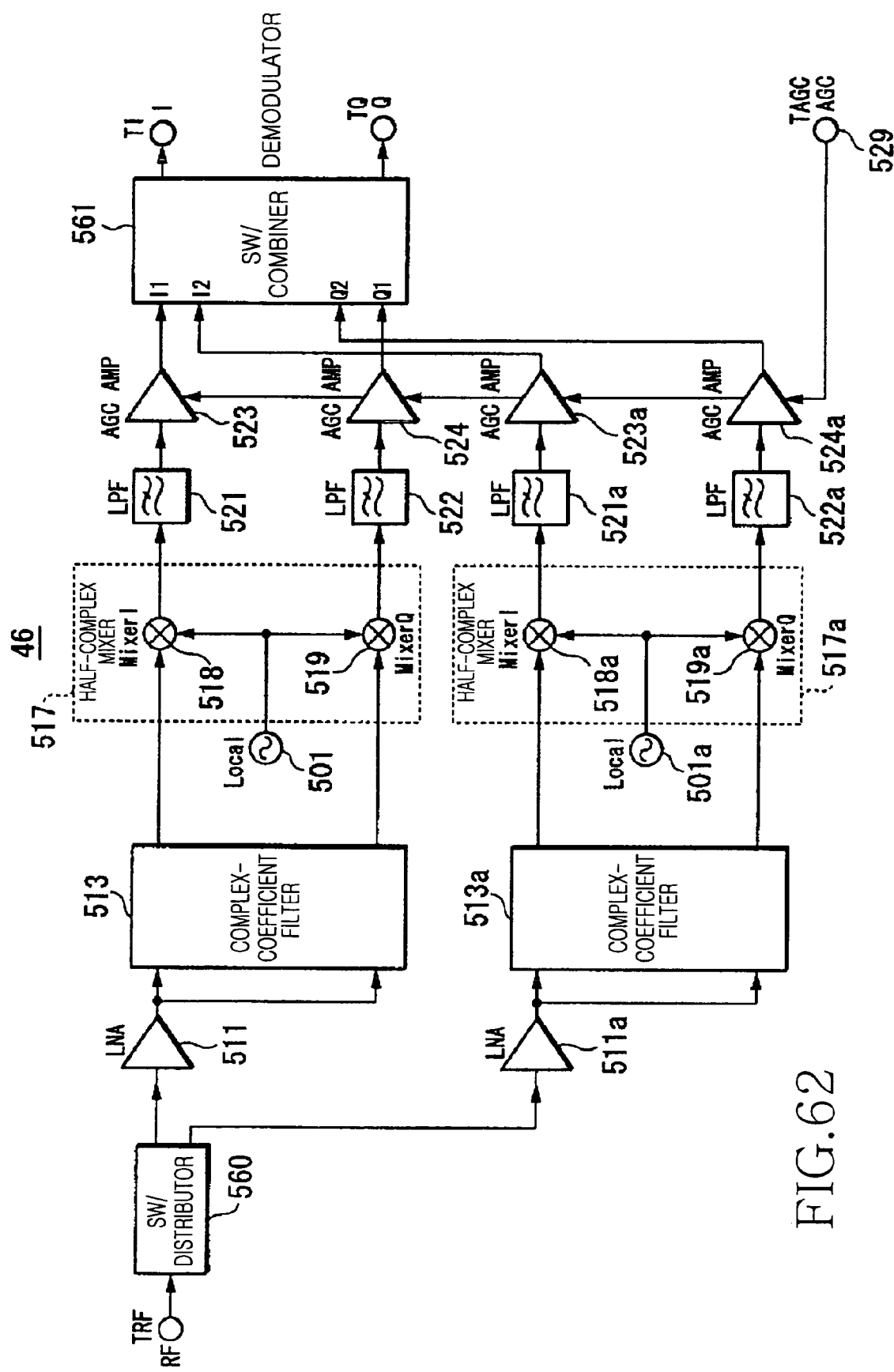
FIG. 62 illustrates Example 1 of the switching structure of the downconverter.

FIG. 62 illustrates a downconverter 46 with a structure in which the means for switching the total reception front-end is added to the downconverter 40. The downconverter 46 illustrated in FIG. 62 is provided with a switch 560 for distributing a signal between LNAs 511 and 511a and an input terminal TRF connected to an antenna. Moreover, the downconverter 46 is provided with a switch 561 for combining outputs of the AGC amplifiers 523, 524, 523a, and 524a between AGC amplifiers 523, 524, 523a, and 524a and output terminals TI and TQ. When a structure for switching the total reception front-end is provided, a structure including complex-coefficient filters and AGC amplifiers is increased twice, such that the cost and size are increased.

Figure 63:
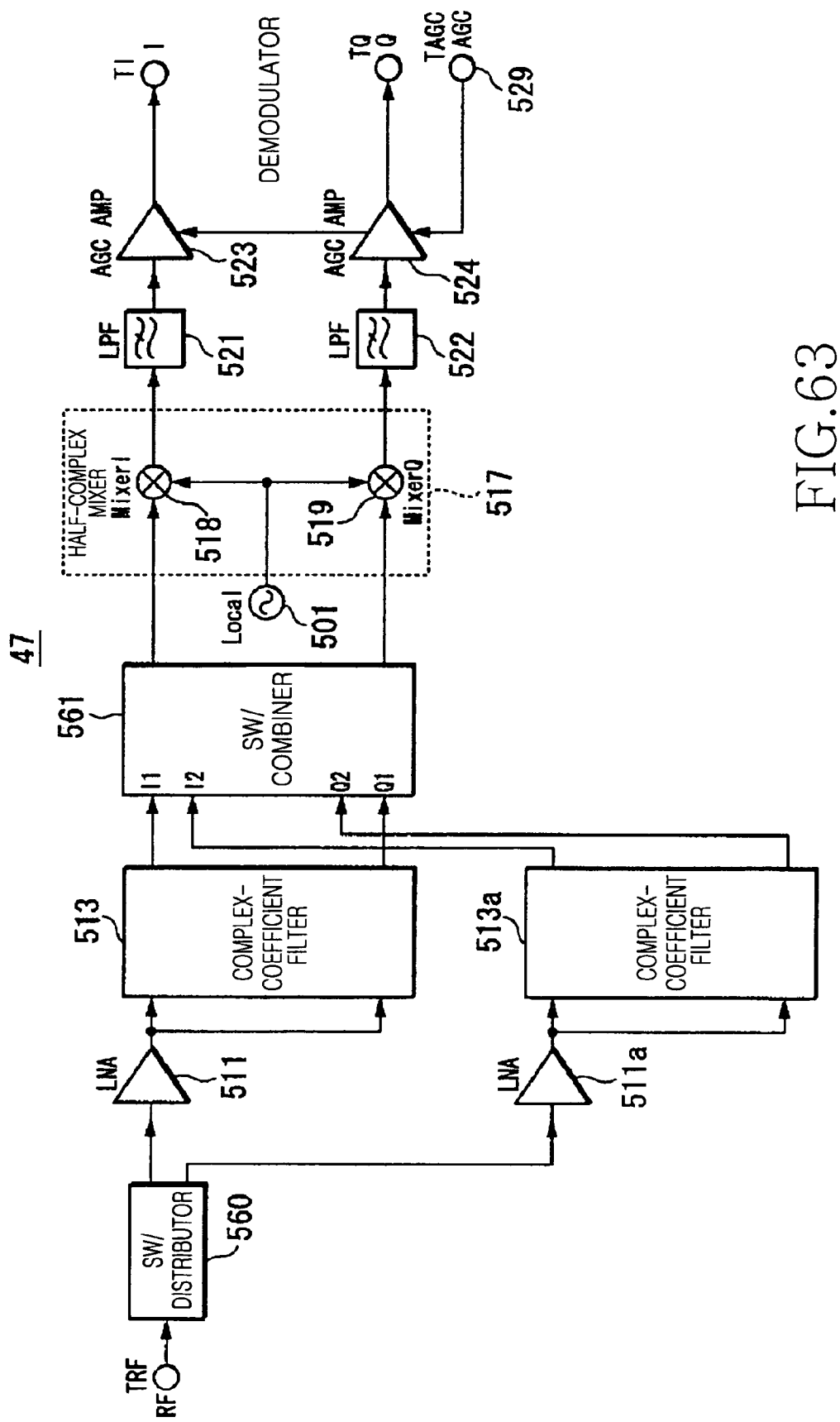
FIG. 63 illustrates Example 2 of the switching structure of the downconverter.

FIG. 63 illustrates a downconverter 47 with a structure in which the means for switching only LNAs and complex-coefficient filters is added to the downconverter 40. The downconverter 47 is provided with a switch 560 for distributing a signal between LNAs 511 and 511a and an input terminal TRF connected to an antenna. Moreover, the downconverter 47 is provided with a switch 561 for combining outputs of complex-coefficient filters 513 and 513a between the complex-coefficient filters 513 and 513a and a half-complex mixer 517. When a structure for switching only LNAs and complex-coefficient filters is provided, the switch 560 (required between an input terminal TRF and the LNAs 511 and 511a) and also the switch 561 (required between the complex-coefficient filters 513 and 513a and the half-complex mixer 517) may increase loss and sensitivity may be degraded. Due to the influence of on-resistance variation or wiring of the switch 561 between the complex-coefficient filters 513 and 513a and the half-complex mixer 517, amplitude and phase errors may occur and some characteristics of suppressing a negative frequency of a signal input to the half-complex mixer 517 may be degraded.

Figure 60:
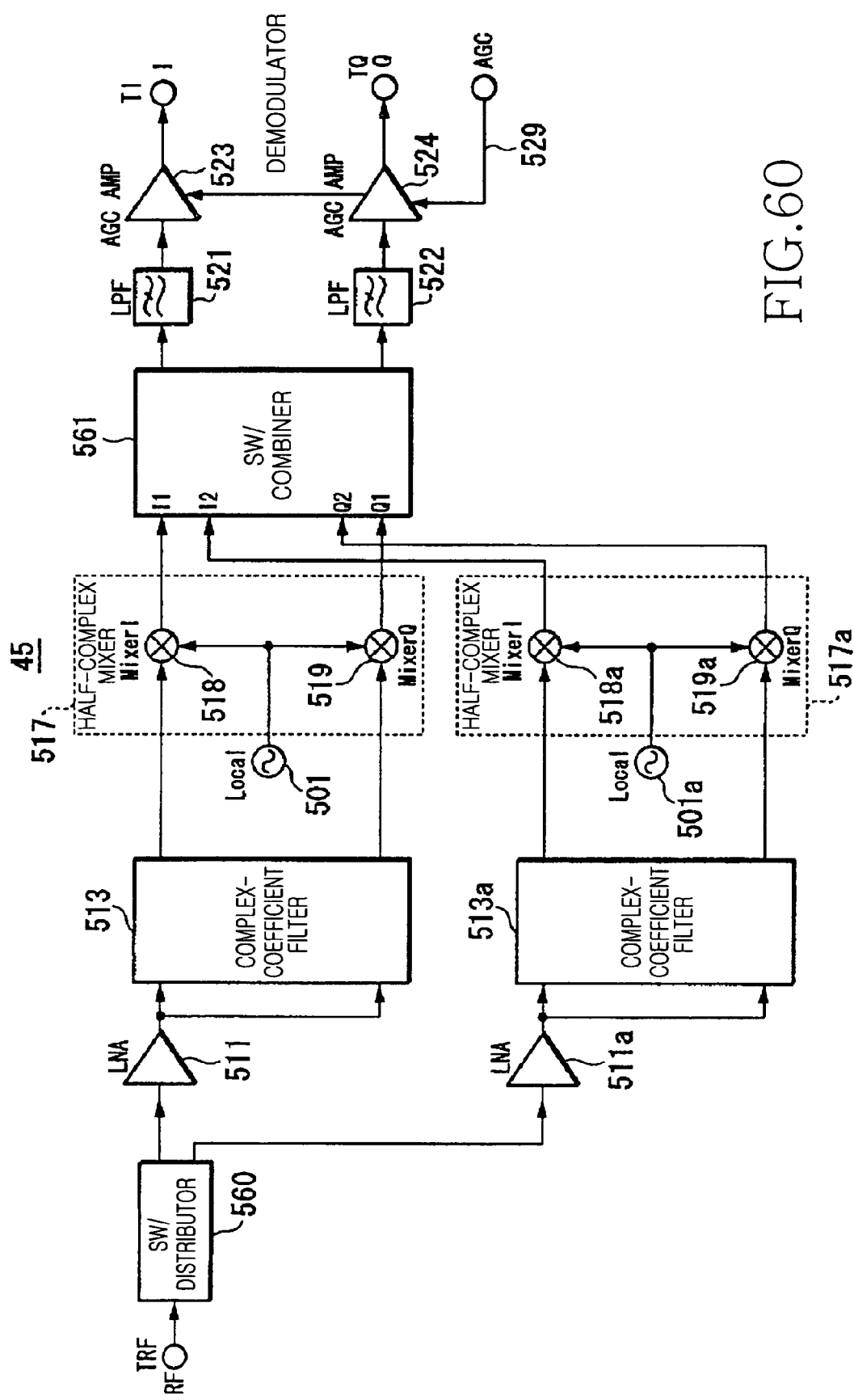
FIG. 60 illustrates an embodiment of the downconverter with a switching structure in accordance with the present invention.

A downconverter 45 illustrated in FIG. 60 is adopted as an embodiment of a broadband and multi-band downconverter capable of solving a problem occurring in the downconverter 46 or 47. The downconverter 45 illustrated in FIG. 60 uses a structure in which a component for switching LNAs, complex-coefficient filters, and half-complex mixers is added to the downconverter 40 of FIG. 35. The downconverter 45 is provided with a switch 560 for distributing a signal between LNAs 511 and 511a and an input terminal TRF connected to an antenna. Moreover, the downconverter 45 is provided with a switch 561 for combining outputs of half-complex mixers 517 and 517a between the half-complex mixers 517 and 517a and LPFs 521 and 522. Local oscillators 501 and 501a connected to the half-complex mixers 517 and 517a output real local signals of frequencies associated with pass frequency bands of the complex-coefficient filters 513 and 513a.

Next, the operation of the downconverter 45 will be described. When a real RF signal is input from the input terminal TRF, the switch 560 distributes the real RF signal to the LNAs 511 and 511a. When a selected side is a low frequency band, the complex-coefficient filter 513 converts the real RF signal to a complex RF signal while rejecting a negative frequency. The half-complex mixer 517 performs a frequency conversion process on the basis of a real local signal input from the local oscillator 501, generates a complex baseband signal, and outputs the generated complex baseband signal to the switch 561. A process after the switch 561 outputs the complex baseband signal to the LPFs 521 and 522 is the same as that of the downconverter 40. Output terminals TI and TQ output a process result.

Alternatively, one local oscillator may be connected to the half-complex mixers 517 and 517a, and a distributor or switch for switching and inputting a local signal may be provided between the local oscillator and the half-complex mixers 517 and 517a. Alternatively, the switch 560 and the switch 561 may be replaced with a distributor and a combiner that do not perform a switching operation, respectively. In the above-described embodiment, power may not be supplied to the half-complex mixer of an unused side. It is preferred that power is supplied to both sides when a high-speed switching operation is required.

This embodiment has been described with reference to the downconverter of the zero-IF scheme. This embodiment is not limited to the downconverter of the zero-IF scheme, but can be applied to the downconverter of the low-IF scheme or quasi-zero-IF scheme.

In the multi-band structure, the downconverter 45 needs to switch the LNAs 511 and 511a. The broadband structure commonly uses an LNA, connects an input terminal TRF to the LNA, and connects a switch 560 to the LNA. In the low-IF scheme, a complex-coefficient filter can be applied in an IF stage. When the switch 561 is connected after the complex-coefficient filter of the IF stage, image frequency interference can be rejected in the IF stage.

According to the above-described structure, loss between the complex-coefficient filter and the half-complex mixer corresponding to a problem occurring in the downconverter 47 illustrated in FIG. 63 is reduced. Because amplitude and phase errors due to the influence of on-resistance variation or wiring of a switch do not occur, the degradation of characteristics of suppressing a negative frequency of a signal input to the half-complex mixer can be prevented and the degradation of the overall performance of the downconverter can be almost removed. The above-described structure can reduce the cost and size as compared with the downconverter 46.

X. Broadband and Multi-Band Means in Upconverter

Next, broadband and multi-band means of an upconverter as in the downconverter will be described. First, means can be provided for switching total transmission at the front-end, for switching only complex-coefficient filters, and for switching half-complex mixers and complex-coefficient filters as a switching part in the upconverter. The three switching means may be applied to the upconverter 61 of the quasi-zero-IF scheme. A broadband and multi-band upconverter of the present invention will be described. The components with the same functions in the upconverter 61 and the broadband and multi-band upconverter are denoted by the same reference numerals. A structure for processing a high frequency band is provided in relation to a structure for processing a low band. A component for processing a high band is designated with an "a" suffix attached to reference numeral of a component for processing a low frequency band. For example, when a half-complex mixer and a complex-coefficient filter serving as components for processing the low frequency band are denoted by reference numerals 706 and 714, a half-complex mixer and a complex-coefficient filter serving as components for processing the high frequency band are denoted by reference numerals 706a and 714a.

Figure 64:
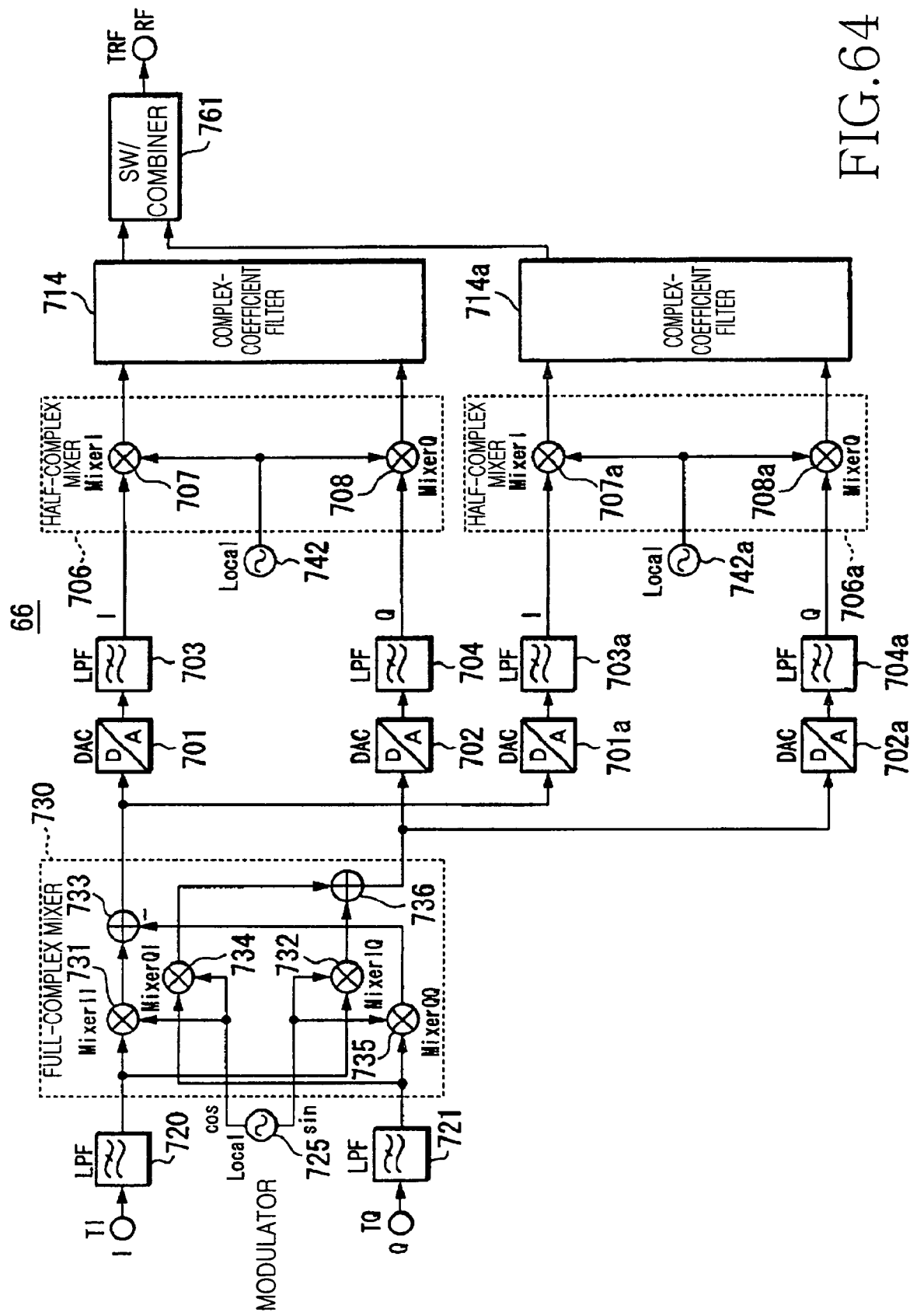
FIG. 64 illustrates Example 1 of the switching structure of the upconverter.

FIG. 64 illustrates an upconverter 66 with a structure in which the means for switching the total transmission front-end is added to the upconverter 61 of FIG. 52. In the upconverter 66, an output of a full-complex mixer 730 is branched to a circuit for processing a low frequency band and a circuit for processing a high frequency band. The upconverter 66 is provided with a switch 761 for combining outputs of complex-coefficient filters 714 and 714a between the complex-coefficient filters 714 and 714a and an output terminal TRF. When a structure for switching the total transmission front-end is provided as illustrated in FIG. 64, the components including DACs and complex-coefficient filters are increased twice, such that the cost and size are increased.

Figure 65:
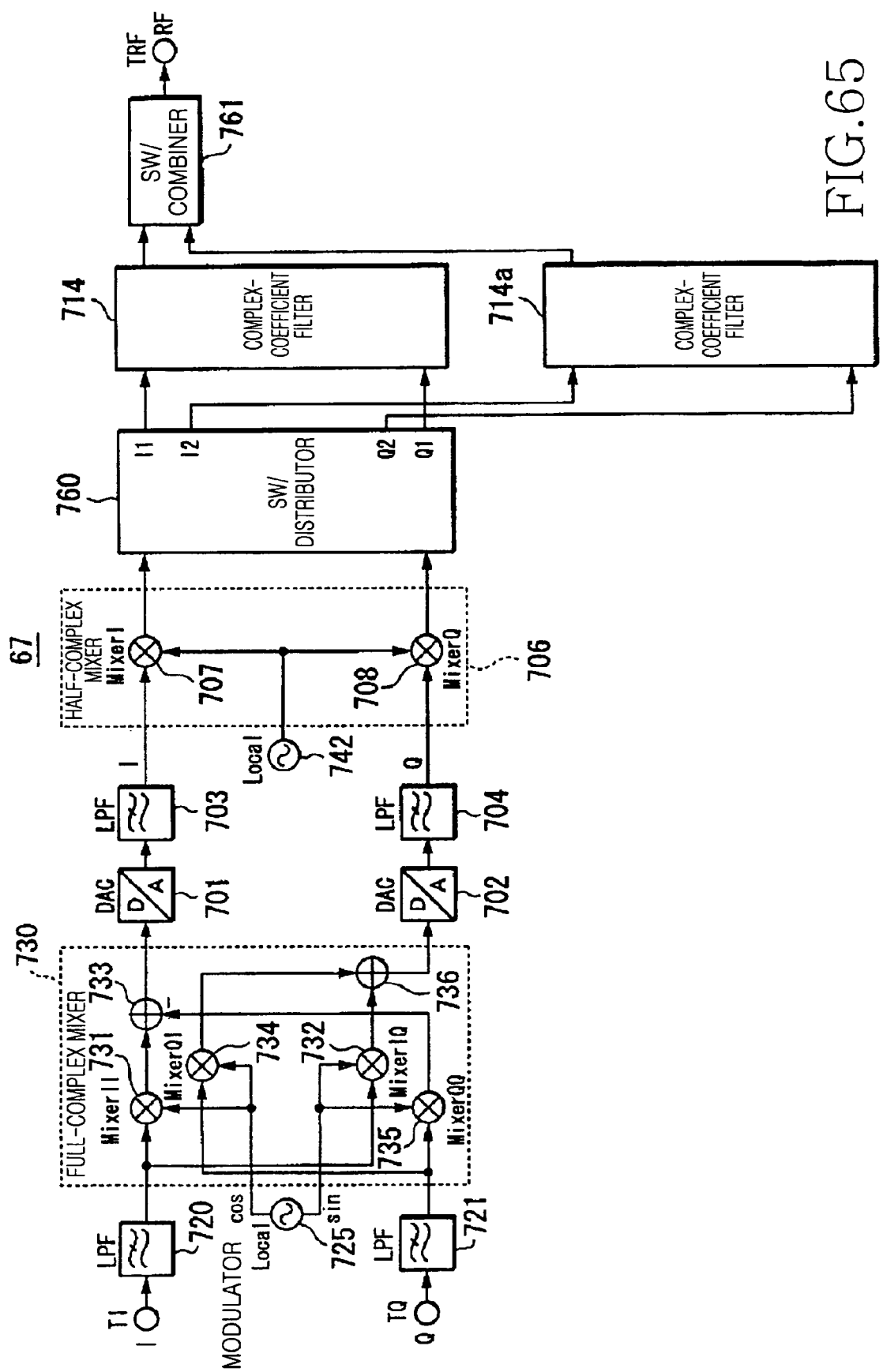
FIG. 65 illustrates Example 2 of the switching structure of the upconverter.

FIG. 65 illustrates an upconverter 67 with a structure in which the means for switching only complex-coefficient filters is added to the upconverter 61 of FIG. 52. The upconverter 67 is provided with a switch 760 for distributing a signal between a half-complex mixer 706 and the complex-coefficient filters 714 and 714a. The upconverter 67 is also provided with a switch 761 for combining outputs of the complex-coefficient filters 714 and 714a between the complex-coefficient filters 714 and 714a and an output terminal TRF. When a structure for switching only the complex-coefficient filters is provided, the switch 760 is required between the complex-coefficient filters 714 and 714a and the output terminal TRF and also the switch 761 is required between the half-complex mixer 706 and the complex-coefficient filters 714 and 714a, such that loss may be increased and sensitivity may be degraded. Due to the influence of on-resistance variation or wiring of the switch 760 between the half-complex mixer 706 and the complex-coefficient filters 714 and 714a, amplitude and phase errors may occur and some characteristics of suppressing a negative frequency in the complex-coefficient filter 714 may be degraded.

Figure 61:
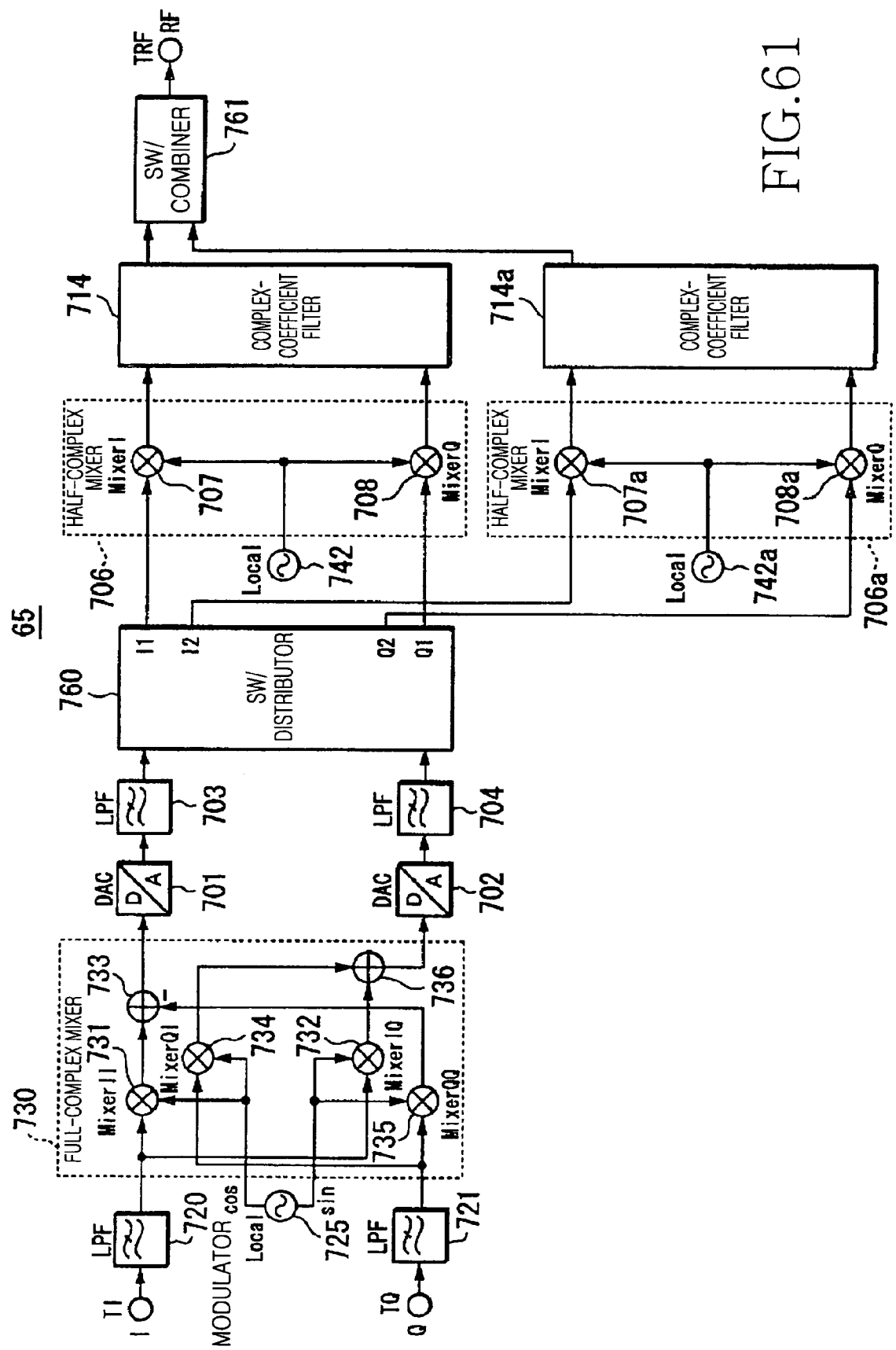
FIG. 61 illustrates an embodiment of the upconverter with a switching structure in accordance with the present invention.

An upconverter 65 illustrated in FIG. 61 is adopted as an embodiment of a broadband and multi-band upconverter capable of solving a problem occurring in the upconverter 66 or 67. The upconverter 65 illustrated in FIG. 61 uses a structure in which a component for switching half-complex mixers and complex-coefficient filters is added to the upconverter 61 of FIG. 52. A switch 760 for distributing a signal between LPFs 703 and 704 and half-complex mixers 706 and 706*a* is added to the structure of upconverter 61. Moreover, also added to the upconverter 61 is a switch 761 for combining outputs of complex-coefficient filters 714 and 714*a* between the complex-coefficient filters 714 and 714*a* and an output terminal TRF. Local oscillators 742 and 742*a* connected to the half-complex mixers 706 and 706*a* output real local signals of frequencies associated with pass frequency bands of the complex-coefficient filters 714 and 714*a*.

Next, the operation of the upconverter 65 will be described. After a high-frequency component is removed in LPFs 720 and 721, real and imaginary components of digital signals input from input terminals TI and TQ are output to a full-complex mixer 730.

The full-complex mixer 730 performs a frequency conversion process in which an offset frequency is set to a center frequency for an input complex signal according to a real axis local cos signal and an imaginary axis local sin signal of a complex local signal output from a local oscillator 725, and then outputs a complex IF signal to the DACs 701 and 702.

The complex IF signal output from the full-complex mixer 730 is converted to an analog signal in the DACs 701 and 702. The complex IF signal based on the analog signal is generated and output to the LPFs 703 and 704. After a high-frequency component is removed in the LPFs 703 and 704, the complex IF signal is output to the switch 760. When a low frequency side is selected, the half-complex mixer 706 frequency-converts the complex IF signal output from the switch 760 on the basis of a real local signal input from a local oscillator 742, generates a complex RF signal, and outputs the generated complex RF signal to the complex-coefficient filter 714. The complex-coefficient filter 714 converts the complex RF signal to a real RF signal while rejecting a negative frequency component. The switch 761 outputs the real RF signal to an output terminal TRF.

Alternatively, one local oscillator may be connected to the half-complex mixers 706 and 706*a*, and a distributor or switch for switching and inputting a local signal may be provided between the local oscillator and the half-complex mixers 706 and 706*a*. Alternatively, the switch 760 and the switch 761 may be replaced with a distributor and a combiner that do not perform a switching operation, respectively.

In the above-described embodiment, power may not be supplied to the half-complex mixer of an unused side. It is preferred that power is supplied to both sides when a high-speed switching operation is required.

This embodiment has been described with reference to the upconverter of the quasi-zero-IF scheme. This embodiment is not limited to the upconverter of the quasi-zero-IF scheme, but can be applied to the upconverter of the low-IF scheme or zero-IF scheme.

In the low-IF scheme, a complex-coefficient filter can be applied in an IF stage. When the complex-coefficient filter is inserted before the switch 760, a circuit size does not increase, but the degradation of image rejection characteristics can occur in the switch 760. Accordingly, it is preferred that the complex-coefficient filter of the IF stage is connected after the switch 760.

If flat group delay characteristics are required for the complex-coefficient transversal filter, an impulse response used for the complex-coefficient transversal filter must be exactly an even or odd symmetric impulse response. However, if flat group delay characteristics are not required, an approximate even or odd symmetric impulse response can also be accepted because it is allowable that symmetry may be slightly lost when the impulse response is generated on the basis of an even or odd function.

According to the above-described structure, loss between the complex-coefficient filter and the half-complex mixer corresponding to a problem occurring in the upconverter 66 is reduced. Because amplitude and phase errors due to the influence of on-resistance variation or wiring of a switch do not occur, the degradation of characteristics of suppressing a negative frequency in a complex-coefficient filter can be prevented and the degradation of the overall performance of the upconverter can be almost removed. The above-described structure can reduce the cost and size as compared with the upconverter 67.

A downconverter of the present invention is configured by a complex-coefficient transversal filter for generating a real part of a complex RF signal by performing a convolution integral according to a generated impulse response based on an even function for an input RF signal, generating an imaginary part of the complex RF signal by performing a convolution integral according to a generated impulse response based on an odd function for the input RF signal, rejecting one side of a positive or negative frequency, and outputting the complex RF signal, a local oscillator for outputting a real local signal with a predetermined frequency, and a complex mixer, connected to the complex-coefficient transversal filter and the local oscillator, for performing a frequency conversion process by multiplying the complex RF signal output from the complex-coefficient transversal filter and the real local signal output from the local oscillator, and outputting a complex signal of a frequency separated by the predetermined frequency from a frequency of the RF signal. Moreover, the downconverter applies a SAW filter to an associated complex-coefficient transversal filter.

For example, as compared with a downconverter using a complex local signal shown in "A Fully Integrated 900 MHz CMOS Double Quadrature Downconverter", Jan Crols, Michiel Steyaert, IEEE International Solid State Circuits Conference, ISSCC95 SESSION8 WIRELESS COMMUNICATION PAPER TA 8.1, pp 136-137, 1995, the downconverter using the real local signal can halve a local signal, thereby reducing power consumption. Filter characteristics can be designed on the basis of a comb shaped electrode structure. When the present fine processing technology is used, electrode dimensions of the SAW filter can be precisely created, such that a high-performance filter in which the variation due to manufacturing variation of a mixer or filter is small can be obtained, as compared with the case where a real local signal is a polyphase filter as shown in "A 1.9 GHz Si Direct Conversion Receiver IC for QPSK Modulation Systems", Chikau Takahashi, Ryuichi Fujimoto, Satoshi Arai, Tetsuro Itakura, Takashi Ueno, Hiroshi Tsurumi, Hiroshi Tanimoto, Shuji Watanabe, Kenji Hirakawa, IEEE International Solid State Circuits Conference, ISSCC95 SESSION8 WIRELESS COMMUNICATION PAPER TA 8.2, pp 138-139, 1995. Therefore, the present invention can obtain a sufficient image rejection ratio in the low-IF scheme and can suppress the EVM-related degradation occurring due to imbalance between I and Q in the zero-IF scheme.

The downconverter of the low-IF scheme of the present invention is provided with the complex-coefficient transversal filter coupled to an output of the complex mixer, and uses the SAW filter as the complex-coefficient transversal filter. Because the SAW filter is a passive filter, there is an advantage in that power is not consumed. The SAW filter is capable of rejecting a positive or negative frequency and rejecting a component out of a band of a target signal in a frequency side in which the target signal is present.

Moreover, the downconverter of the low-IF scheme of the present invention includes means for receiving the complex signal output from the complex mixer, inverting a sign of an imaginary axis signal of the complex signal, and generating a complex conjugate signal corresponding to a complex conjugate of the complex signal, means for adjusting a level of the complex conjugate signal, and means for combining the complex signal output from the complex mixer and the complex conjugate signal whose level is adjusted. Therefore, a correction can be performed according to respective frequency characteristics of an image rejection ratio due to an error between signals of real and imaginary parts with frequency characteristics. A good image rejection ratio can be obtained throughout a target signal band.

Moreover, a downconverter of the present invention is configured by a distributor, provided with a plurality of output terminals, for switching and outputting an input RF signal; a plurality of complex-coefficient transversal filters having different pass band frequencies in a plurality of transversal filters connected to the plurality of output terminals of the distributor in a one-to-one correspondence, the plurality of complex-coefficient transversal filters outputting a real part of a complex RF signal by performing a convolution integral according to a generated impulse response based on an even function for the RF signal output from the distributor, outputting an imaginary part of the complex RF signal by performing a convolution integral according to a generated impulse response based on an odd function for the RF signal output from the distributor, rejecting one side of a positive or negative frequency in the pass band frequencies, and outputting the complex RF signal; a local oscillator for switching and outputting a real local signal of a frequency according to the pass band frequencies of the plurality of complex-coefficient transversal filters; a plurality of complex mixers connected to the plurality of complex-coefficient transversal filters in the one-to-one correspondence and connected to the local oscillator, the plurality of complex mixers performing a frequency conversion process by multiplying the complex signal output from the complex-coefficient transversal filter and the real local signal output from the local oscillator, and outputting a complex signal of a frequency separated by a predetermined frequency from a frequency of the RF signal; and a combiner, connected to the plurality of complex mixers, for switching a connection of the plurality of complex mixers and outputting the complex signal outputted from the plurality of complex mixers. Because the complex-coefficient transversal filters are connected to the complex mixers in the one-to-one correspondence, imbalance degradation due to a switch and other related factors is prevented.

An upconverter of the present invention is configured by a local oscillator for outputting a real local signal with a predetermined frequency; a complex mixer, connected to the local oscillator, for performing a frequency conversion process by multiplying an input complex signal and the real local signal output from the local oscillator, and outputting a complex RF signal; and a complex-coefficient transversal filter, connected to the complex mixer, for performing a convolution integral according to a generated impulse response based on an even function for a real part of the complex RF signal output from the complex mixer, performing a convolution integral according to a generated impulse response based on an odd function for an imaginary part of the complex RF signal output from the complex mixer, rejecting one side of a positive or negative frequency, and outputting a real RF signal. Moreover, the upconverter applies a SAW filter to an associated complex-coefficient transversal filter. As compared with a conventional upconverter using a complex local signal, the upconverter using the real local signal can halve a local signal, thereby reducing power consumption. Filter characteristics can be designed on the basis of a comb shaped electrode structure. When the present fine processing technology is used, electrode dimensions of the SAW filter can be created at high precision, such that a high-performance filter, in which the variation due to manufacturing variation of a mixer or filter is small, can be obtained. When the complex-coefficient transversal filter is used, a phase difference between real and imaginary parts can be correctly set to 90 degrees and a function of a bandpass filter can be provided. Therefore, the upconverter can be miniaturized.

The upconverter of the low-IF scheme of the present invention is provided with the complex-coefficient transversal filter coupled to an output of the complex mixer, and uses the SAW filter as the complex-coefficient transversal filter. Filter characteristics can be designed on the basis of a comb shaped electrode structure. Because the SAW filter is a passive filter, there is an advantage in that power is not consumed. When two comb shaped electrodes are provided in a parallel fashion, a function of a distributor can be performed, such that the upconverter can be miniaturized. Because the variation due to manufacturing variation and related factors is small, a stable image rejection ratio can be obtained.

Moreover, an upconverter of the present invention is configured by a distributor, provided with a plurality of output terminals, for switching and outputting an input complex signal; a plurality of complex-coefficient transversal filters, connected to the plurality of output terminals of the distributor in a one-to-one correspondence, having different pass band frequencies, the plurality of complex-coefficient transversal filters performing a convolution integral according to a generated impulse response based on an even function for a real part of an input complex RF signal, performing a convolution integral according to a generated impulse response based on an odd function for an imaginary part of the complex RF signal, rejecting one side of a positive or negative frequency in the pass band frequencies, and outputting a real RF signal; a local oscillator for switching and outputting a real local signal of a frequency according to the pass band frequencies of the plurality of complex-coefficient transversal filters; a plurality of complex mixers connected to the plurality of output terminals of the distributor and inputs of the plurality of complex-coefficient transversal filters in the one-to-one correspondence and connected to the local oscillator, the plurality of complex mixers performing a frequency conversion process by multiplying the complex signal output from the distributor and the real local signal output from the local oscillator, and outputting a complex RF signal to an associated complex-coefficient transversal filter; and a combiner, connected to the plurality of complex mixers, for switching and outputting the real RF signal output from the plurality of complex-coefficient transversal filters. Because the complex-coefficient transversal filters are connected to the complex mixers in the one-to-one correspondence, imbalance degradation due to a switch and so on is prevented.

Although preferred embodiments of the present invention have been disclosed for illustrative purposes, those skilled in the art will appreciate that various modifications, additions, and substitutions are possible, without departing from the scope of the present invention. Therefore, the present invention is not limited to the above-described embodiments, but is defined by the following claims, along with their full scope of equivalents.

What is claimed is:

1. A downconverter for downconverting a Radio Frequency (RF) signal, comprising:
   a complex-coefficient transversal filter for generating a real part of a complex RF signal by performing a convolution integral according to a generated impulse response based on an even function for an input RF signal, generating an imaginary part of the complex RF signal by performing a convolution integral according to a generated impulse response based on an odd function for the input RF signal, rejecting one side of a positive or negative frequency, and outputting the complex RF signal;
   a local oscillator for outputting a real local signal at a set frequency; and
   a complex mixer, connected to the complex-coefficient transversal filter and the local oscillator, for performing a frequency conversion process by multiplying the complex RF signal output from the complex-coefficient transversal filter and the real local signal output from the local oscillator, and outputting a complex signal of a frequency separated by the set frequency from a frequency of the RF signal.

2. The downconverter of claim 1, wherein the complex-coefficient transversal filter is configured by a Surface Acoustic Wave (SAW) filter.

3. The downconverter of claim 1, wherein the set frequency has a frequency value out of a channel signal band of the RF signal.

4. The downconverter of claim 3, further comprising:
   a second complex-coefficient transversal filter, connected to the complex mixer, for rejecting a positive or negative frequency of the complex signal output from the complex mixer and outputting a rejection result.

5. The downconverter of claim 4, wherein the second complex-coefficient transversal filter is configured by a SAW filter.

6. The downconverter of claim 5, further comprising:
   means for receiving the complex signal output from the complex mixer, inverting a sign of an imaginary axis signal of the complex signal, and generating a complex conjugate signal corresponding to a complex conjugate of the complex signal;
   means for adjusting a level of the complex conjugate signal; and
   means for combining the complex signal output from the complex mixer and the complex conjugate signal whose level is adjusted.

7. The downconverter of claim 4, wherein the frequency separated by the set frequency from the RF signal is set to a frequency of more than a half value of a difference between a frequency of a pass band end of the complex-coefficient transversal filter and the RF signal frequency.

8. The downconverter of claim 5, wherein the frequency separated by the predetermined frequency from the RF signal is set to a frequency of more than a half value of a difference between a frequency of a pass band end of the complex-coefficient transversal filter and the RF signal frequency.

9. The downconverter of claim 6, wherein the frequency separated by the set frequency from the RF signal is set to a frequency of more than a half value of a difference between a frequency of a pass band end of the complex-coefficient transversal filter and the RF signal frequency.

10. A downconverter for downconverting a Radio Frequency (RF) signal, comprising:
   a distributor, provided with a plurality of output terminals, for switching and outputting an input RF signal;
   a plurality of complex-coefficient transversal filters having different band pass frequencies in a plurality of transversal filters connected to the plurality of output terminals of the distributor in a one-to-one correspondence, the plurality of complex-coefficient transversal filters outputting a real part of a complex RF signal by performing a convolution integral according to a generated impulse response based on an even function for the RF signal output from the distributor, outputting an imaginary part of the complex RF signal by performing a convolution integral according to a generated impulse response based on an odd function for the RF signal output from the distributor, rejecting one side of a positive or negative frequency in the band pass frequencies, and outputting the complex RF signal;
   a local oscillator for switching and outputting a real local signal of a frequency according to the band pass frequencies of the plurality of complex-coefficient transversal filters;
   a plurality of complex mixers connected to the plurality of complex-coefficient transversal filters in the one-to-one correspondence and connected to the local oscillator, the plurality of complex mixers performing a frequency conversion process by multiplying the complex signal output from the complex-coefficient transversal filter and the real local signal output from the local oscillator, and outputting a complex signal of a frequency separated by a set frequency from a frequency of the RF signal; and
   a combiner, connected to the plurality of complex mixers, for switching a connection of the plurality of complex mixers and outputting the complex signal outputted from the plurality of complex mixers.

* * * * *